United States Patent
Nakamura

(10) Patent No.: US 10,665,677 B2
(45) Date of Patent: May 26, 2020

(54) SEMICONDUCTOR DEVICE

(71) Applicant: Mitsubishi Electric Corporation, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/216,815

(22) Filed: Dec. 11, 2018

(65) Prior Publication Data

US 2019/0123145 A1    Apr. 25, 2019

Related U.S. Application Data

(63) Continuation of application No. 15/533,615, filed as application No. PCT/JP2015/052193 on Jan. 27, 2015, now Pat. No. 10,290,711.

(51) Int. Cl.
  *H01L 29/10*    (2006.01)
  *H01L 21/265*   (2006.01)
  (Continued)

(52) U.S. Cl.
  CPC ...... *H01L 29/1095* (2013.01); *H01L 21/2253* (2013.01); *H01L 21/266* (2013.01); *H01L 21/26506* (2013.01); *H01L 21/26513* (2013.01); *H01L 21/324* (2013.01); *H01L 21/3221* (2013.01); *H01L 27/0664* (2013.01); *H01L 29/0615* (2013.01); *H01L 29/0619* (2013.01); *H01L 29/36* (2013.01); *H01L 29/66121* (2013.01); *H01L 29/739* (2013.01); *H01L 29/7397* (2013.01); *H01L 29/868* (2013.01);
  (Continued)

(58) Field of Classification Search
  CPC .......................... H01L 21/266; H01L 29/407
  See application file for complete search history.

(56) References Cited

U.S. PATENT DOCUMENTS 7,491,982 B2    2/2009   Takahashi
7,800,204 B2    9/2010   Fujii
(Continued)

FOREIGN PATENT DOCUMENTS

CN    101640222 A    2/2010
CN    103650147 A    3/2014
(Continued)

OTHER PUBLICATIONS

International Search Report issued in PCT/JP2015/052193; dated Mar. 3, 2015.
(Continued)

*Primary Examiner* — Caridad Everhart
*Assistant Examiner* — Ankush K Singal
(74) *Attorney, Agent, or Firm* — Studebaker & Brackett PC

(57) ABSTRACT

The present invention relates to a vertical semiconductor device such as an IGBT or a diode which includes an N buffer layer formed in the undersurface of and adjacent to an N⁻ drift layer. A concentration slope δ, which is derived from displacements in a depth TB (μm) and an impurity concentration CB (cm⁻³), from the upper surface to the lower surface in a main portion of the N buffer layer satisfies a concentration slope condition defined by {0.03≤δ≤0.7}.

7 Claims, 48 Drawing Sheets

(51) Int. Cl.

| | |
|---|---|
| *H01L 21/322* | (2006.01) |
| *H01L 29/36* | (2006.01) |
| *H01L 29/861* | (2006.01) |
| *H01L 29/06* | (2006.01) |
| *H01L 29/739* | (2006.01) |
| *H01L 29/868* | (2006.01) |
| *H01L 21/225* | (2006.01) |
| *H01L 21/266* | (2006.01) |
| *H01L 21/324* | (2006.01) |
| *H01L 27/06* | (2006.01) |
| *H01L 29/66* | (2006.01) |
| *H01L 29/40* | (2006.01) |
| *H01L 29/16* | (2006.01) |
| *H01L 29/20* | (2006.01) |

(52) U.S. Cl.
CPC ...... *H01L 29/8611* (2013.01); *H01L 29/1608* (2013.01); *H01L 29/2003* (2013.01); *H01L 29/402* (2013.01); *H01L 29/407* (2013.01); *H01L 29/66348* (2013.01)

(56) References Cited

U.S. PATENT DOCUMENTS

| | | | |
|---|---|---|---|
| 8,686,469 B2 | 4/2014 | Nakamura | |
| 9,773,923 B2 | 9/2017 | Onozawa et al. | |
| 2010/0025827 A1* | 2/2010 | Fujii | H01L 29/36 257/656 |
| 2010/0230716 A1* | 9/2010 | Naijo | H01L 29/0834 257/139 |
| 2011/0291223 A1 | 12/2011 | Nakamura | |
| 2012/0074451 A1 | 3/2012 | Lin | |
| 2012/0273836 A1 | 11/2012 | Sadamatsu et al. | |
| 2012/0313139 A1 | 12/2012 | Matsuura et al. | |
| 2014/0070268 A1 | 3/2014 | Yoshimura et al. | |
| 2014/0197451 A1* | 7/2014 | Chen | H01L 29/7393 257/139 |
| 2014/0334212 A1* | 11/2014 | Hashimoto | H01L 27/0727 363/131 |
| 2015/0235866 A1 | 8/2015 | Nakamura | |
| 2015/0318385 A1* | 11/2015 | Kameyama | H01L 29/7397 257/140 |
| 2015/0364585 A1 | 12/2015 | Song et al. | |
| 2015/0364613 A1 | 12/2015 | Onozawa et al. | |
| 2016/0056306 A1 | 2/2016 | Masuoka et al. | |
| 2016/0197170 A1 | 7/2016 | Yoshimura et al. | |
| 2016/0211356 A1 | 7/2016 | Yoshimura et al. | |
| 2017/0243937 A1 | 8/2017 | Ward et al. | |
| 2017/0358669 A1 | 12/2017 | Seok | |

FOREIGN PATENT DOCUMENTS

| | | |
|---|---|---|
| JP | 2001-332729 A | 11/2001 |
| JP | 2002-299623 A | 10/2002 |
| JP | 2004-103982 A | 4/2004 |
| JP | 2006-210667 A | 8/2006 |
| JP | 2009-158788 A | 7/2009 |
| JP | 2012-009811 A | 1/2012 |
| JP | 5236281 B2 | 4/2013 |
| JP | 2013-191706 A | 9/2013 |
| KR | 10-2013-0083867 A | 7/2013 |
| WO | 2012/157772 A1 | 11/2012 |
| WO | 2014/054121 A1 | 4/2014 |
| WO | 2014/156849 A1 | 10/2014 |
| WO | 2014/199465 A1 | 12/2014 |

OTHER PUBLICATIONS

Notification of Transmittal of Translation of the International Preliminary Report on Patentability and Translation of Written Opinion of the International Searching Authority; PCT/JP2015/052193; dated Aug. 10, 2017.

JP Office Action dated Nov. 21, 2017, from corresponding JP Appl No. 2016-571549, with English translation, 10 pp.

An Office Action; "Notification of Reason for Refusal," issued by the Korean Intellectual Property Office dated Jul. 30, 2018, which corresponds to Korean Patent Application No. 10-2017-7020906 and is related to U.S. Appl. No. 15/533,615; with English translation.

An Office Action mailed by the State Intellectual Property Office of the People's Republic of China dated Feb. 3, 2020, which corresponds to Chinese Patent Application No. CN201580074789.8.

\* cited by examiner

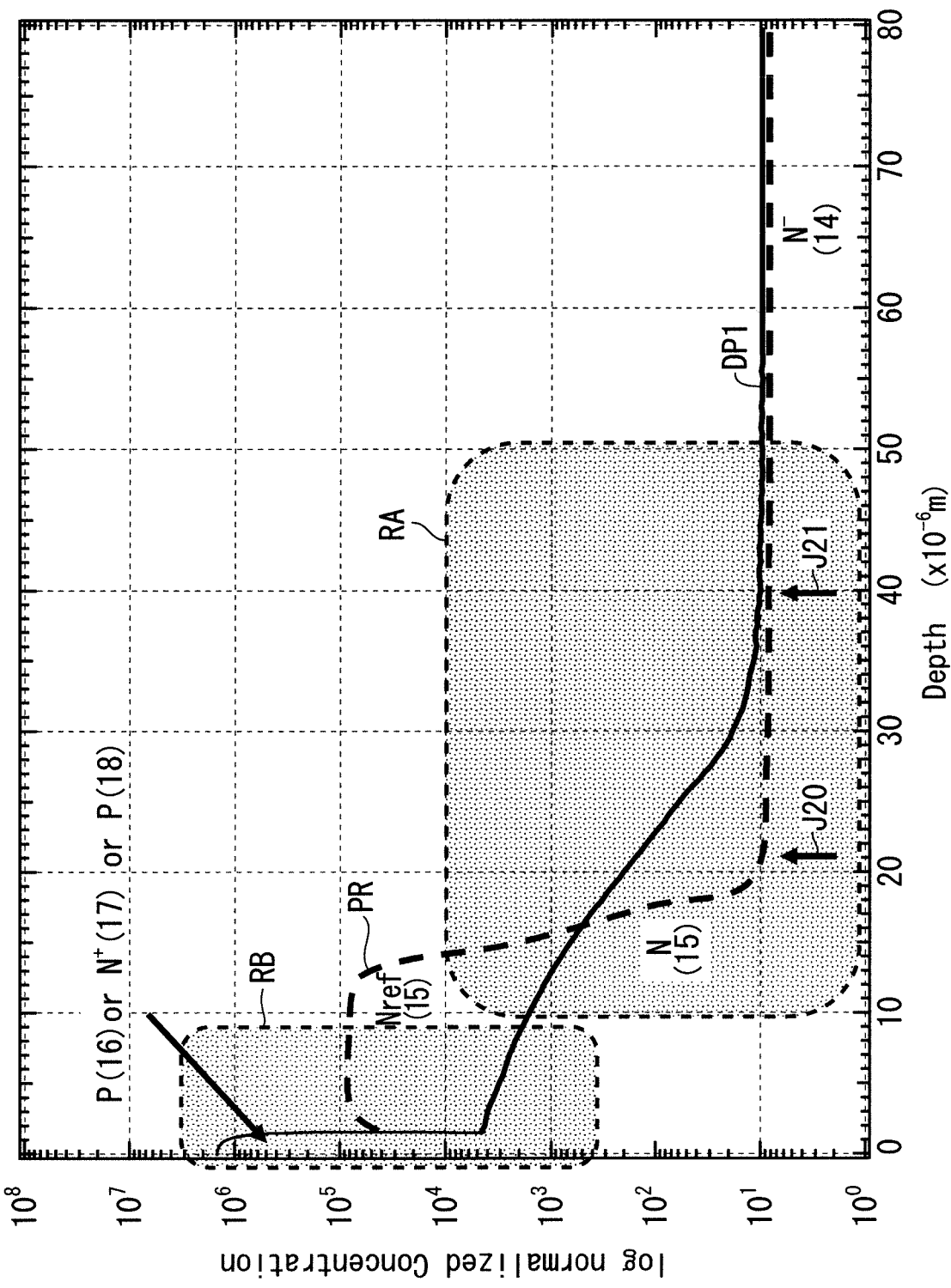
F I G. 4

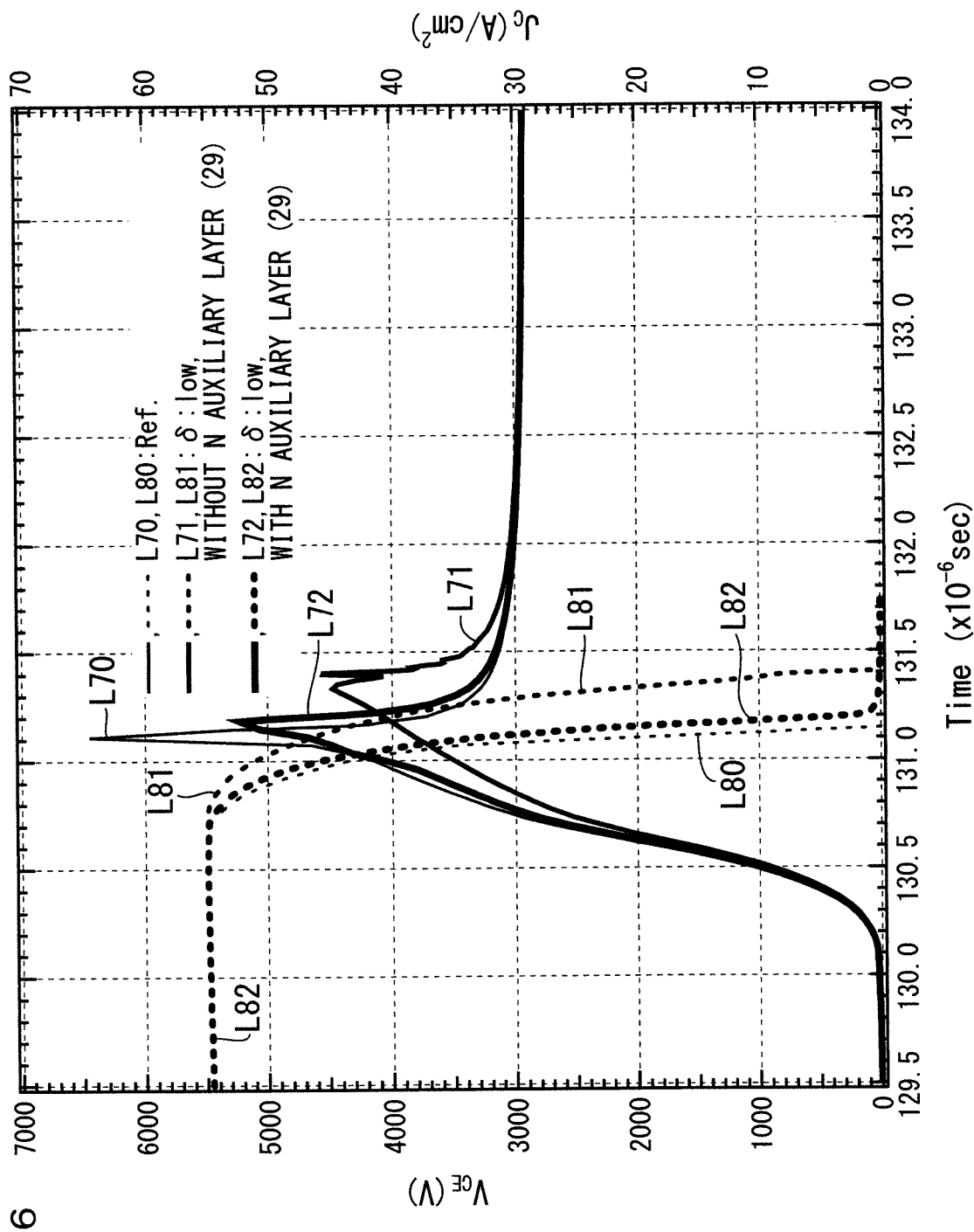
F I G. 16

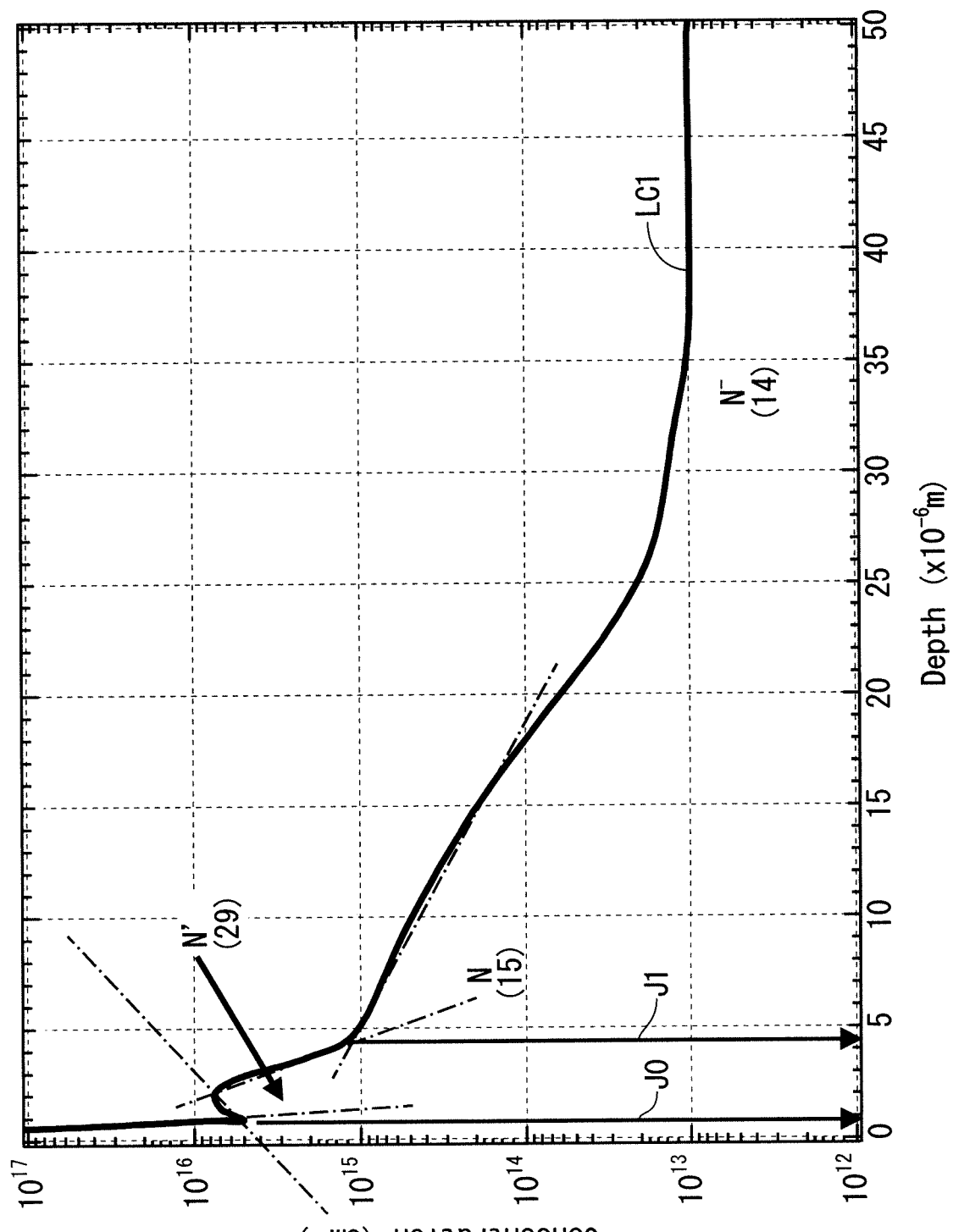
F I G. 2 5

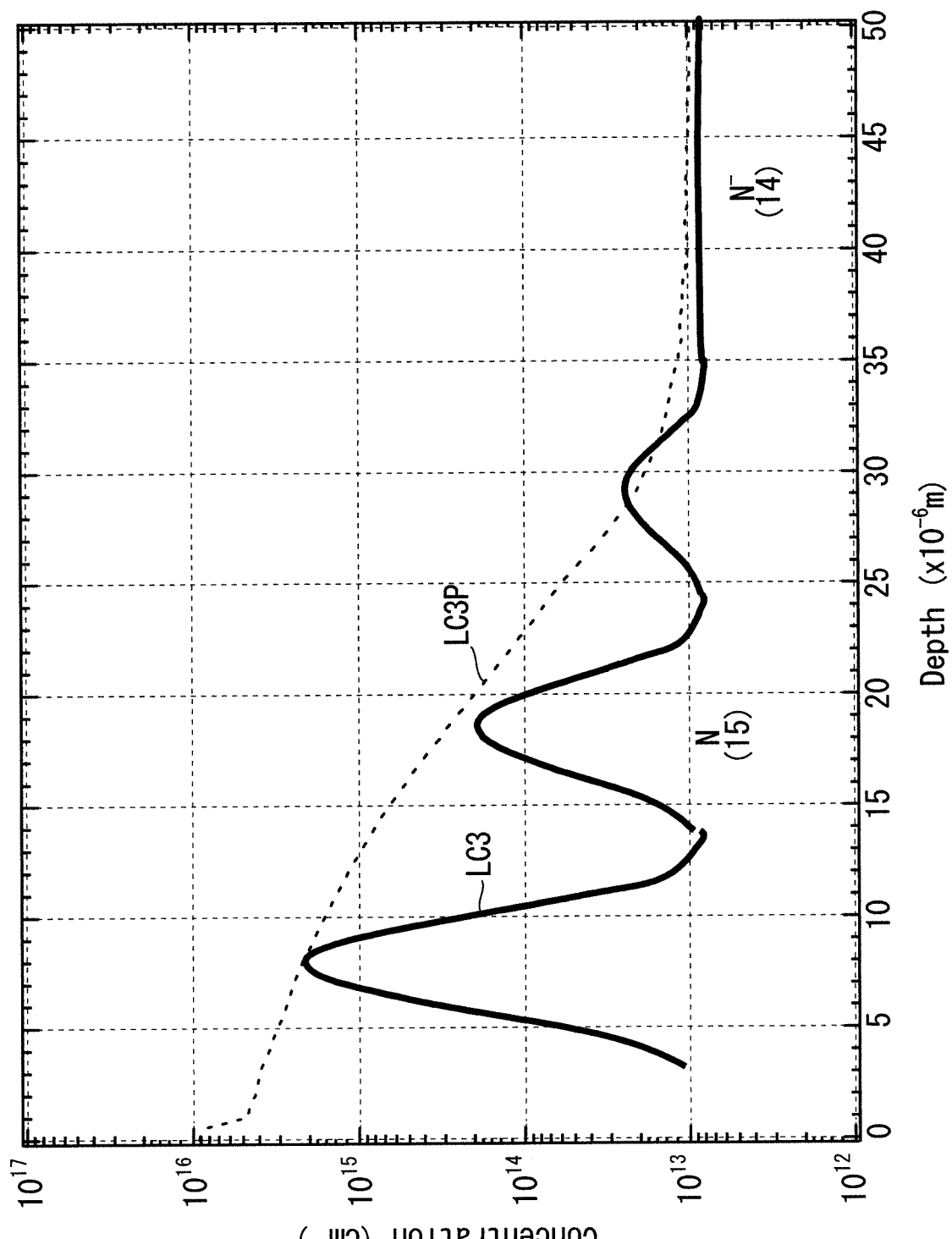
F I G. 27

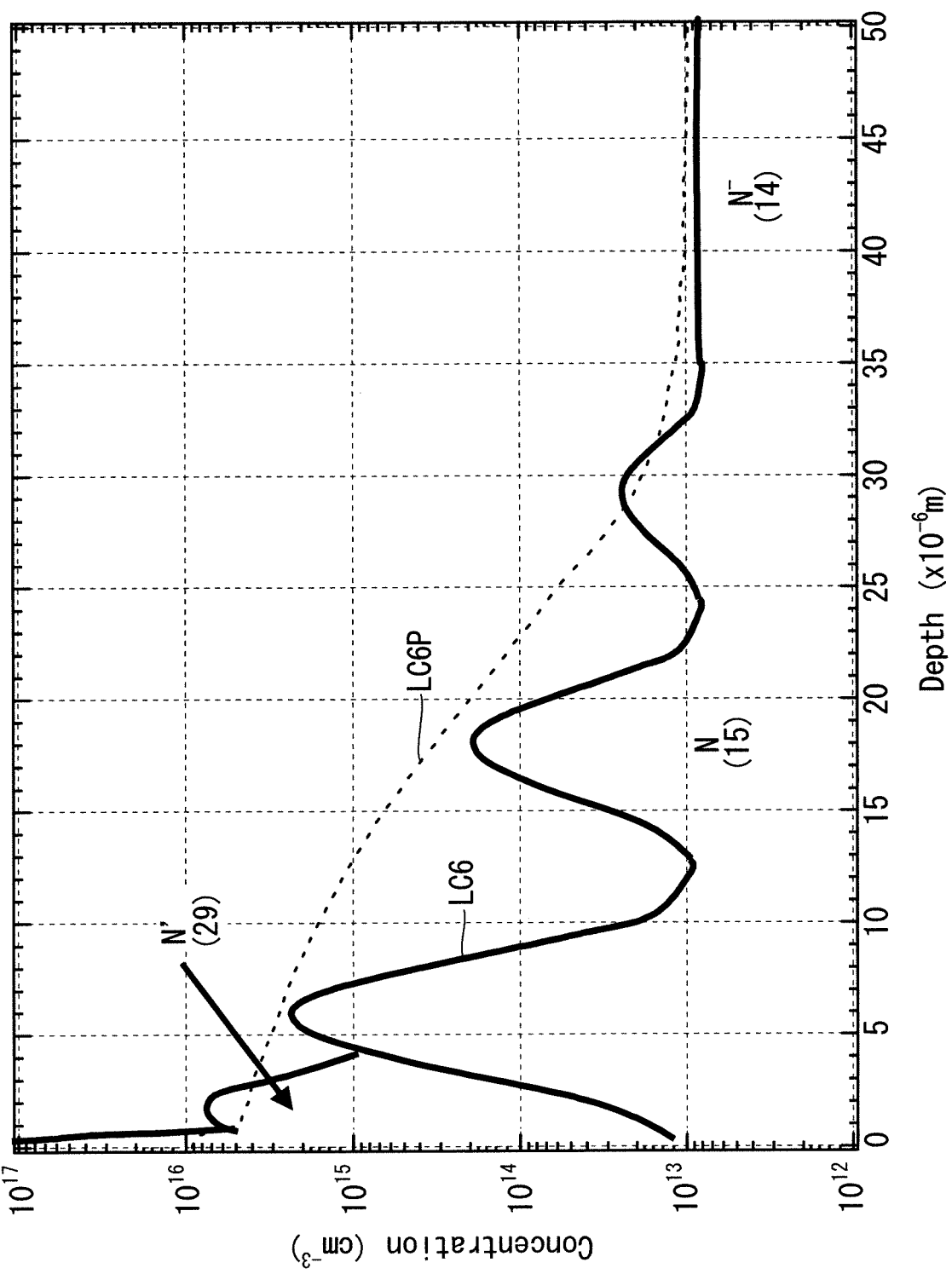
F I G. 30

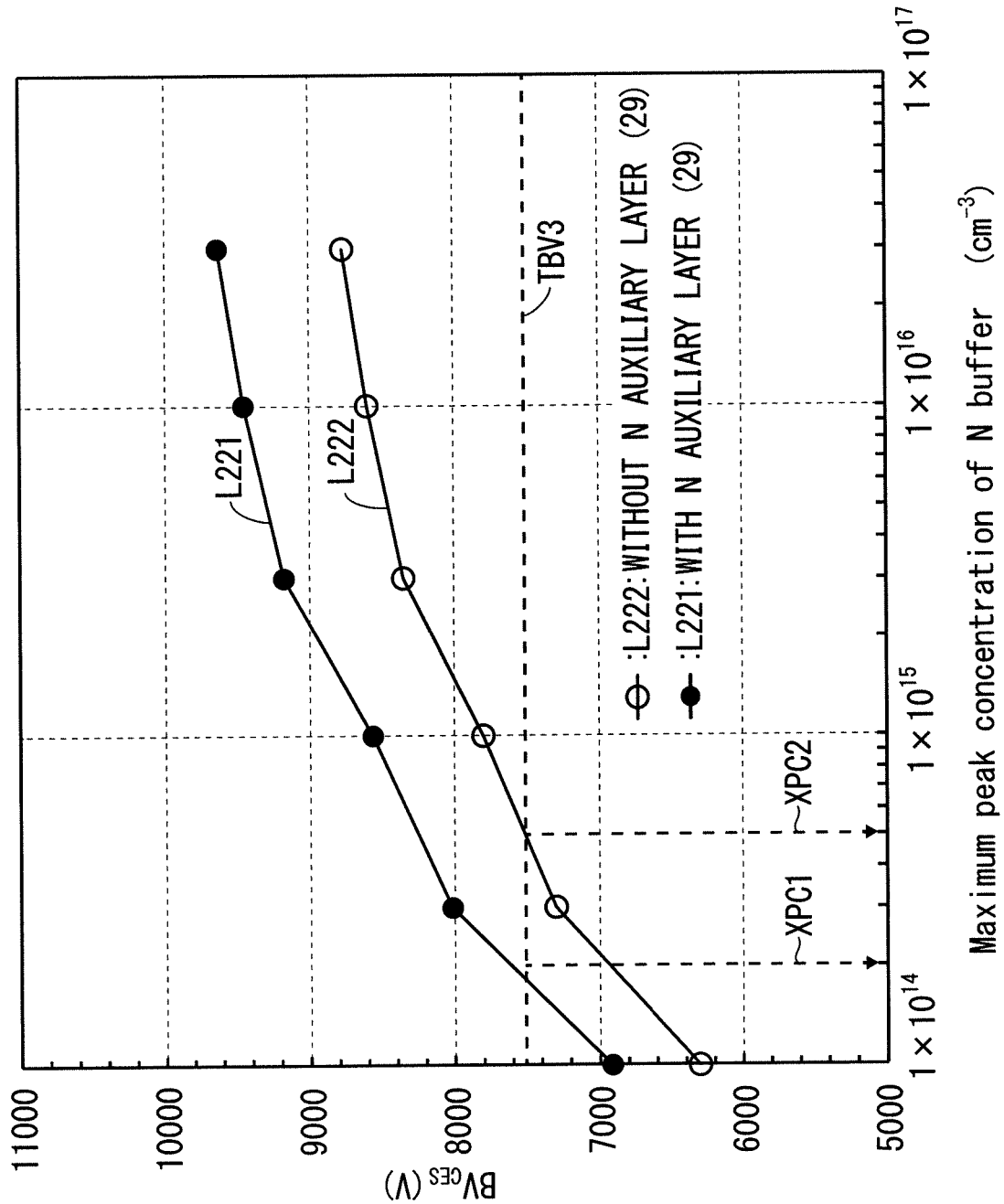
F I G. 3 3

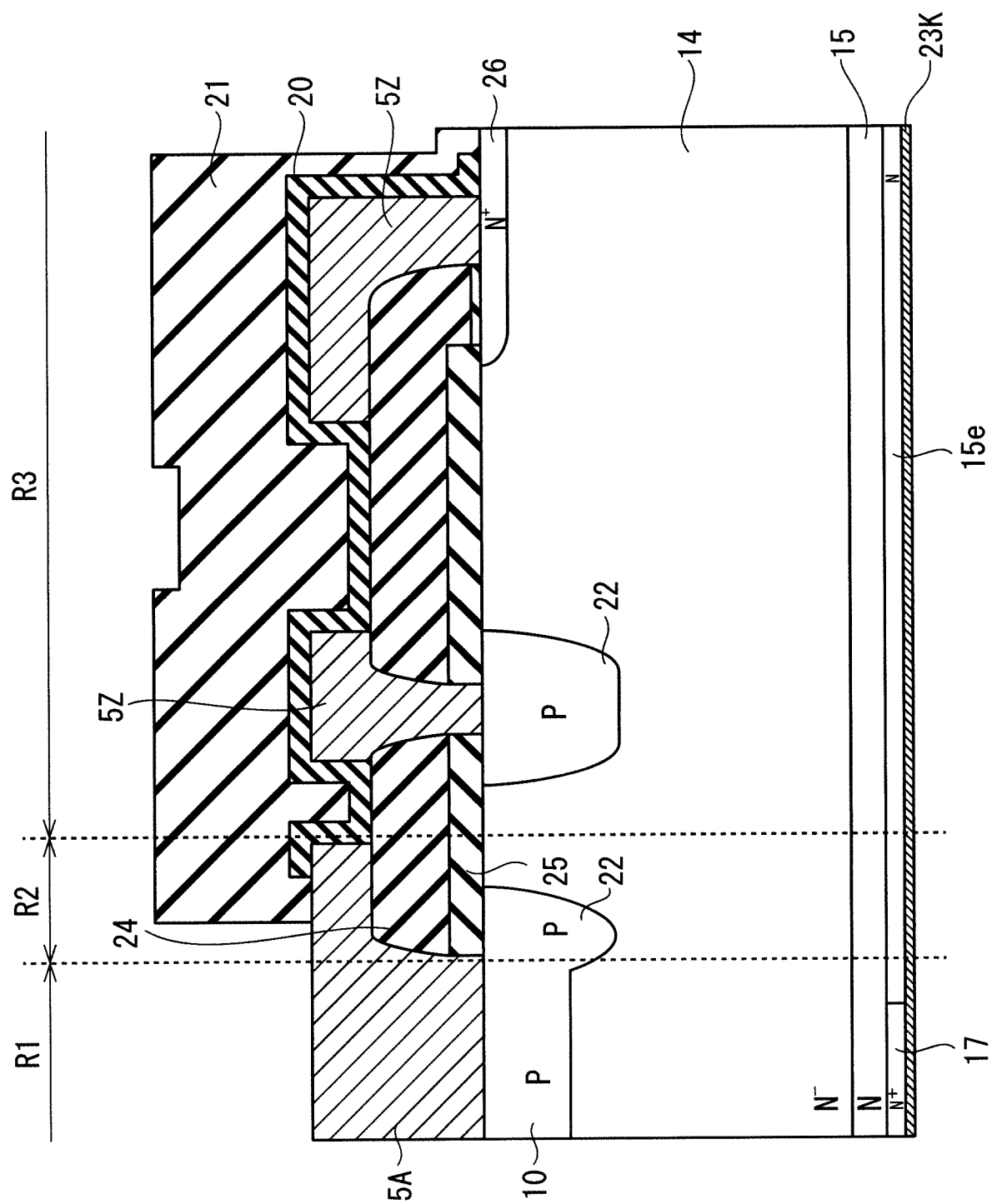
F I G. 5 6

SEMICONDUCTOR DEVICE

CROSS REFERENCE TO RELATED APPLICATIONS

This application is a Continuation Application of U.S. patent application Ser. No. 15/533,615 filed Jun. 6, 2017, which is a U.S. National Stage Entry of PCT/JP2015/052193 filed Jan. 27, 2015, the entire contents of which are incorporated herein by reference.

TECHNICAL FIELD

This invention relates to a semiconductor device including a power semiconductor element, such as an IGBT and a diode.

BACKGROUND ART

Conventional vertical semiconductor devices such as trench-gate IGBTs and PIN diodes have a vertical-structure area. Examples of the vertical-structure area include, for an IGBT, an area including in an n-type drift layer an n-type buffer layer and a p-type collector layer, and for a diode, an area including in an n-type drift layer an n-type buffer layer and an e cathode layer. The IGBT having the vertical-structure area is disclosed by, for example, Patent Document 1.

Furthermore, the conventional vertical semiconductor devices having the vertical-structure area, such as IGBTs and diodes, adopt wafers manufactured by epitaxial growth as Si wafers from which the semiconductor devices are manufactured.

In the vertical-structure area of the wafer of, for example, an IGBT, an n-type buffer layer has as an impurity profile a profile of impurities with a steep slope and high concentration across a junction between the n-type buffer layer and the n-type drift layer.

PRIOR-ART DOCUMENTS

Patent Documents

Patent Document 1: WO2014/054121

SUMMARY OF INVENTION

Problems to be Solved by the Invention

Such impurity concentration profiles of buffer layers in the semiconductor devices having the vertical structure have conventionally had various problems including poor controllability of a turn-off operation and reduction in the blocking capability at turn-off.

The present invention solves the problems, and has an object of providing a structure of a semiconductor device that provides stable breakdown voltage characteristics, reduces turn-off loss with reduction in the leakage current at turn-off, and improves the controllability of a turn-off operation and the blocking capability at turn-off.

Means to Solve the Problems

A semiconductor device according to this invention includes: a semiconductor body having a first main surface and a second main surface, and including a drift layer of a first conductivity type as a main constituent element; a buffer layer of the first conductivity type that is formed adjacent to the drift layer, the buffer layer being closer to the second main surface with respect to the drift layer in the semiconductor body; an active layer formed on the second main surface of the semiconductor body, and having at least one of the first conductivity type and a second conductivity type; a first electrode formed on the first main surface of the semiconductor body; and a second electrode formed on the active layer, wherein a concentration slope δ from the first main surface to the second main surface in a main portion of the buffer layer is expressed by Equation (1) below, the concentration slope δ being derived from displacements in a depth TB (μm) and an impurity concentration CB (cm$^{-3}$), and the concentration slope δ satisfies a concentration slope condition defined by {0.03≤δ≤0.7}.

[Math 1]

$$\delta = \frac{\Delta \log_{10} CB}{\Delta TB} \quad (1)$$

Effects of the Invention

Since the concentration slope δ from the first main surface to the second main surface in the main portion of the buffer layer satisfies the concentration slope condition in the semiconductor device according to the present invention, it is possible to provide stable breakdown voltage characteristics, reduce turn-off loss with reduction in the leakage current at turn-off, and improve the controllability of a turn-off operation and the blocking capability at turn-off.

The objects, features, aspects and advantages of the present invention will become more apparent from the following detailed description and the accompanying drawings of the present invention.

BRIEF DESCRIPTION OF DRAWINGS

FIG. 4 is an explanatory drawing illustrating an impurity profile of the vertical-structure areas illustrated in FIGS. 1 and 2.

FIG. 16 is a graph showing an example of waveforms of turn-off operations of an IGBT in simulation.

FIG. 25 is a graph showing an impurity profile of the N buffer layer according to a first aspect in Embodiment 2.

FIG. 27 is a graph showing an impurity profile of the N buffer layer according to a third aspect in Embodiment 2.

FIG. 30 is a graph showing an impurity profile of the N buffer layer according to a sixth aspect in Embodiment 2.

FIG. 33 is a graph showing the influence of presence or absence of an N auxiliary layer on a breakdown voltage and a peak concentration of the N buffer layer.

FIG. 56 is a cross-sectional view illustrating a semiconductor device according to a second aspect in Embodiment 3.

DESCRIPTION OF EMBODIMENTS

[Principle of Present Invention]

The present invention relates to a vertical-structure area having the following characteristics (a) to (c) in a semiconductor device including a bipolar power semiconductor element represented by an IGBT and a diode that are power semiconductor elements that are key components of power modules (with breakdown voltage (rated voltage) higher than or equal to 600 V).

The characteristics include: (a) a vertical-structure area in which reduction in turn-off loss and operations at high temperatures are achieved by increasing the voltage blocking capability under an OFF state and reducing the leakage current at high temperatures;

(b) a vertical-structure area in which the voltage overshoot at the end of turn-off operations (hereinafter simply referred to as "snap-off phenomenon") and an oscillation triggered by the phenomenon are suppressed; and (c) a vertical-structure area in which the blocking capability in a turn-off operation is to be improved.

The voltage blocking capability under an OFF state in the characteristic (a) means the voltage holding capability in a static state with no current flowing, whereas the blocking capability in a turn-off operation in (c) means the voltage holding capability in a dynamic state with a current flowing.

The vertical-structure area produces an advantage not only for Si as a semiconductor material but also for a semiconductor device made of a wide bandgap material such as silicon carbide (SiC) or gallium nitride (GaN). Furthermore, although Embodiments to be described below exemplify the semiconductor devices belonging to 1700 to 6500 V high-breakdown-voltage classes, they can obtain the advantage for the object regardless of the breakdown-voltage classes.

Figure 1:
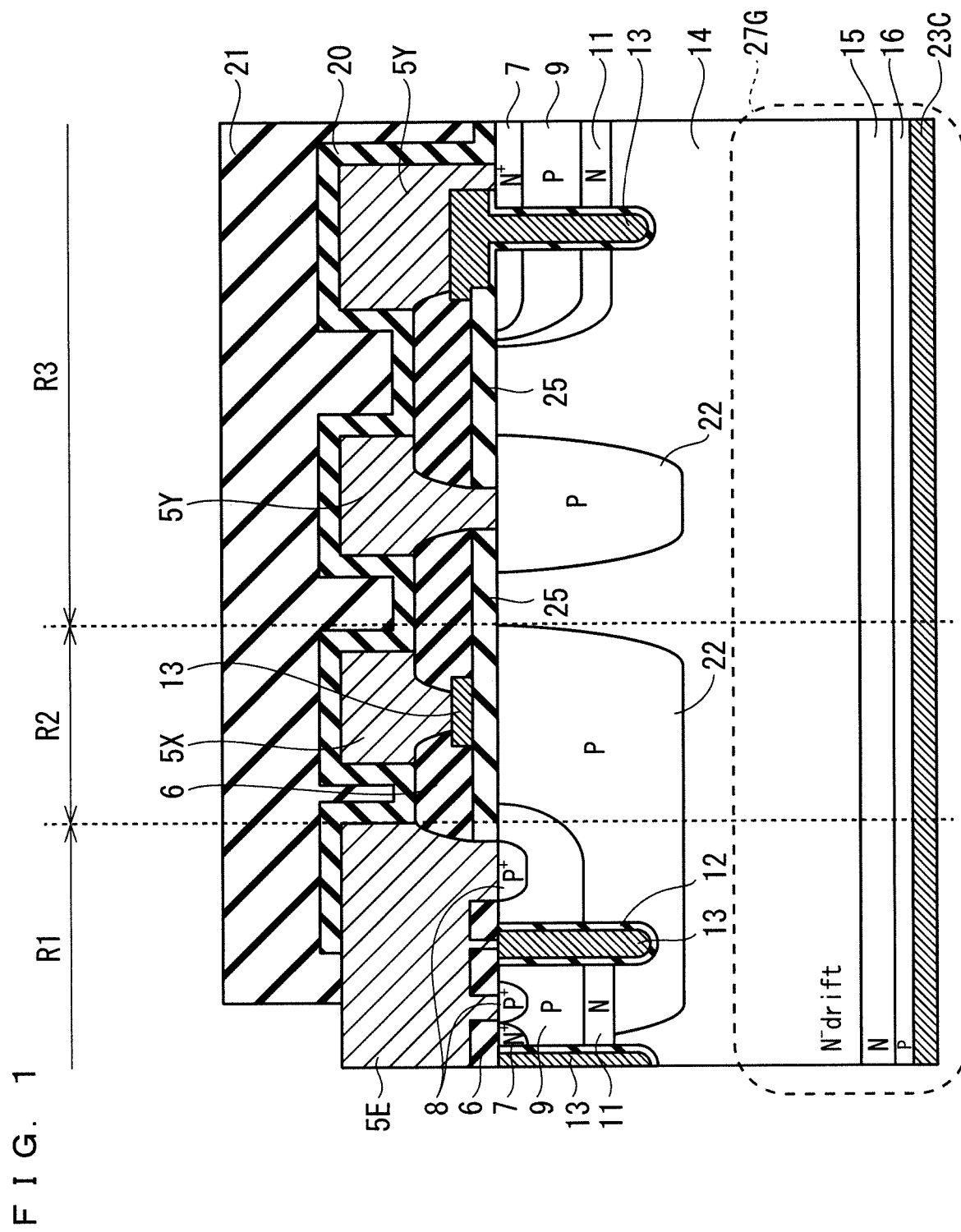
FIG. 1 is a cross-sectional view of a structure of a trench-gate IGBT as a base structure of the present invention.
Figure 2:
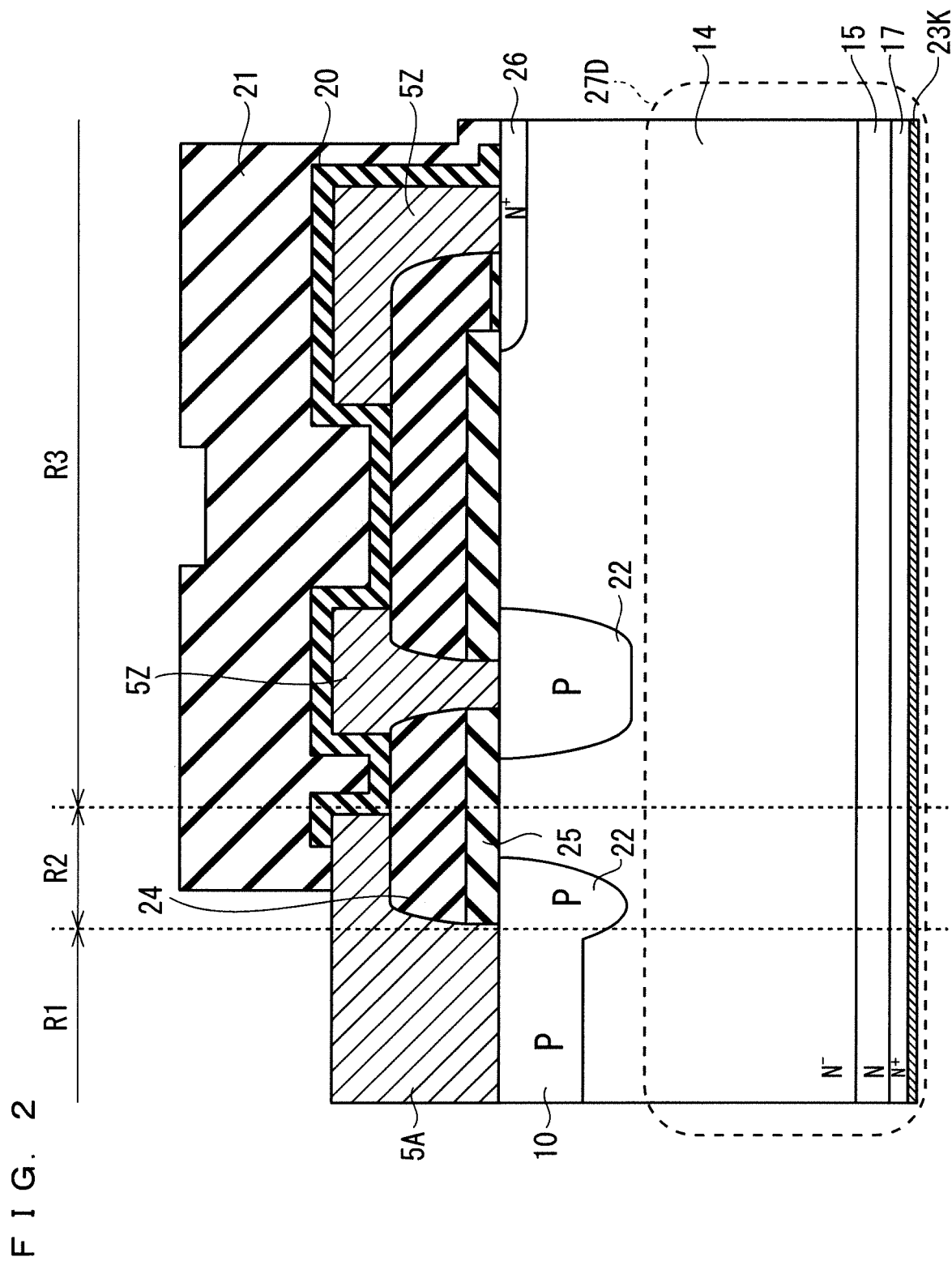
FIG. 2 is a cross-sectional view of a structure of a PIN diode as a base structure of the present invention.

FIG. 1 is a cross-sectional view of a structure of a trench-gate IGBT as a base structure of the present invention. FIG. 2 is a cross-sectional view of a structure of a PIN diode as a base structure of the present invention.

With reference to FIG. 1, a structure of an active cell area R1 will be described. An N buffer layer 15 is formed in the undersurface (second main surface) of an $N^-$ drift layer 14. The N buffer layer 15 formed in the undersurface of the $N^-$ drift layer 14 is adjacent to the $N^-$ drift layer 14.

A p-type P collector layer 16 is formed in the undersurface of the N buffer layer 15. A collector electrode 23C (second electrode) is formed in the undersurface of the P collector layer 16. The following description may refer to, as a "semiconductor body", a structural part at least including the $N^-$ drift layer 14 that is a drift layer of n-type (first conductivity type) and the N buffer layer 15 that is a buffer layer of n-type.

An N layer 11 is formed in an upper layer portion of the $N^-$ drift layer 14. A P base layer 9 is formed on a top surface of the N layer 11. Embedded gate electrodes 13 that are made of polysilicon and have a trench structure are embedded to vertically penetrate through the P base layer 9 and the N layer 11. The embedded gate electrodes 13 are facing, through a gate insulating film 12, the $N^-$ drift layer 14, the N layer 11, the P base layer 9, and an $N^+$ emitter layer 7. Thus, the embedded gate electrodes 13, the $N^+$ emitter layer 7, the P base layer 9, the N layer 11 form an insulated gate transistor structure in an IGBT.

The $N^+$ emitter layer 7 of n-type is formed on the surface of the P base layer 9 to be in contact with the gate insulating film 12. $P^+$ layers 8 are formed further on the surface of the P base layer 9. Interlayer insulation films 6 are formed on the embedded gate electrodes 13, and an emitter electrode 5E (first electrode) is formed on the top surface (first main surface) of the $N^-$ drift layer 14 to be electrically connected to the $P^+$ layers 8. In FIG. 1, one of the two embedded gate electrodes 13 to the left serves as an actual gate electrode, and the other embedded gate electrode 13 to the right is a dummy gate electrode with an emitter potential, without serving as an actual gate electrode.

Next, an interface area R2 will be described. A P area 22 is formed in the upper layer portion of the $N^-$ drift layer 14. This P area 22 extends toward the active cell area R1, and is formed deeper than the embedded gate electrode 13 that is the dummy electrode. The P area 22 functions as a guard ring.

An insulating film 25 is formed on the upper surface of the $N^-$ drift layer 14, the interlayer insulation films 6 and a part of the embedded gate electrode 13 (gate-electrode surface portion) are formed on the insulating film 25, and an electrode 5X functioning as a gate electrode is formed in between the interlayer insulation films 6 and on the gate-electrode surface portion. This electrode 5X is formed simultaneously with the emitter electrode 5E in the active cell area R1 independently of the emitter electrode 5E.

Next, an edge termination area R3 will be described. The P area 22 is selectively formed in the upper layer portion of the $N^-$ drift layer 14. The P area 22 functions as a field ring. Furthermore, a structure similar to the insulated gate transistor structure in the active cell area R1 is also formed.

As such, the P area 22 is provided as an area that performs a breakdown voltage holding function in each of the interface area R2 and the edge termination area R3. The $N^+$ emitter layer 7 and the N layer 11 with the insulated gate transistor structure in the edge termination area R3 are provided to prevent a depletion layer that extends from a p-n junction between the P area 22 and the $N^-$ drift layer 14 from further extending.

A laminated structure of the insulating films 25 and the interlayer insulation films 6 is selectively formed on the upper surface of the $N^-$ drift layer 14, and an electrode 5Y electrically connected to the P area 22 and the embedded gate electrode 13 is formed to serve as a floating electrode. This electrode 5Y is formed simultaneously with the emitter electrode 5E in the active cell area R1 independently of the emitter electrode 5E and the electrode 5X.

Then, a passivation film 20 is formed on the emitter electrode 5E and the electrodes 5X and 5Y across the active cell area R1, the interface area R2, and the edge termination area R3, and a passivation film 21 is formed on the passivation film 20 and a part of the emitter electrode 5E.

Furthermore, a vertical-structure area 27G is formed between the active cell area R1, the interface area R2, and the edge termination area R3 for an IGBT in common. The vertical-structure area 27G is a laminated structure of the $N^-$ drift layer 14, the N buffer layer 15, the P collector layer 16, and the collector electrode 23C that form a semiconductor body.

With reference to FIG. 2, the structure of the active cell area R1 will be described. The N buffer layer 15 is formed in the undersurface (second main surface) of the $N^-$ drift layer 14. An $N^+$ cathode layer 17 is formed in the undersurface of the N buffer layer 15. A cathode electrode 23K (second electrode) is formed in the undersurface of the $N^+$ cathode layer 17.

A P anode layer 10 (electrode area) is formed in the upper layer portion of the $N^-$ drift layer 14. The P anode layer 10, the $N^-$ drift layer 14, the N buffer layer 15, and the $N^+$ cathode layer 17 form a PIN diode structure. Then, an anode electrode 5A (first electrode) is formed on a top surface (first main surface) of the P anode layer 10.

Next, the interface area R2 will be described. The P area 22 is formed in the upper layer portion of the $N^-$ drift layer 14. This P area 22 extends toward the active cell area R1, and is combined with the P anode layer 10. Here, the P area 22 is formed deeper than the P anode layer 10. This P area 22 functions as a guard ring.

The insulating film 25 is formed on the upper surface of the N⁻ drift layer 14, the interlayer insulation film 24 is formed on the insulating film 25, and an electrode 5A is formed on a part of the interlayer insulation film 24.

Next, the interface area R3 will be described. The P area 22 is selectively formed in the upper layer portion of the N⁻ drift layer 14. The P area 22 functions as a field limiting ring. Furthermore, an N⁺ layer 26 is selectively formed in the surface of the N⁻ drift layer 14 independently of the P area 22. The N⁺ layer 26 is provided to prevent a depletion layer that extends from a p-n junction between the P area 22 and the N⁻ drift layer 14 from further extending. The P area 22 has a structure in which the number of the P areas 22 increases as the breakdown-voltage class is higher.

A laminated structure of the insulating films 25 and the interlayer insulation films 24 is selectively formed on the upper surface of the N⁻ drift layer 14, and the electrode 5Z is formed to be electrically connected to the P area 22 and the N⁺ layer 26. An electrode 5Z is formed simultaneously with the anode electrode 5A in the active cell area R1 independently of the anode electrode 5A.

Then, the passivation film 20 is formed on the anode electrode 5A and the electrode 5Z across the interface area R2 and the edge termination area R3, and the passivation film 21 is formed on the passivation film 20 and a part of the anode electrode 5A in the interface area R2.

Furthermore, a vertical-structure area 27D is formed between the active cell area R1, the interface area R2, and the edge termination area R3 for a diode in common. The vertical-structure area 27D is a laminated structure of the N⁻ drift layer 14, the N buffer layer 15, the N⁺ cathode layer 17, and the cathode electrode 23K that form a semiconductor body.

Figure 3:
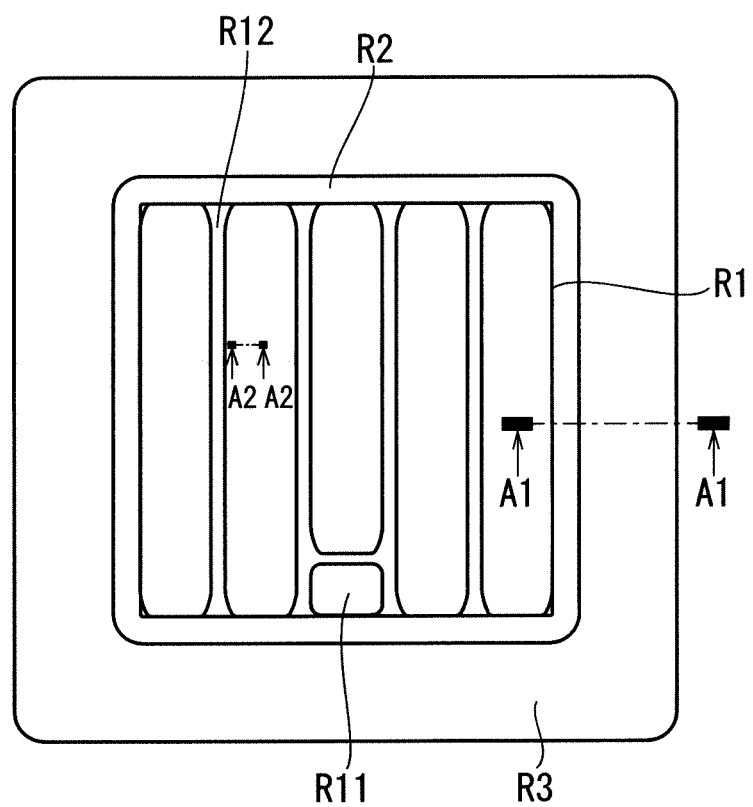
FIG. 3 is an explanatory drawing schematically illustrating a planar structure of the vertical semiconductor devices illustrated in FIGS. 1 and 2.

FIG. 3 is an explanatory drawing schematically illustrating a planar structure of a vertical semiconductor device such as an IGBT or a diode. As illustrated in FIG. 3, the active cell areas R1 are formed at the center, a surface gate line portion R12 is formed between the two active cell areas R1, and a gate pad portion R11 is formed in a part of the areas.

The interface area R2 is formed around the active cell areas R1, the gate pad portion R11, and the surface gate line portions R12, and the edge termination area R3 is formed further around the interface area R2. The structures illustrated in FIGS. 1 and 2 correspond to the cross-section of A1-A1 in FIG. 3.

The active cell areas R1 are areas for guaranteeing the base performance of a power semiconductor chip, whereas the interface area R2 is an area for guaranteeing the ruggedness of a power semiconductor in a joint area of the active cell areas R1 and the edge termination area R3 when the power semiconductor performs a dynamic operation and for supporting the intrinsic performance (of the semiconductor elements) in the active cell areas R1.

Furthermore, the edge termination area R3 is an area, in a static state, for withstanding breakdown voltages, providing stable breakdown voltage characteristics, guaranteeing the reliability, and suppressing failure in ruggedness in a dynamic operation to support the intrinsic performance in the active cell areas R1.

A vertical-structure area 27 (vertical-structure area 27G, 27D) is an area for holding performance on the total losses (losses under ON state and turn OFF state), withstanding breakdown voltages in a static state, providing stable breakdown voltage characteristics and stable leakage characteristics at high temperatures, and guaranteeing the reliability, and the controllability and the ruggedness in a dynamic operation to support the base performance of a power semiconductor.

FIG. 4 is an explanatory drawing illustrating impurity profiles of the vertical-structure areas 27 (vertical-structure areas 27G and 27D) illustrated in FIGS. 1 and 2.

The conventional vertical semiconductor devices such as IGBTs and diodes adopt the wafers manufactured by epitaxial growth as Si wafers from which the semiconductor devices are manufactured. As a result, the N buffer layer 15 has, as an impurity profile PR in FIG. 4, a distinctive impurity profile of impurities with a steep slope and high concentration and with a right-angled lower left part that is boxlike, from the N buffer layer 15 to the N⁻ drift layer 14 and across a junction J20 of the N buffer layer 15.

With the N buffer layer 15 (Nref (15)) having such impurity profile PR provided, when dynamic operations such as respective turn-off operations of an IGBT and a diode are performed, a carrier plasma layer from the N buffer layer 15 to the N⁻ drift layer 14 and the vicinity of the junction between the N buffer layer 15 and the N⁻ drift layer 14 is depleted due to a relationship between a carrier plasma state in the device and the field intensity distribution. The carrier plasma layer means an intermediate layer with a high carrier concentration in which electrons and holes have almost the same concentration, and also a high carrier concentration layer whose carrier density of n-type or p-type (second conductivity type) exceeds $10^{16}$ cm⁻³ and whose doping carrier concentration is higher than that of the N⁻ drift layer 14 by two to three orders of magnitude.

The field intensity increases in the junction between the N buffer layer 15 and the N⁻ drift layer 14, the snap-off phenomenon and an subsequent oscillation occur in the turn-off waveforms, and the snap-off phenomenon causes the device to break down.

The result causes the conventional vertical IGBTs and diodes to have poor controllability of a turn-off operation and reduction in the blocking capability at turn-off. Furthermore, the snap-off phenomenon and the subsequent oscillation may cause inverter systems including power modules with the IGBTs and diodes that may have the snap-off phenomenon and the subsequent oscillation to malfunction with a factor that may cause noise.

Previously, methods for optimizing a parameter of the N⁻ drift layer 14 have been selected as a means for solving the problems, such as thickening the N⁻ drift layer 14 so that the depletion layer is not in contact with the N buffer layer 15 in a turn-off operation, and increasing the impurity concentration of the N⁻ drift layer 14 to reduce variations thereof.

However, thickening the N⁻ drift layer 14 increases the ON voltages of both the IGBT and the diode, and causes a reaction of increase in total loss. On the other hand, reducing variations in impurity concentration of the N⁻ drift layer 14 impose limitations on the techniques for manufacturing Si wafers and on the Si wafers to be adopted, thus increasing costs of the Si wafers. As such the conventional IGBTs and diodes have technical problems that are dilemmas in improving the device performance.

Furthermore, the wafers conventionally manufactured by epitaxial growth thicken the N⁻ drift layer 14 with application of a high breakdown voltage (≥1700 V), and then have a demerit of increase in the costs of Si wafers as a result of the dependence on the thickness of Si epitaxially formed.

In addition, the Si wafers belonging to a breakdown-voltage class lower than or equal to 1700 V increase costs for, for example, IGBT chips and diode chips, thus being unable to answer the demand for the chips with high cost performance while increasing the performance desired by the market.

Here, it is necessary to consider whether to adopt, as materials of Si wafers to be used, not the wafers conventionally manufactured by epitaxial growth but Si wafers obtained by setting, in a floating zone (FZ) method, an impurity concentration of a semiconductor body according to a concentration of the N⁻ drift layer 14 required for each breakdown-voltage class, and Si wafers whose cost does not alter.

When the conventional vertical IGBTs and diodes perform a dynamic operation as described above, the carrier plasma layer in the vicinity of the junction between the N⁻ drift layer 14 and the N buffer layer 15 is depleted due to the relationship between a carrier plasma state in the device and the field intensity distribution. The field intensity increases in the junction between the N buffer layer 15 and the N– drift layer 14, the snap-off phenomenon and the subsequent oscillation occur in the turn-off waveforms, and the snap-off phenomenon causes the device to break down. The result causes both the IGBTs and diodes to have poor controllability of a turn-off operation and reduction in the blocking capability at turn-off.

As such, the conventional techniques on IGBTs and diodes have difficulties in improving the controllability of a turn-off operation and the blocking capability at turn-off, reducing the ON voltage as a base performance of a power semiconductor, and providing stable breakdown voltage characteristics while controlling the device internal state in the dynamic operation. Furthermore, not the wafers prepared by epitaxial growth but the vertical-structure area (particularly, structure of the N buffer layer 15) using FZ wafers prepared in the FZ method, which solves the problems above, is important on costs of the chips.

The present invention solves a dilemma in the device performance of the conventional IGBTs and diodes using the FZ wafers, and has an object of reducing the ON voltage, providing stable breakdown voltage characteristics, reducing turn-off loss with reduction in the leakage current at turn-off, improving the controllability of a turn-off operation, and significantly improving the blocking capability at turn-off.

Figure 6:
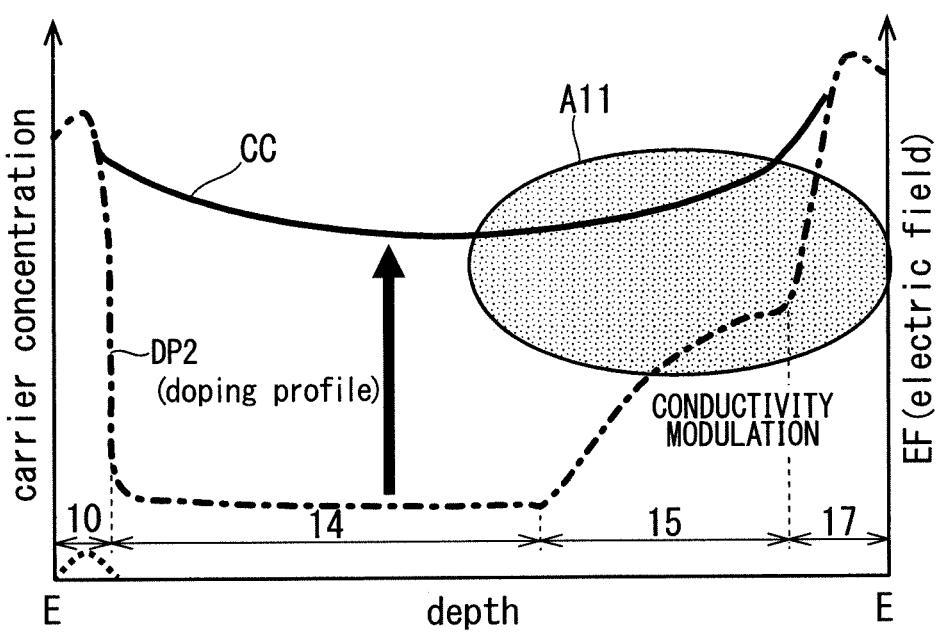
FIG. 6 is an explanatory drawing illustrating a concept of the vertical-structure area proposed by the present invention.
Figure 7:
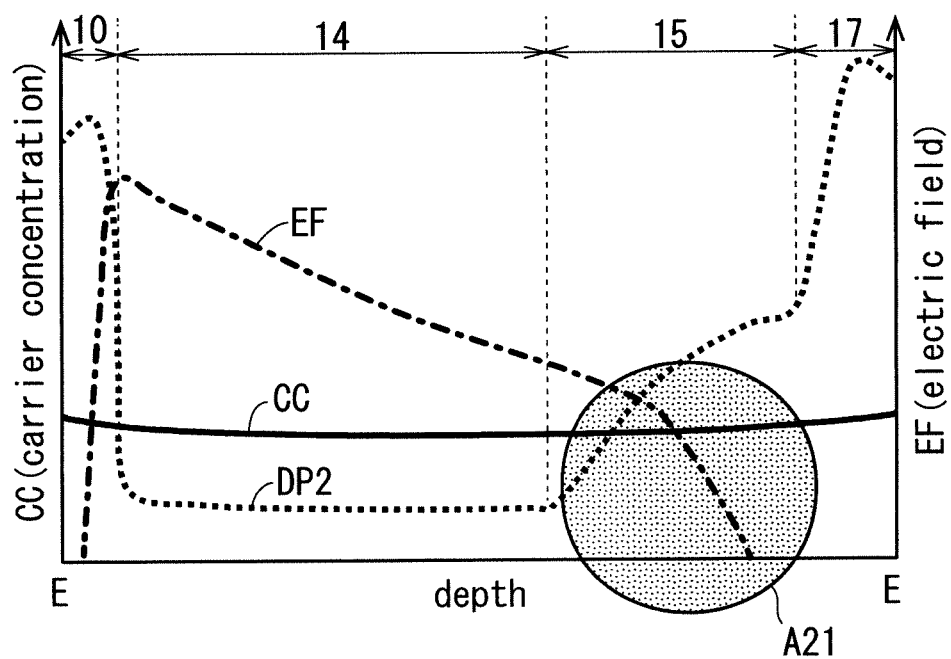
FIG. 7 is an explanatory drawing illustrating the concept of the vertical-structure area proposed by the present invention.
Figure 8:
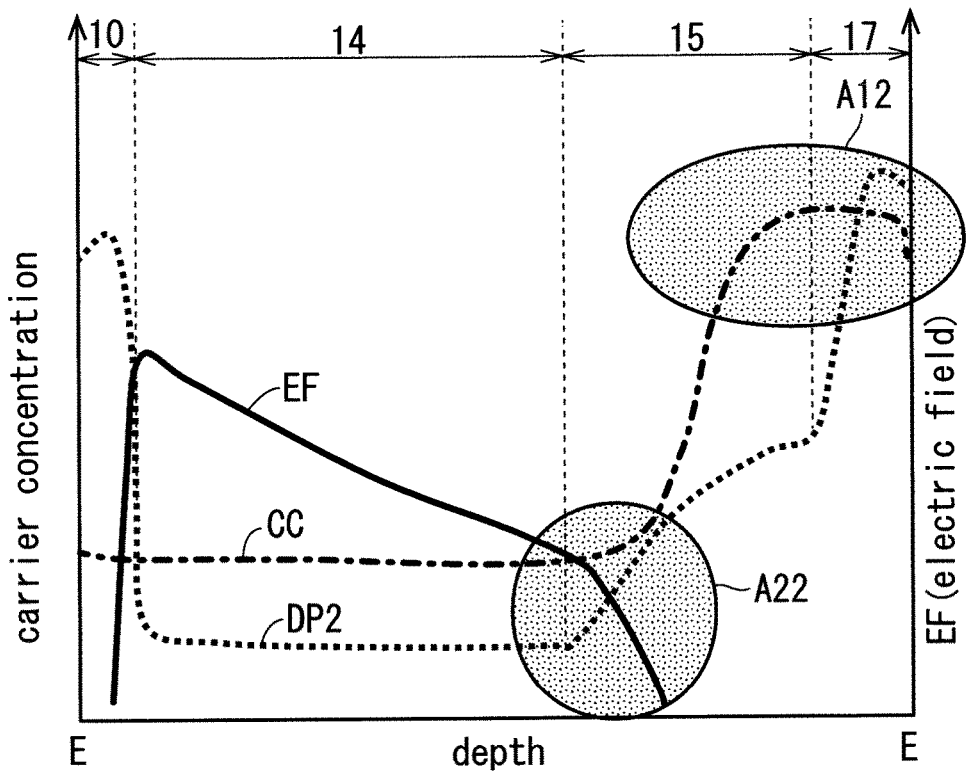
FIG. 8 is an explanatory drawing illustrating the concept of the vertical-structure area proposed by the present invention.

FIGS. 6 to 9 are explanatory drawings illustrating the concept of the vertical-structure area proposed by the present invention. FIG. 6 illustrates a carrier concentration CC and an impurity profile (doping profile) DP2 under an ON state, and FIGS. 7 and 8 illustrate the carrier concentration CC, the impurity profile DP2, and a field intensity EF under a blocking voltage state and a dynamic state, respectively. In FIGS. 6 to 8, the numbers illustrated at the top and at the bottom represent the constituent elements of the diode illustrated in FIG. 2, such as the P anode layer 10.

Figure 9:
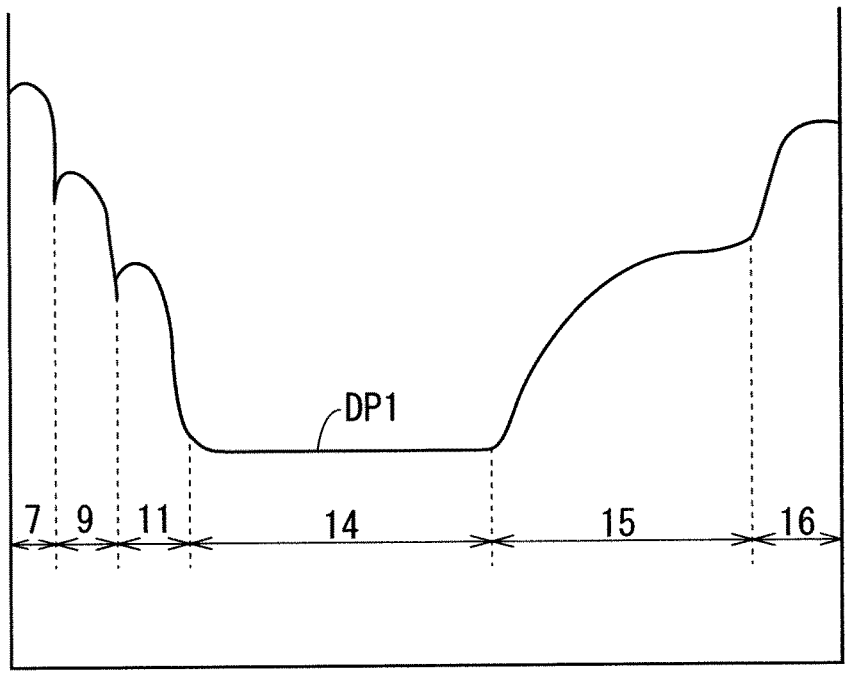
FIG. 9 is an explanatory drawing illustrating the concept of the vertical-structure area proposed by the present invention.

Furthermore, FIG. 9 illustrates an impurity profile DP1 when the semiconductor device is an IGBT. In FIG. 9, the numbers illustrated at the bottom represent the constituent elements of the IGBT illustrated in FIG. 1, such as the N⁺ emitter layer 7.

The technical problems caused by the problems of the vertical-structure area 27 on the conventional IGBTs and diodes will be solved by implementing the vertical-structure area 27 (particularly, structure of the N buffer layer 15) to be described below. The concept to be described below is common between the vertical IGBTs and diodes. In other words, the concept is applicable to the IGBT structure in FIG. 1 and the diode structure in FIG. 2 in common.

The concept of the structure of the N buffer layers 15 included in the vertical-structure areas (vertical-structure areas 27G and 27D) proposed by the present invention will be described as the following (i) to (iii).

(i) As illustrated in the area A11 of FIG. 6 and the area A12 of FIG. 8, the carrier plasma layer remains, thus showing that a conductivity modulation phenomenon occurs inside the N buffer layer 15 under an ON state of the device as a depletion phenomenon of the carrier plasma layer in the vicinity of the junction between the N⁻ drift layer 14 and the N buffer layer 15 in a turn-off operation. Thus, the concentration of the N buffer layer 15 is reduced to maintain the carrier plasma layer. Since the carrier plasma layer is a high-concentration layer whose concentration is higher than or equal to $10^{16}$ cm⁻³, the concentration thereof is reduced lower than or equal to an order of $10^{15}$ cm⁻³. As such, the impurity concentration of the N buffer layer 15 is reduced to an extent where the carrier plasma layer remains in the N buffer layer 15.

(ii) As illustrated in the area A21 of FIG. 7 and the area A22 of FIG. 8, the field intensity inside the N buffer layer 15 is stopped in a static state and the concentration slope in the vicinity of the junction between the N⁻ drift layer 14 and the N buffer layer 15 is lower in angle so that the depletion layer smoothly extends inside the N buffer layer 15 in a dynamic operation.

(iii) The turn-off loss is reduced with reduction in the leakage current at turn-off by using the N buffer layer 15 that is deep (thick) with a low concentration and a concentration slope to reduce a current amplification factor (αpnp) of a PNP bipolar transistor included in an IGBT or a diode (diode of the second type to be described later).

Thus, the present invention aims at optimizing the impurity concentration and the depth of the N buffer layer 15 in the vertical-structure area 27, considering the N buffer layer 15 as an important layer for controlling a carrier plasma state in the device during a device operation.

Embodiment 1

A semiconductor device according to Embodiment 1 involves a technique on the N buffer layers 15 in the vertical-structure areas 27 (vertical-structure areas 27G and 27D) of the vertical semiconductor devices represented by IGBTs and diodes, has an advantage of suppressing the snap-off phenomenon or the subsequent oscillation in a turn-off operation, increases the breakdown voltage blocking capability under a turn-off state, reduces the leakage current at high temperatures, and achieves reduction in the turn-off loss and high-temperature operations.

Figure 10A:
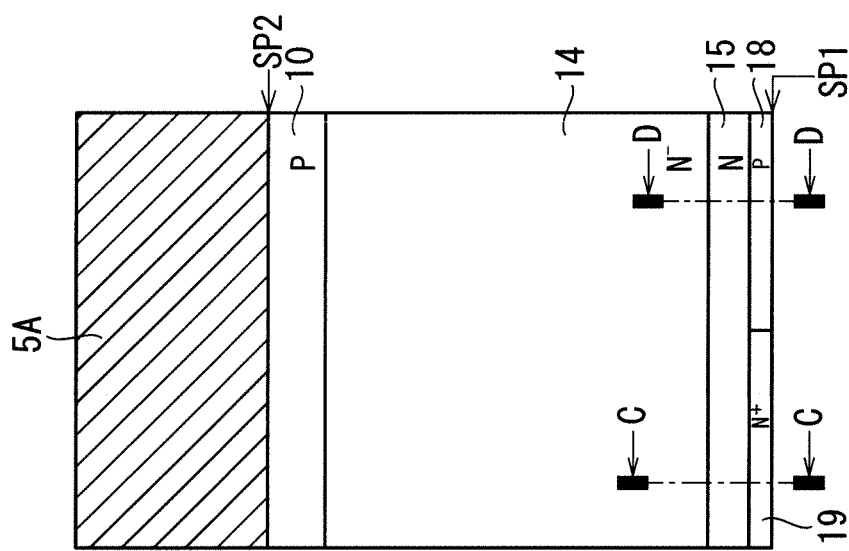
FIGS. 10A-10C show cross-sectional views of an IGBT with a trench gate structure and diode structures in respective active cell areas.
Figure 10B:
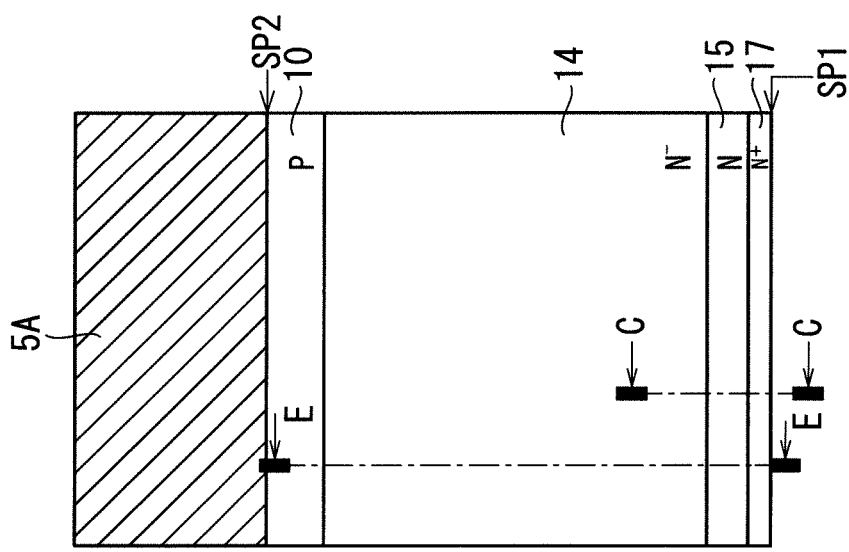
Figure 10C:
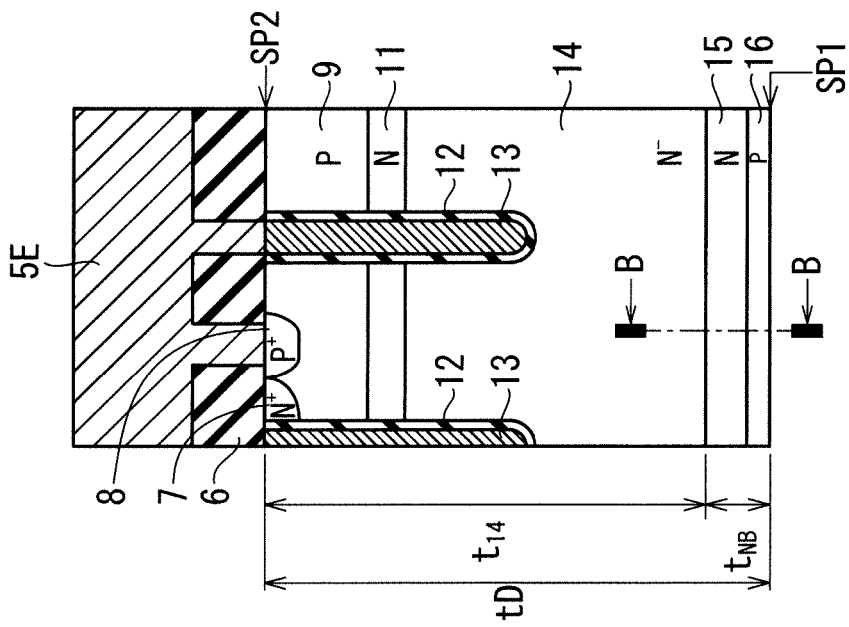

FIGS. 10A-10C show cross-sectional views of an IGBT with a trench gate structure and diode structures both of which involve the technique of the present invention. The cross-sectional views are taken along A2-A2 in the active cell area R1 of FIG. 3. The cross-section E-E in FIG. 10B corresponds to the depth in the horizontal axis of FIGS. 6 to 8 that is described in "Principle of present invention".

FIG. 10A illustrates the IGBT with the structure illustrated in FIG. 1, FIG. 10B illustrates the diode illustrated in FIG. 2, and FIG. 10C illustrates a diode obtained by replacing the N⁺ cathode layer 17 of the diode in FIG. 2 with a combination of a P cathode layer 18 (second partial active layer) and an N⁺ cathode layer 19 (first partial active layer and another electrode area). The diode illustrated in FIG. 10B may be referred to as a "diode of the first type", and the diode illustrated in FIG. 10C may be referred to as a "diode of the second type".

The N⁻ drift layers 14 in FIGS. 10A-10C are formed with an impurity concentration ranging from $1.0\times10^{12}$ to $1.0\times10^{15}$ cm⁻³ by using the FZ wafers prepared in the FZ method.

Each of the diffusion layers of the IGBT and the diodes in FIGS. 10A-10C are formed in the actual wafer processes by implanting ions and using the annealing technique to yield the following parameters.

P base layer 9: The peak concentration is set to $1.0\times10^{16}$ to $1.0\times10^{18}$ cm', and its depth is set as a junction depth longer than the N⁺ emitter layer 7 and shallower than the N layer 11.

N layer 11: The peak (impurity) concentration is set to $1.0\times10^{15}$ to $1.0\times10^{17}$ cm⁻³, and its depth is set as a junction depth longer than the P base layer 9 by 0.5 to 1.0 μm.

N⁺ emitter layer 7: The peak concentration is set to $1.0\times10^{18}$ to $1.0\times10^{21}$ cm⁻³, and its depth is set to 0.2 to 1.0 μm.

P⁺ layers 8: The surface (impurity) concentration is set to $1.0\times10^{18}$ to $1.0\times10^{21}$ cm⁻³, and its depth is set deeper than or equal to that of the N⁺ emitter layer 7.

N buffer layer 15 (common between the IGBT and the diodes): The peak concentration PC is set to $2.0\times10^{14}$ to $1.0\times10^{16}$ cm⁻³, and a depth $t_{NB}$ is set to 4.0 to 50 μm.

P collector layer 16: The surface concentration is set to $1.0\times10^{16}$ to $1.0\times10^{20}$ cm⁻³, and its depth is set to 0.3 to 1.0 μm.

P anode layer 10: The surface concentration is set higher than or equal to $1.0\times10^{16}$ cm⁻³, the peak concentration is set to $2.0\times10^{16}$ to $1.0\times10^{18}$ cm⁻³, and its depth is set to 2.0 to 10.0 μm.

N⁺ cathode layer 17: The surface concentration is set to $1.0\times10^{18}$ to $1.0\times10^{21}$ cm⁻³, and its depth is set to 0.3 to 1.0 μm.

P cathode layer 18: The surface concentration is set to $1.0\times10^{16}$ to $1.0\times10^{20}$ cm⁻³, and its depth is set to 0.3 to 1.0 μm.

The diode of the second type illustrated in FIG. 10C can obtain more distinctive advantages in diode performance such as the electric field grading in which the field intensity at a cathode is graded as disclosed by Japanese Patent No. 5256357 and Japanese Patent Application Laid-Open No. 2012-9811, than the diode of the first type illustrated in FIG. 7.

As illustrated in FIGS. 10A-10C, the "depth" means, in the P collector layer 16 (including the N⁺ cathode layer 17, the P cathode layer 18, and the N⁺ cathode layer 19, and the P collector layer 16 will be hereinafter a representative one) and the N buffer layer 15, a distance from a reference position SP1 at an undersurface of the P collector layer 16 to an upper surface thereof and to an upper surface of the N buffer layer 15. In other words, the depth $t_{NB}$ of the N buffer layer 15 is a distance from the junction (interface) between the N⁻ drift layer 14 and the N buffer layer 15 to a junction surface between the collector electrode 23C (cathode electrode 23K) and the P collector layer 16.

The "depth" means, in the other areas (such as the P base layer 9, the N layer 11, and the N⁺ emitter layer 7), a distance from a reference position SP2 at the topmost surface of the N⁻ drift layer 14 to an undersurface of each of the P base layer 9, the N layer 11, and the N⁺ emitter layer 7.

Furthermore, in FIGS. 10A-10C, $t_{NB}$ denotes a depth of the N buffer layer 15, and $t_{14}$ denotes a depth of the N⁻ drift layer 14. Furthermore, a device length tD indicates the length (thickness) of the IGBT or the diode in the vertical direction.

FIG. 4 previously described illustrates the impurity profiles in the depth direction of the cross-section taken along B-B in FIG. 10A, the cross-section taken along C-C in FIG. 10B, and the cross-section taken along D-D in FIG. 10C.

The point of 0 μm in the horizontal axis of FIG. 4 indicates the undersurface of the P collector layer 16, the N⁺ cathode layer 17, or the P cathode layer 18 and the N⁺ cathode layer 19 that is an active layer of the IGBT or the diode in FIGS. 10A-10C. The P collector layer 16 of the IGBT will be mainly described as a representative active layer. FIG. 4 illustrates the conventional impurity profile PR and the impurity profile DP1 according to Embodiment 1 that are associated with the same portions. The vertical axis in FIG. 4 is an axis representing an impurity concentration normalized with respect to the impurity concentration of the N⁻ drift layer 14 as $10^1$.

In the area RA in FIG. 4, the conventional impurity profile PR of the main area of the N buffer layer 15 and the impurity profile DP1 (solid line) according to Embodiment 1 are indicated.

The impurity profile DP1 of the N buffer layer 15 in the semiconductor device according to Embodiment 1 has a lower concentration and a concentration slope that is lower in angle in a depth direction toward a junction 21 between the N⁻ drift layer 14 and the N buffer layer 15, than those of the impurity profile PR in the conventional N buffer layer 15. Furthermore, the N buffer layer 15 according to Embodiment 1 is formed deeper than the conventional one, that is, formed with a longer distance from the undersurface of the P collector layer 16 to the top surface of the N buffer layer 15 so that the junction between the N⁻ drift layer 14 and the N buffer layer 15 is shifted upward (to the right of the drawing) to the junction J21 with respect to the conventional junction J20.

Figure 5:
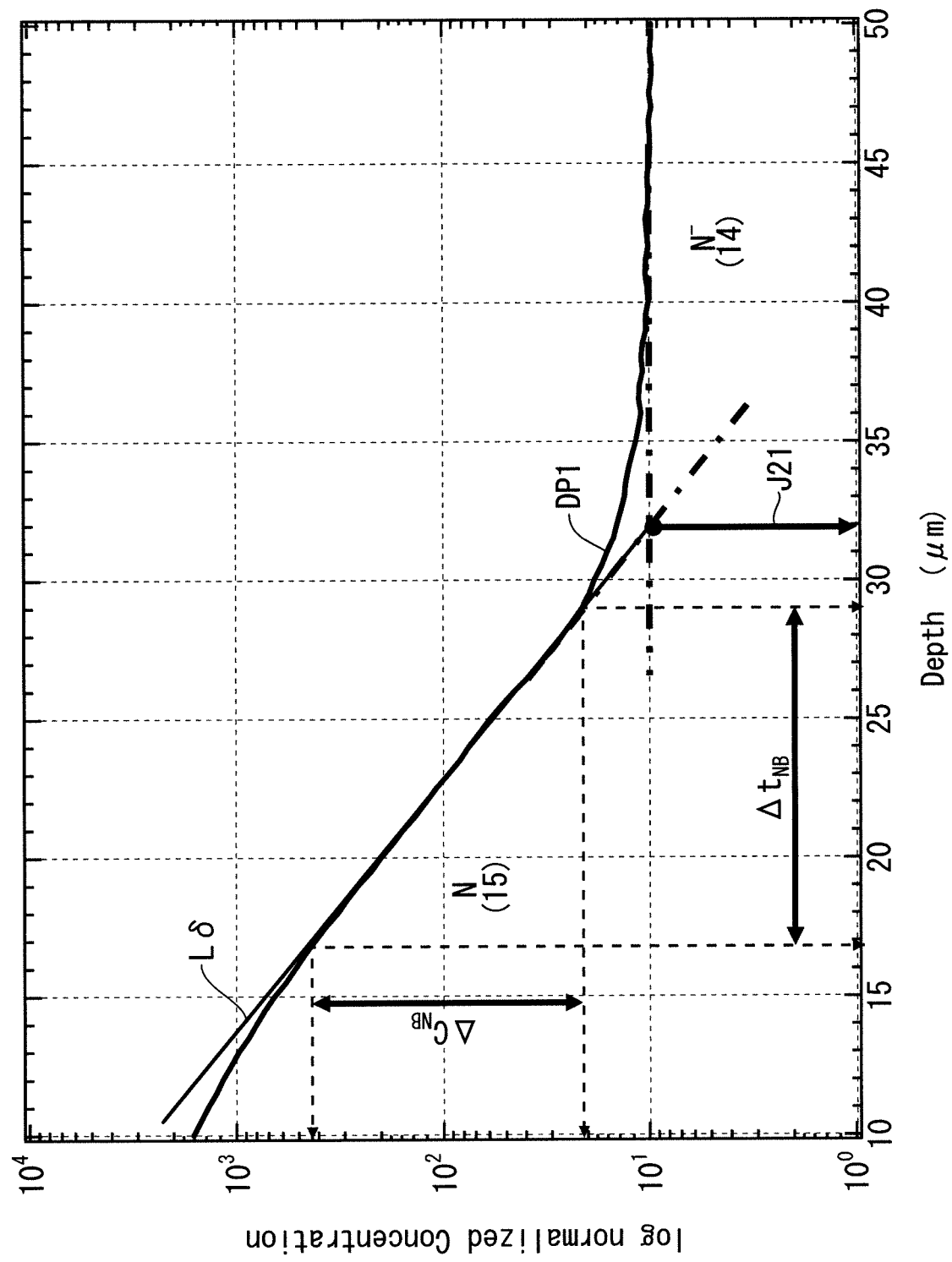
FIG. 5 is an enlarged view of an area RA in FIG. 4.

FIG. 5 is an enlarged view of the area RA in FIG. 4. The concentration slope δ in the main area of the N buffer layer 15 according to Embodiment 1 is expressed by the following Equation (1) to quantify a relationship between the electrical characteristics of the diode and a characteristic of the N buffer layer 15, that is, the concentration slope lower in angle in the depth direction in FIG. 5.

[Math 2]

$$\delta = \frac{\Delta \log_{10} CB}{\Delta TB} \quad (1)$$

In Equation (1), the denominator means a film thickness displacement ΔTB (μm) and the numerator means a concentration displacement $\Delta \log_{10} CB$ (cm⁻³). In the concentration displacement "$\Delta \log_{10} CB$", "CB" represents a variation in impurity concentration of the N buffer layer 15 and the "log" represents change in the concentration by a common logarithm whose base is 10. Furthermore, the film thickness displacement "ΔTB" represents a variation of the N buffer layer 15 in the depth direction.

Furthermore, regarding the junction between the N buffer layer 15 and the N⁻ drift layer 14, an intersection point between an extension of a concentration slope line Lδ and an extension of the impurity concentration of the N⁻ drift layer 14 in FIG. 5 is defined as an accurate junction J21 according to Embodiment 1.

Figure 11:
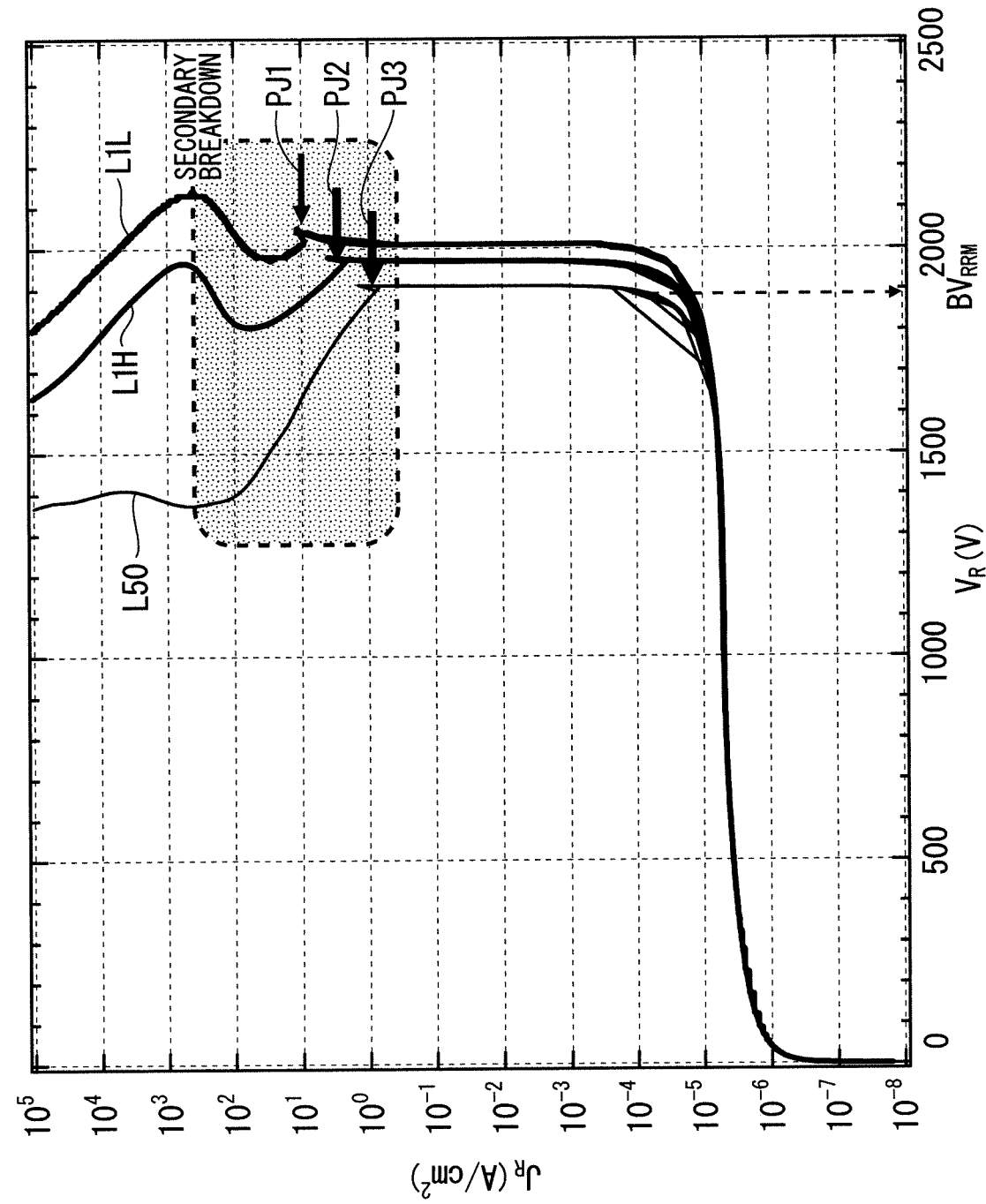
FIG. 11 is a graph showing a result of a simulation on the influence of a concentration slope δ and a depth of an N buffer layer 15 in a diode of a second type.
Figure 12:
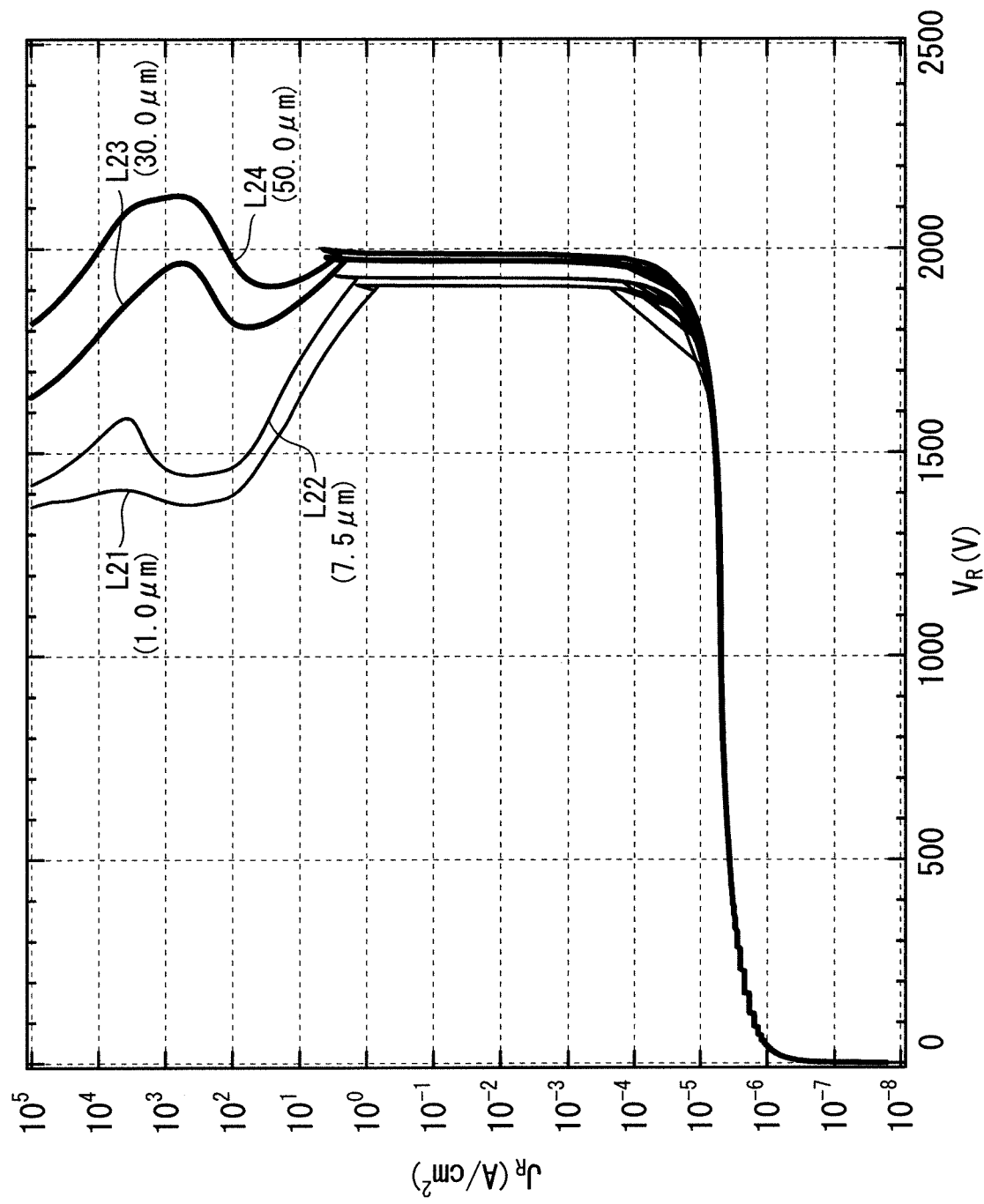
FIG. 12 is a graph showing a result of a simulation on the influence of the concentration slope δ and the depth of the N buffer layer 15 in the diode of the second type.

Each of FIGS. 11 and 12 is a graph showing a result of a simulation (at an operating temperature of 298 K) using the diode of the second type illustrated in FIG. 10C, in relation to influence of (a value of) the concentration slope δ and the depth $t_{NB}$ of the N buffer layer 15 on characteristics of $J_R$ (current density: A/cm$^2$) vs $Y_R$ (reverse voltage: V) in the 1700 V breakdown-voltage class.

In FIG. 11, a characteristic curve L50 represents a characteristic of the conventional structure, a characteristic curve L1H represents a characteristic when the concentration slope δ is relatively higher, and a characteristic curve L1L represents a characteristic when the concentration slope δ is relatively lower. The relatively higher concentration slope δ is, for example, δ=0.47, and the relatively lower concentration slope δ is, for example, δ=0.083. This holds true for the following description mentioning that the concentration slope δ is relatively higher or lower.

Furthermore, in FIG. 12, characteristic curves L21, L22, L23, and L24 represent cases where the depths of the N buffer layer 15 (distance from the undersurface of the P cathode layer 18 and the N$^+$ cathode layer 19 to the top surface of the N buffer layer 15) are 1.0, 7.5, 30.0, and 50.0 (μm), respectively.

As illustrated in these drawings, the parameters of the concentration slope δ and the depths of the N buffer layer 15 influence not only the static blocking breakdown voltage (BV$_{RRM}$) but also significantly the secondary breakdown observed in a high-current density area with the $J_R$ vs $Y_R$ characteristics (an "S-shaped curve" that is a phenomenon of decrease in breakdown voltage in a large current area in which the breakdown voltage is lower than the static blocking breakdown voltage (BV$_{RRM}$)).

As illustrated in FIGS. 11 and 12, the secondary breakdown occurs in the $J_R$ vs $Y_R$ characteristics due to the following reasons. When the depletion layer in the diode structure extends toward the vertical-structure area 27D illustrated in FIG. 2 and withstands the breakdown voltage, the field intensity at the main junction (junction between the P anode layer 10 and the N$^-$ drift layer 14) increases.

As a result, impact ionization occurs in the main junction, and the high electric field in the N$^-$ drift layer 14 causes electrons created by the impact ionization to run through the N$^-$ drift layer 14 toward the cathode (direction toward the vertical-structure area 27D). Accordingly, the electrons are implanted into the N buffer layer 15. When the concentration of the electrons becomes higher than the carrier concentration in the N buffer layer 15, the field intensity at the cathode increases.

A consequence of increase in the field intensity not only in the main junction but also at the cathode causes secondary breakdown points as indicated by arrows PJ1 to PJ3 to appear. Consequently, the secondary breakdown occurs in the $J_R$ vs $Y_R$ characteristics, thus reducing the breakdown voltages.

This phenomenon apparently occurs in the diodes of the second type or the IGBTs with the PNP bipolar transistor structure. The inner portion of the secondary breakdown observed in the high-current density area with the $J_R$ vs $Y_R$ characteristics (a left portion of the characteristic curves including the characteristic curve L1H in the drawing) exhibits a possible blocking area in a turn-off operation for any devices including the IGBTs and the diodes.

As the voltage drop behavior after the secondary breakdown is smaller, the blocking capability will be more improved. Furthermore, as the secondary breakdown points PJ1 to PJ3 in FIG. 11 indicate higher current densities, it is more likely to expect increase in current density in which the diodes can be blocked and improved ruggedness in avalanche in a static state.

Thus, it is preferred to have the diodes of the second type with high performance by which the secondary breakdown observed in the high-current density area with the $J_R$ vs $Y_R$ characteristics as illustrated in FIGS. 11 and 12 is as small as possible and is intended to increase the current densities at the secondary breakdown points. In other words, the advantage of suppressing the secondary breakdown will be larger when as the parameters of the N buffer layer 15 the concentration slope δ is smaller and the depth is longer.

FIGS. 13 to 15, and FIG. 16 are graphs showing examples of waveforms of the diodes and the IGBTs, respectively, in turn-off operations in simulation.

Figure 13:
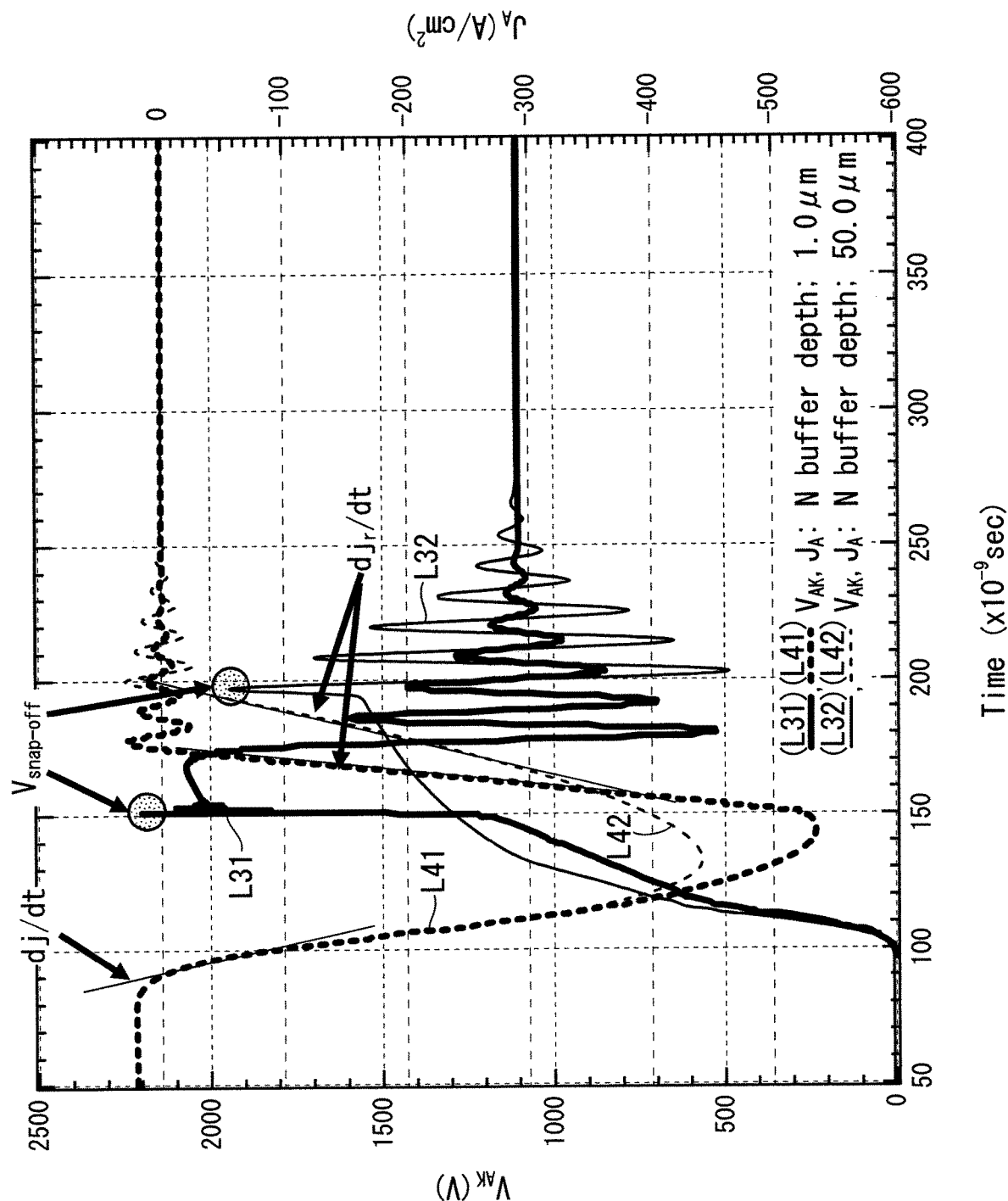
FIG. 13 is a graph showing an example of waveforms of turn-off operations of a diode in simulation.
Figure 14:
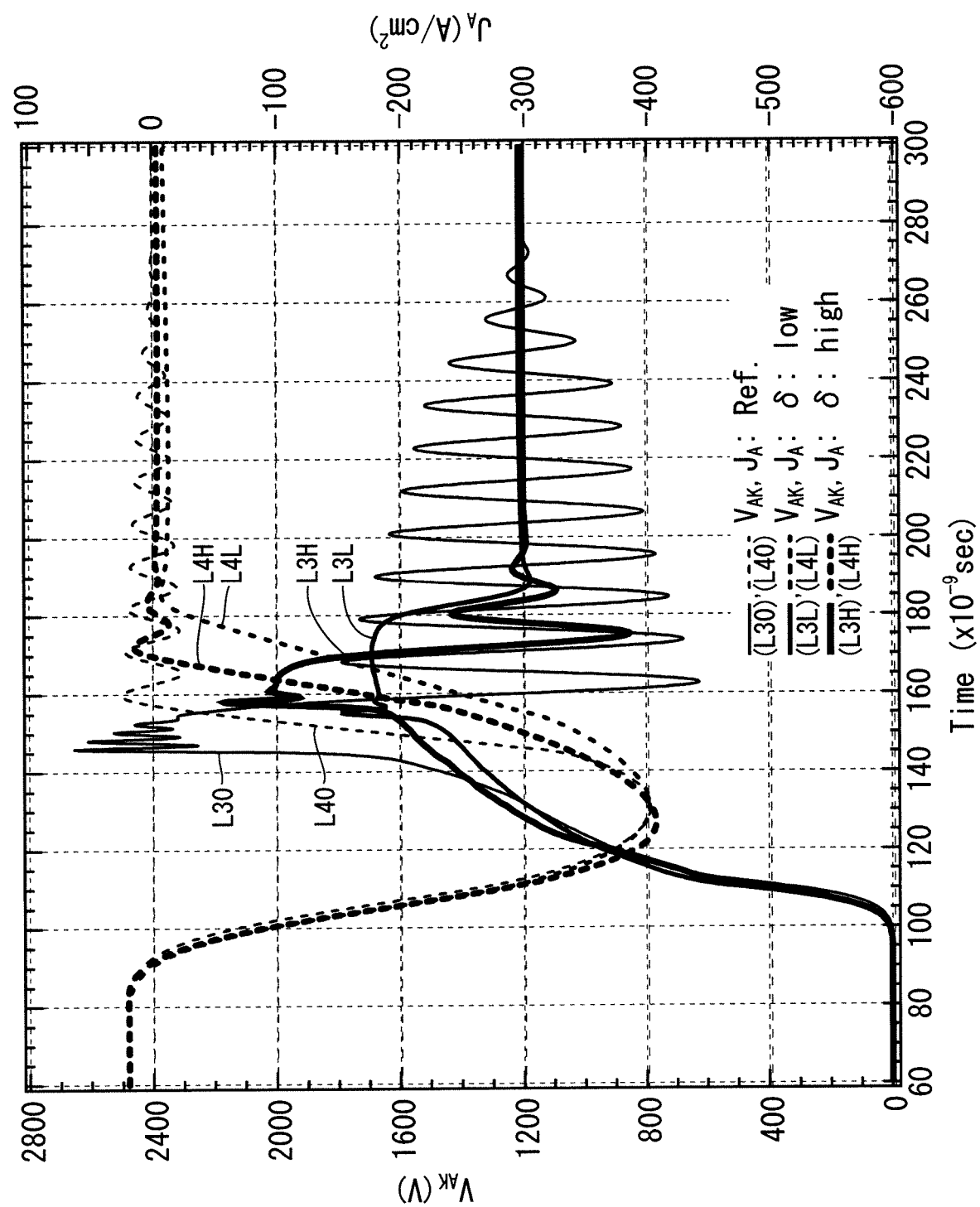
FIG. 14 is a graph showing an example of waveforms of turn-off operations of a diode in simulation.
Figure 15:
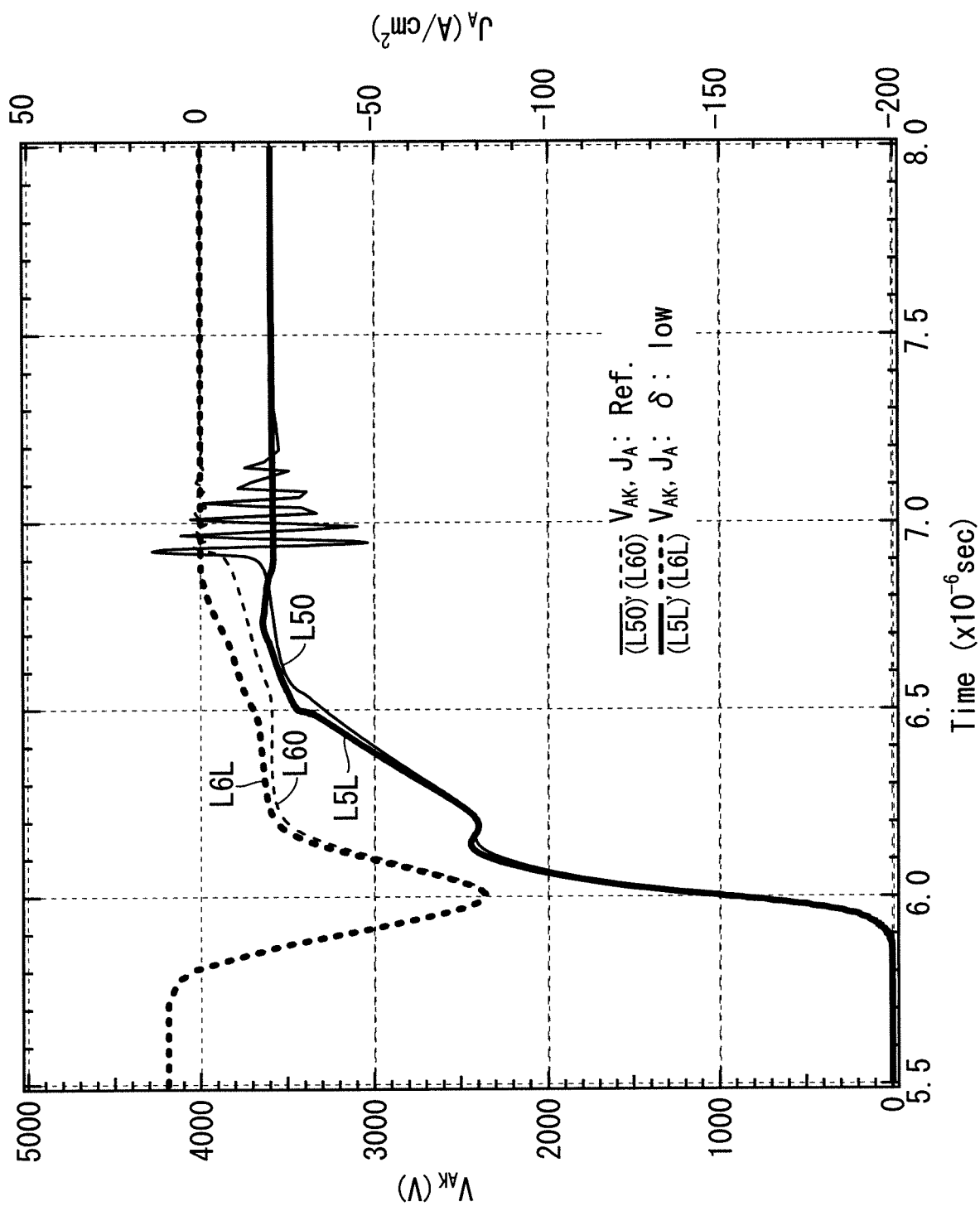
FIG. 15 is a graph showing an example of waveforms of turn-off operations of a diode in simulation.

FIGS. 13 and 14, and FIG. 15 indicate examples of the diodes that belong to a 1700 V breakdown-voltage class and a 4500 V breakdown-voltage class, respectively. FIG. 16 indicates examples of the IGBTs that belong to the 4500 V breakdown-voltage class. The structures of each of the IGBTs (of the first and second types) and the diodes are based on the device structure illustrated in FIGS. 10A-10C. FIG. 13 is based on the structure of the 1700 V diode of the first type illustrated in FIG. 10B. FIG. 14 is based on the structure of the 1700 V diode of the second type illustrated in FIG. 10C. FIG. 15 is based on a 4500 V diode of the second type.

In FIG. 13, voltage changes L31 and L32 are changes in anode-to-cathode voltage $V_{AK}$ (V), whereas current density changes L41 and L42 are (anode) current densities $J_A$ (A/cm$^2$), when the depth $t_{NB}$ of the N buffer layer 15 is 1.0 and 50.0 (μm), respectively.

In FIG. 14, a voltage change L30 indicates an anode-to-cathode voltage $V_{AK}$ of a conventional structure (impurity concentration), and voltage changes L3L and L3H are changes in anode-to-cathode voltage $V_{AK}$ (V) when the concentration slopes δ of the N buffer layer 15 are relatively lower and relatively higher, respectively. Furthermore, a current density change L40 indicates a current density $J_A$ of the conventional structure, and current density changes L4L and L4H indicate current densities $J_A$ when the concentration slopes δ are relatively lower and relatively higher, respectively.

In FIG. 15, a voltage change L50 indicates an anode-to-cathode voltage $V_{AK}$ of a conventional structure, and a voltage change L5L indicates change in anode-to-cathode voltage $V_{AK}$ (V) when the concentration slope δ of the N buffer layer 15 is relatively lower. Furthermore, a current density change L60 indicates a current density $J_A$ of the conventional structure, and a current density change L6L indicates a current density $J_A$ when the concentration slope δ is relatively lower.

In FIG. 16, a voltage change L70 indicates a collector-to-emitter voltage $V_{CE}$ (V) of a conventional structure, a voltage change L71 indicates a collector-to-emitter voltage $V_{CE}$ of a first aspect (the structure illustrated in FIG. 10A without an N auxiliary layer 29 to be described in Embodiment 2) when the concentration slope δ of the N buffer layer 15 is relatively lower. Furthermore, a voltage change L72 indicates a collector-to-emitter voltage $V_{CE}$ of a second aspect (for example, a structure with the N auxiliary layer 29 illustrated in FIG. 25 to be described later) when the concentration slope δ of the N buffer layer 15 is relatively lower. Furthermore, a current density change L80 indicates a current density $J_A$ (A/cm$^2$) of the conventional structure, and current density changes L81 and L82 indicate current densities $J_A$ of the first aspect and the second aspect, respectively when the concentration slope δ is relatively lower.

Furthermore, FIG. 13 illustrates snap recovery waveforms when the operating voltage Vcc is 1100 V, the current density $J_F$ is 20 A/cm² (0.1 $J_A$), dj/dt=4300 A/cm² μs, the stray inductance $L_S$ is 1.0 μH, and the operating temperature is 298 K as switching conditions.

FIG. 14 illustrates snap recovery waveforms when the operating voltage Vcc is 1200 V, the current density $J_F$ is 20 A/cm² (0.1 $J_A$), dj/dt=4200 A/cm² μs, $L_S$=1.0 μH, and the operating temperature is 298 K as switching conditions.

FIG. 15 illustrates snap recovery waveforms when the operating voltage Vcc is 3500 V, the current density $J_F$ is 9.6 A/cm² (0.1 $J_A$), $L_S$=2.0 μH, and the operating temperature is 298 K as switching conditions.

FIG. 16 illustrates turn-off waveforms when the operating voltage Vcc is 2800 V, the (collector) current density $J_C$ is 56 A/cm², $L_S$=2.48 μH, and the operating temperature is 398 K as switching conditions.

FIG. 13 illustrates the snap-off voltage $V_{snap\text{-}off}$ (overshoot voltage at recovery) that is a figure of merit at turn-off (recovery) of a diode, dj/dt (slope of a waveform of the current density $J_A$ at recovery), and $dj_r/dt$ (slope of a waveform of the current density $J_A$ t at the end of recovery). The smaller the value of the snap-off voltage $V_{snap\text{-}off}$ is, the superior the controllability of a turn-off operation of the diode is, which indicates an advantage of suppressing the snap-off phenomenon and the subsequent oscillation. The value of the snap-off voltage $V_{snap\text{-}off}$ is preferably lower than the static breakdown voltage ($BV_{RRM}$) as a guideline to prevent the device from breaking down by the snap-off phenomenon occurring at recovery of the diode. As the value dj/dt is larger, the recovery of the diode can be made faster and the ruggedness and a safe operating area (SOA) in a turn-off operation are larger.

The larger the value $dj_r/dt$ is, the higher the carrier plasma layer with a cathode area remaining in a turn-off operation as described in the object (i) of the present invention is, thus contributing to decrease in the snap-off voltage $V_{snap\text{-}off}$.

FIGS. 13 to 16 clarify that the conventional IGBTs and diodes have undergone the snap-off phenomenon and the subsequent oscillation in respective turn-off operations. Particularly, as illustrated in FIGS. 14, 15, and 16, it is presumable that the snap-off phenomenon significantly occurs in the conventional structure and increases the value of the snap-off voltage $V_{snap\text{-}off}$, which may worsen the controllability of a turn-off operation and cause noise in the device as a system to be included in a power module.

In contrast, as illustrated in FIGS. 13 to 16, the N buffer layer 15 having the concentration slope δ according to the present invention reduces the snap-off voltage $V_{snap\text{-}off}$ in the snap-off phenomenon or suppresses the snap-off phenomenon in the IGBTs and diodes belonging to any breakdown-voltage class. Thus, it is clear that the N buffer layer 15 according to Embodiment 1 improves the controllability of a turn-off operation. FIG. 13 clarifies that the longer the depth $t_{NB}$ of the N buffer layer 15 according to the present invention is, the larger the value $dj_r/dt$ is, and the more advantageous the reduction in the snap-off voltage $V_{snap\text{-}off}$ is.

Figure 17:
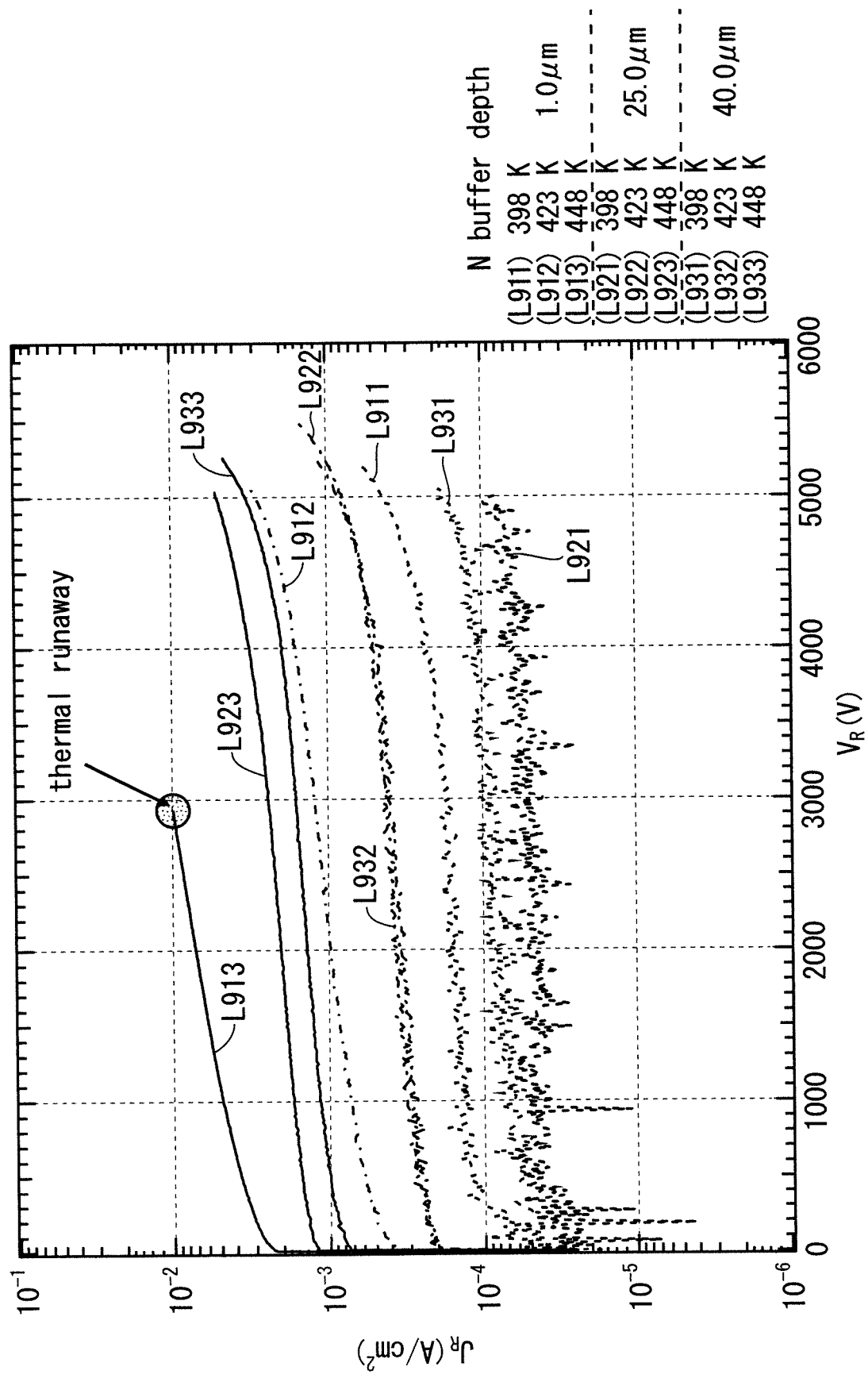
FIG. 17 is a graph showing the influence of the depth of the N buffer layer 15 in the diode of the second type according to Embodiment 1.

FIG. 17 is a graph showing the influence of the depth $t_{NB}$ of the N buffer layer 15 according to Embodiment 1 on the $J_R$ vs $V_R$ characteristics in a prototyped diode whose breakdown voltage is 4500 V (diode of the second type whose diode structure is illustrated in FIG. 10C).

In FIG. 17, current density changes L911, L912, and L913 indicate the $J_R$ vs $V_R$ characteristics when the depth $t_{NB}$ of the N buffer layer 15 is 1.0 μm and the operating temperatures are 398 K, 423 K, and 448 K, respectively. Current density changes L921, L922, and L923 indicate the current density $J_R$ when the depth $t_{NB}$ of the N buffer layer 15 is 25.0 μm and the operating temperatures are 398 K, 423 K, and 448 K, respectively. Current density changes L931, L932, and L933 indicate the $J_R$ vs $V_R$ characteristics when the depth $t_{NB}$ of the N buffer layer 15 is 40.0 μm and the operating temperatures are 398 K, 423 K, and 448 K, respectively. The horizontal axis of FIG. 17 indicates the reverse voltage $V_R$ (V).

Figure 18:
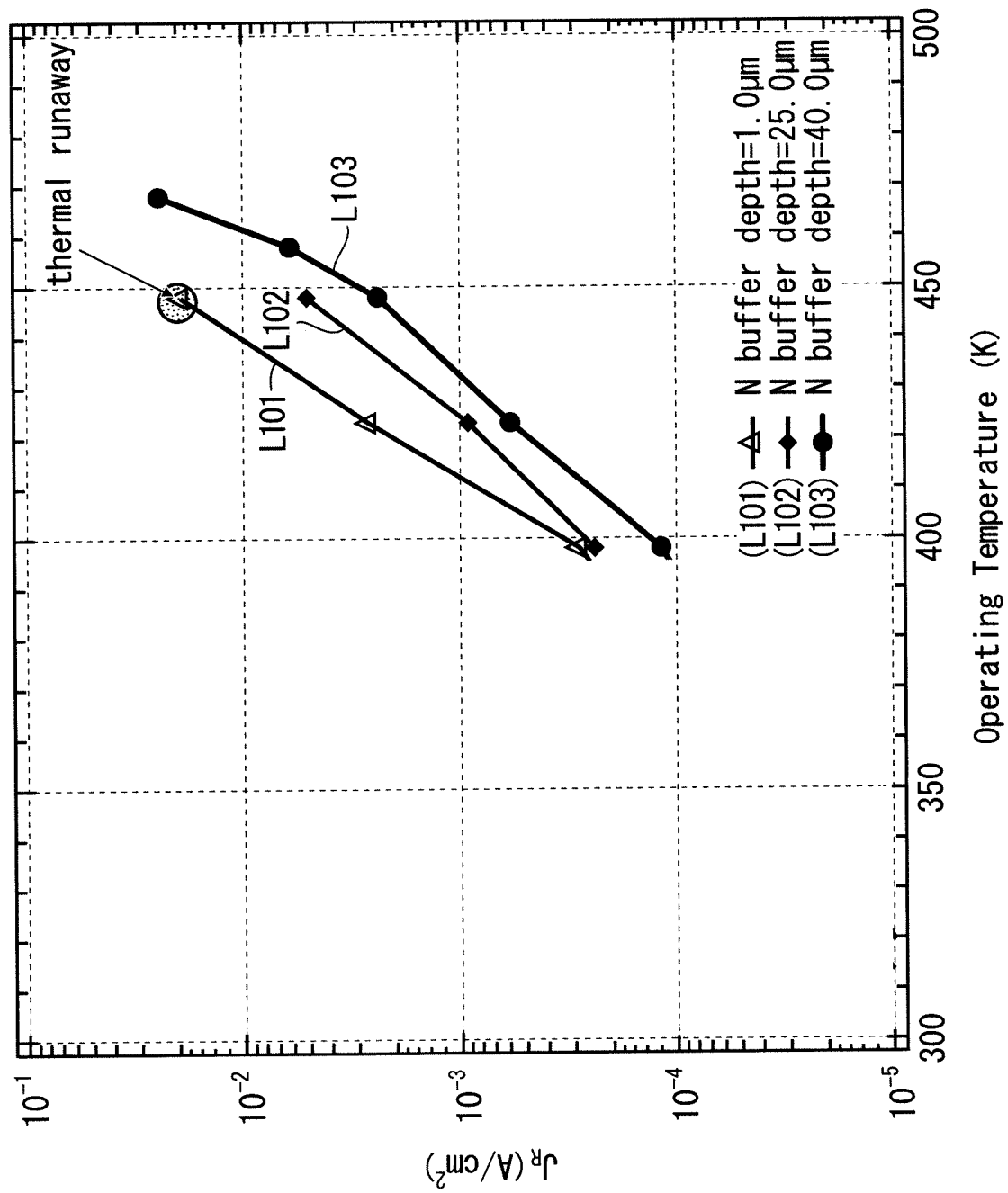
FIG. 18 is a graph showing relationships between the leakage current and the operating temperature in FIG. 17.

FIG. 18 is a graph showing relationships between the leakage current (A/cm²) and an operating temperature (K) when $V_R$=4500 V in FIG. 17. In FIG. 18, current density changes L101, L102, and L103 indicate the current density $J_R$ when the depths $t_{NB}$ of the N buffer layer 15 is 1.0, 25.0, and 40.0 (μm), respectively. The horizontal axis of FIG. 18 indicates the operating temperature (K).

As illustrated in FIGS. 17 and 18, the depth $t_{NB}$ of the N buffer layer 15 influences the leakage characteristics of the diodes. When the depth $t_{NB}$ is 1.0 μm and the operating temperature is 448 K, thermal runaway of the chip itself causes thermal breakdown. Thus, forming the N buffer layer 15 with the longer depths $t_{NB}$ allows reduction in leakage current at turn-off and in turn-off loss, and operations at high temperatures.

The reasons why the N buffer layer 15 influences the leakage current are because the diode of the second type illustrated in FIG. 10C is a PIN diode with which the PNP bipolar transistor (the P anode layer 10+the N⁻ drift layer 14 and the N buffer layer 15+the P cathode layer 18) is integrated in parallel and because the longer the depths $t_{NB}$ of the N buffer layer 15 is, the larger the base width of the PNP bipolar transistor is and the smaller the current amplification factor αpnp is. Thus, in consideration of deactivation of the integrated PNP bipolar transistor for performing high-temperature operations with the structure of the diode of the second type, the depth $t_{NB}$ of the N buffer layer 15 is important and preferably longer. The same holds true for the IGBT including the PNP bipolar transistor (FIG. 10A).

Figure 19:
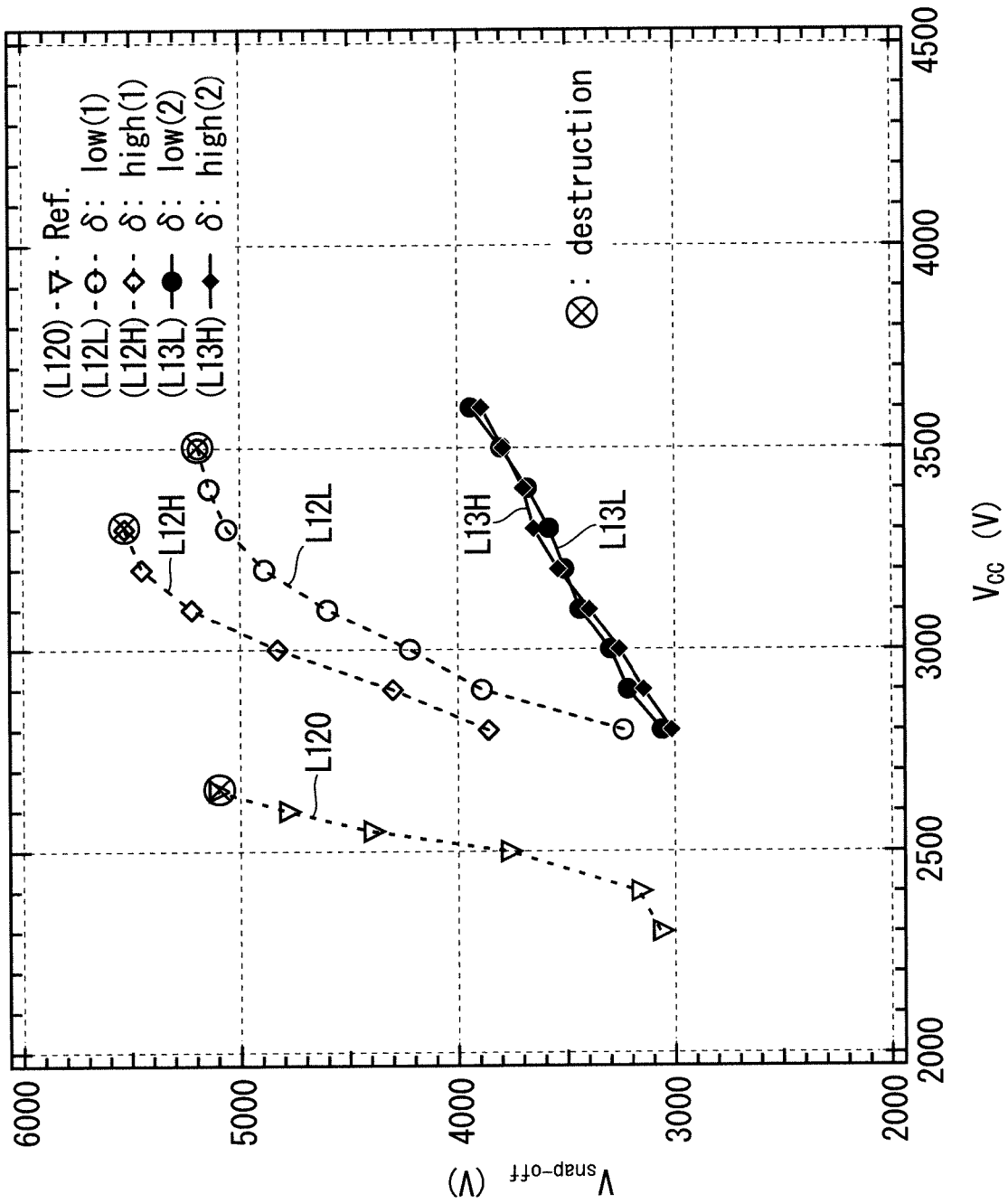
FIG. 19 is a graph showing relationships between a snap-off voltage and a power supply voltage at recovery of the diode of the second type.

FIG. 19 is a graph showing relationships between the snap-off voltage $V_{snap\text{-}off}$ (V) and a power supply voltage $V_{CC}$ (V) at recovery of a prototyped diode whose breakdown voltage is 4500 V (diode of the second type whose diode structure is illustrated in FIG. 10C). The vertical axis represents the snap-off voltage $V_{snap\text{-}off}$ at recovery in FIG. 13, and the horizontal axis represents $V_{CC}$.

In FIG. 19, a voltage change L120 indicates the snap-off voltage $V_{snap\text{-}off}$ in a conventional structure of the diode of the first type, and voltage changes L12L and L12H indicate the snap-off voltage $V_{snap\text{-}off}$ when the concentration slopes δ in the structure of the diode of the first type according to Embodiment 1 are relatively lower and relatively higher, respectively. Voltage changes L13L and L13H indicate the snap-off voltage $V_{snap\text{-}off}$ when the concentration slopes δ in the structure of the diode of the second type are relatively lower and relatively higher, respectively.

The encircled x in FIG. 19 indicates a destruction point of the device. As disclosed by, for example, Japanese Patent No. 5256357, the influence of the diodes of the first and second types on the behaviors relating to the snap-off voltage $V_{snap\text{-}off}$ vs $V_{CC}$ is the influence of the mechanism on the diode performance such as the electric field grading in which the field intensity at a cathode is graded.

The comparison between the conventional structure with the conventional N buffer layer 15 as indicated by the voltage change L120 and a sample including the N buffer layer 15 with the concentration slope δ according to Embodiment 1 as indicated by the voltage changes L12L, L12H, L13L, and L13H clarifies that the N buffer layer 15 according Embodiment 1 exhibits more reduction in the snap-off voltage $V_{snap-off}$ and improvement in the power supply voltage $V_{cc}$ thus leading to destruction, that is, improvement in the ruggedness.

In other words, as a result of indication of the effects (i) and (ii) of the N buffer layer 15 according Embodiment 1 as illustrated in FIGS. 6 to 9, the N buffer layer 15 demonstrates differences with the conventional voltage change L120 as illustrated in FIG. 19. Since the snap-off phenomenon at recovery is suppressed in the structure of the diode of the second type by the electric field grading effect produced in the vicinity of the junction between the N⁻ drift layer 14 and the N buffer layer 15 by implanting holes in the P cathode layer 18 at recovery, the effect subject to the difference of elevation in the concentration slope δ of the N buffer layer 15 is not observed in the structure of the diode of the second type to the same extent as that of the diode of the first type. However, the diode of the second type demonstrates the advantage of the N buffer layer 15 according to the present invention in view of the reduction in turn-off loss as illustrated in FIGS. 17 and 18.

Figure 20:
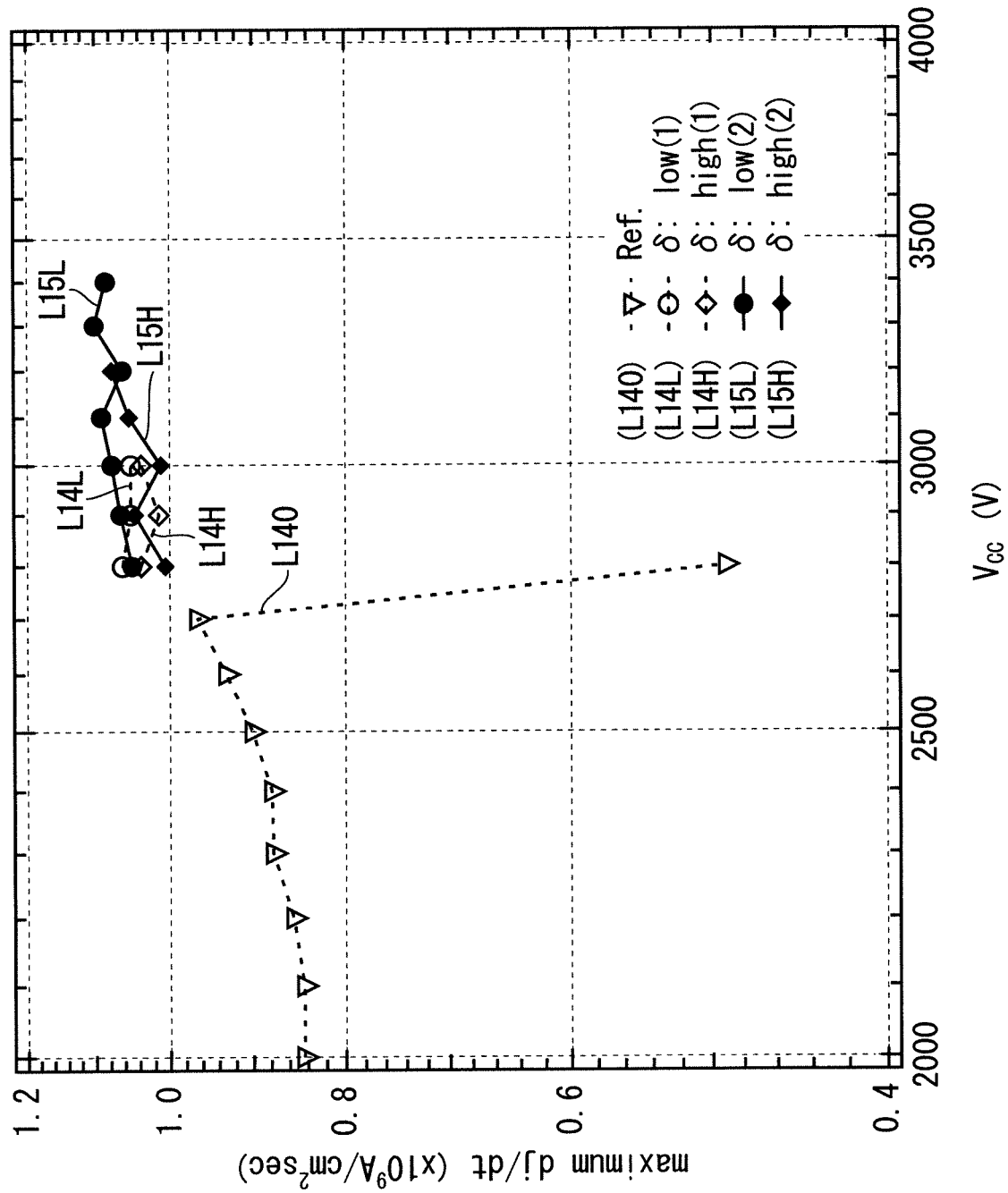
FIG. 20 is a graph showing a safe operation area at recovery of the diode of the second type.

FIG. 20 is a graph showing an SOA at recovery of a prototyped diode whose breakdown voltage is 4500 V (diode of the second type whose diode structure is illustrated in FIG. 10C). The vertical axis represents the maximum dj/dt ($\times 10^9$ A/cm² sec) that can be blocked at recovery as illustrated in FIG. 13, and the horizontal axis represents the power supply voltage $V_{cc}$ (V). The conditions at recovery in FIG. 20 are that the anode current IA is 150 A (2.2 times as high as the rated current $I_F$), the stray inductance $L_S$ is 2.0 H$\mu$H, and the operating temperature is 423 K.

In FIG. 20, a characteristic change L140 indicates the maximum dj/dt of the diode of the first type with the conventional structure, and characteristic changes L14L and L14H indicate the maximum dj/dt of the diode of the first type with the structure according to Embodiment 1 when the concentration slopes δ are relatively lower and relatively higher, respectively. Characteristic changes L15L and L15H indicate the maximum dj/dt when the concentration slopes δ of the diode of the second type are relatively lower and relatively higher, respectively.

The lower area of each of the change lines is an SOA at recovery. FIG. 20 clarifies that the SOA of the diode including the N buffer layer 15 according to Embodiment 1 is enlarged to an area where the power supply voltage $V_{cc}$ (V) is higher in evaluating the recovery characteristics more than that with the conventional N buffer layer 15.

Figure 21:
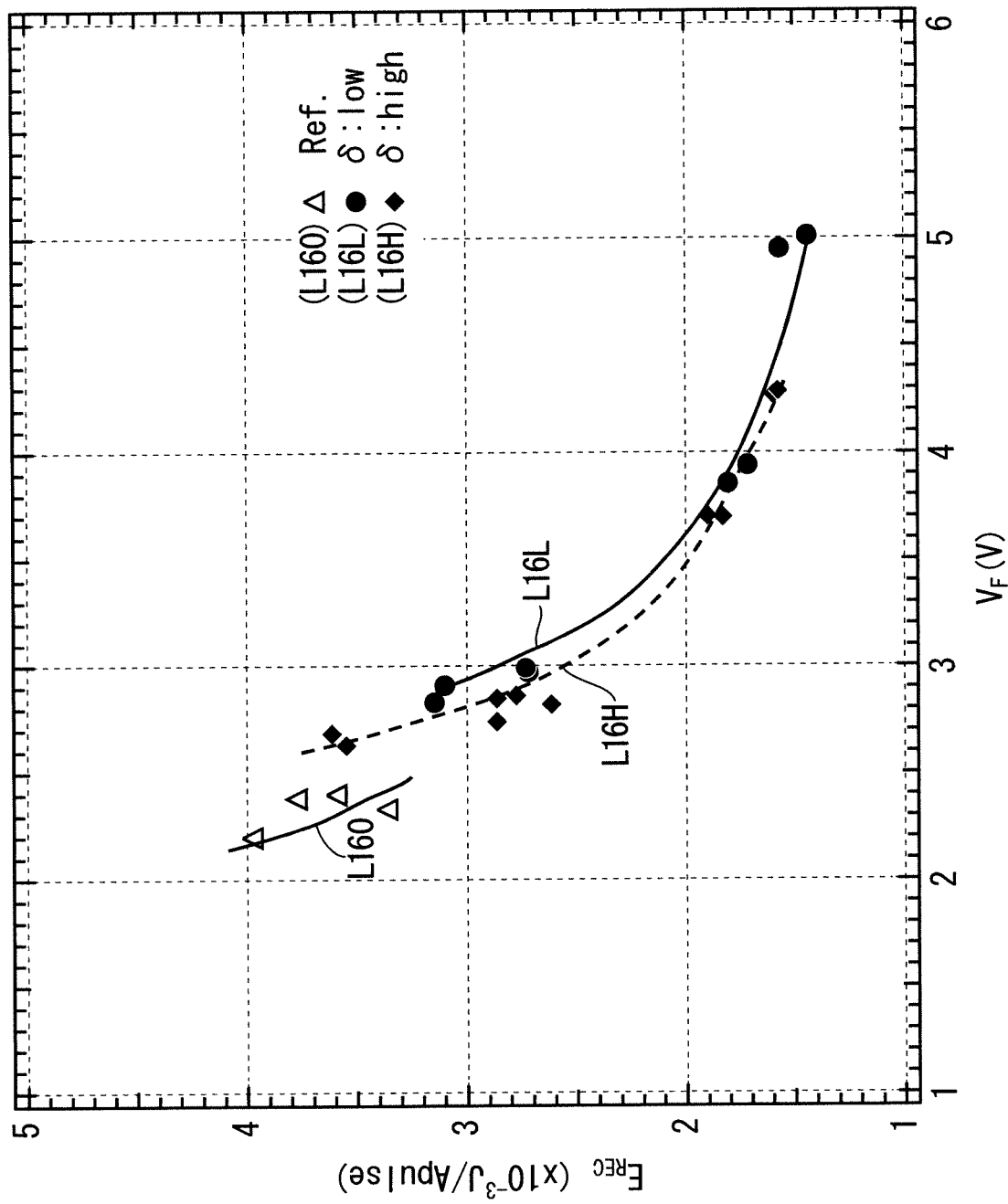
FIG. 21 is a graph showing trade-off characteristics between an ON voltage and loss at recovery of the diode of the second type.

FIG. 21 is a graph showing trade-off characteristics of a diode whose breakdown voltage is 4500 V (diode of the second type whose diode structure is illustrated in FIG. 10C), between the ON voltage $V_F$ (V) and loss (energy loss $E_{REC}$ ($\times 10^{-3}$ J/Apulse)) at recovery. The operating conditions are that the power supply voltage $V_{cc}$ is 2800 V, the current density $J_F$ is 95.6 A/cm², dj/dt=400 A/cm² μsec, $L_S$=2.0 μH, and the operating temperature is 398 K.

In FIG. 21, an energy loss change L160 indicates the energy loss $E_{REC}$ of the diode of the second type with the conventional structure, and energy loss changes L61L and L61H indicate the energy loss $E_{REC}$ of the diode of the second type with the structure according to Embodiment 1 when the concentration slopes δ are relatively lower and relatively higher, respectively.

As illustrated in FIG. 21, the characteristics of the diode of the second type are device characteristics that can be changed by controlling the carrier lifetime in the device (including the interface area R2 and the edge termination area R3) using a lifetime killer such as an electron beam, platinum, He, and protons. According to FIG. 21, the N buffer layer 15 of Embodiment 1 can change the trade-off characteristics between the ON voltage $V_F$ and the energy loss $E_{REC}$ larger and suppress the energy loss $E_{REC}$ lower with the higher ON voltage $V_F$ than by the N buffer layer 15 with the conventional structure.

The bipolar power semiconductor elements such as the IGBTs and diodes mainly feature, with the same device structure, the controllability of the trade-off characteristics between the ON voltage and the turn-off loss. In other words, FIG. 21 clarifies that the N buffer layer 15 according to Embodiment 1 can achieve a larger movable range on control of the trade-off characteristics, which is a significant feature of the power semiconductor elements, than by the N buffer layer 15 with the conventional structure.

Figure 22:
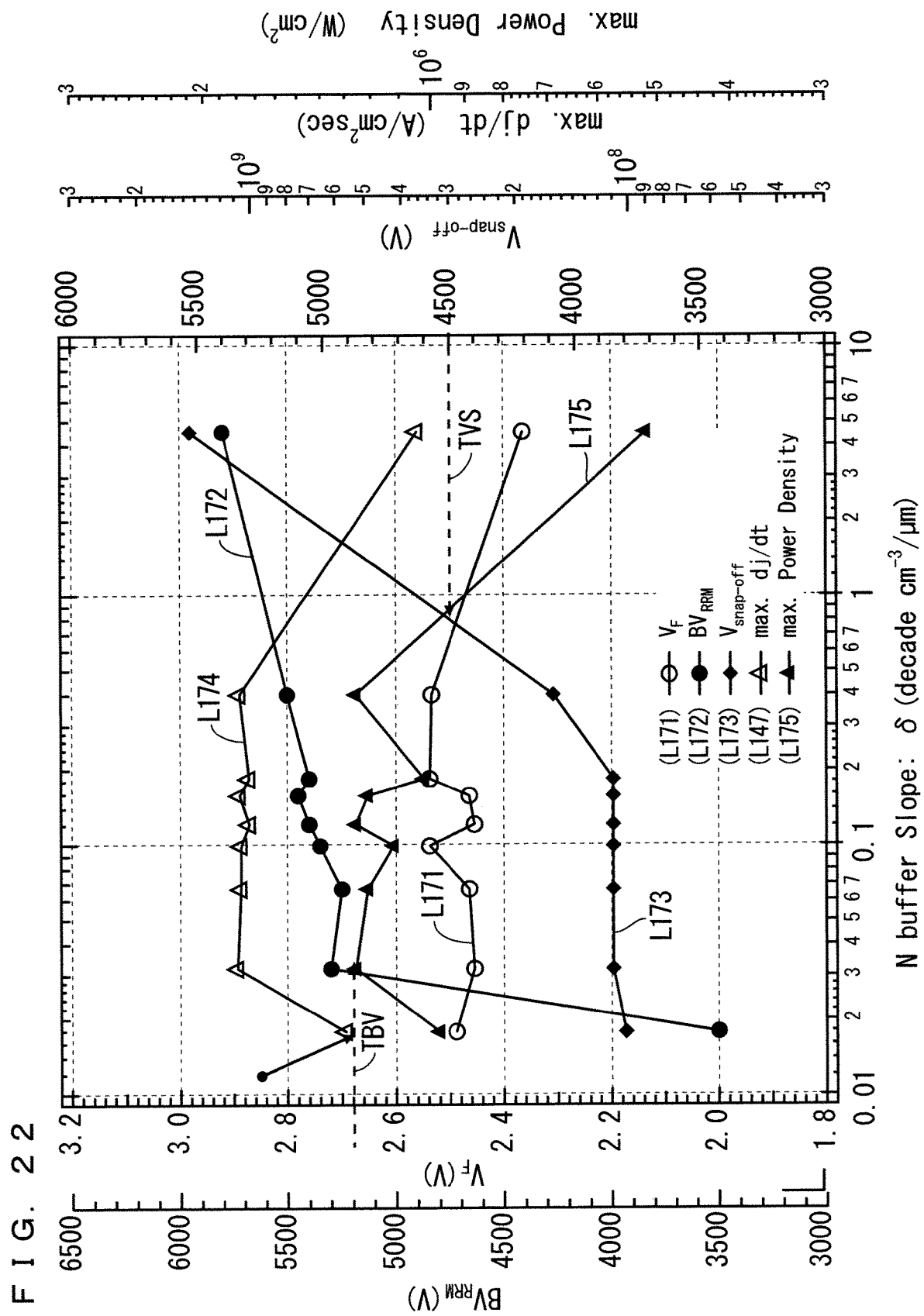
FIG. 22 is a graph showing relationships between the concentration slope δ and device characteristics of the diode of the second type on the depth of the N buffer layer.
Figure 23:
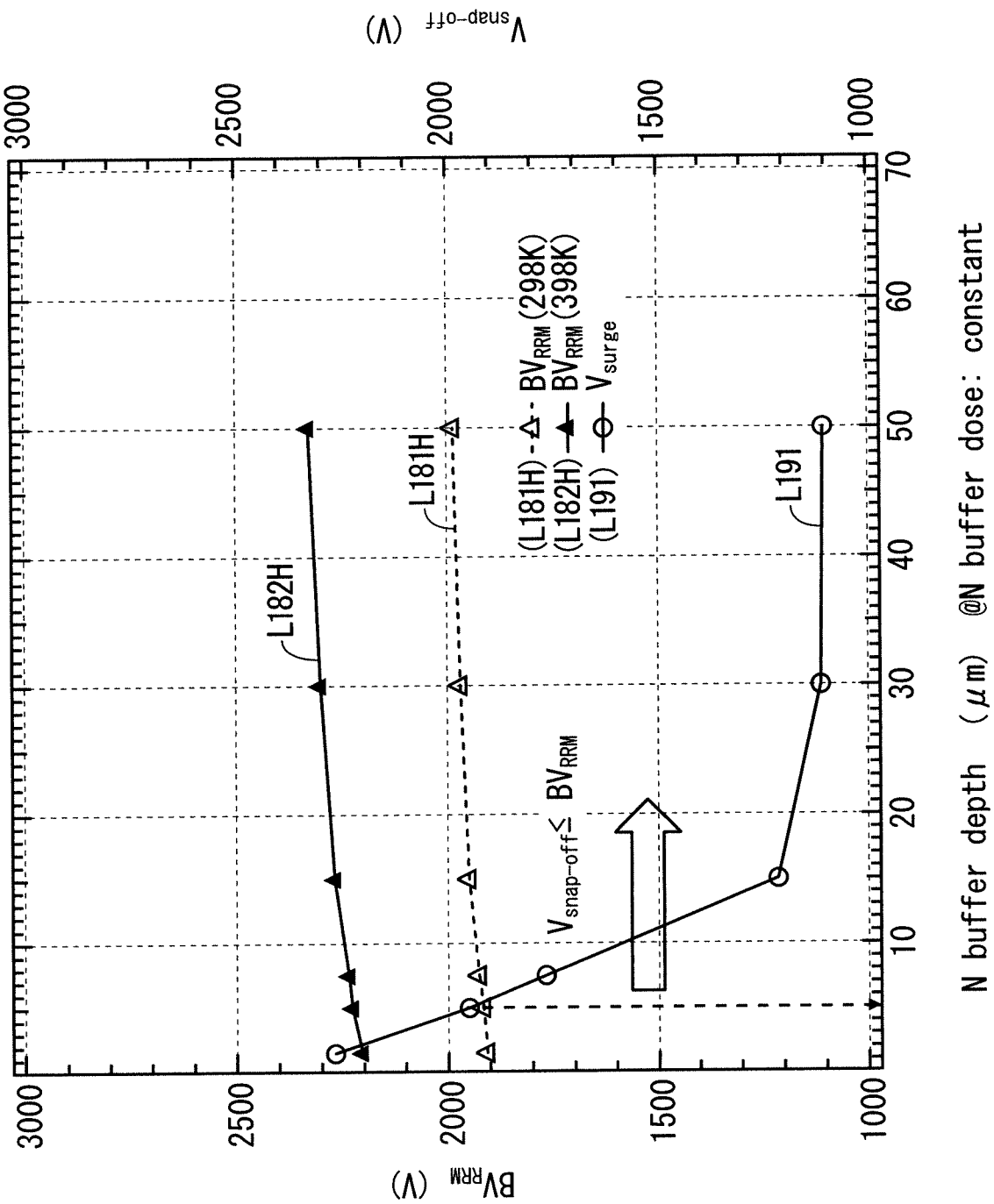
FIG. 23 is a graph showing relationships between the concentration slope δ and device characteristics of the diode of the second type on the depth of the N buffer layer.
Figure 24:
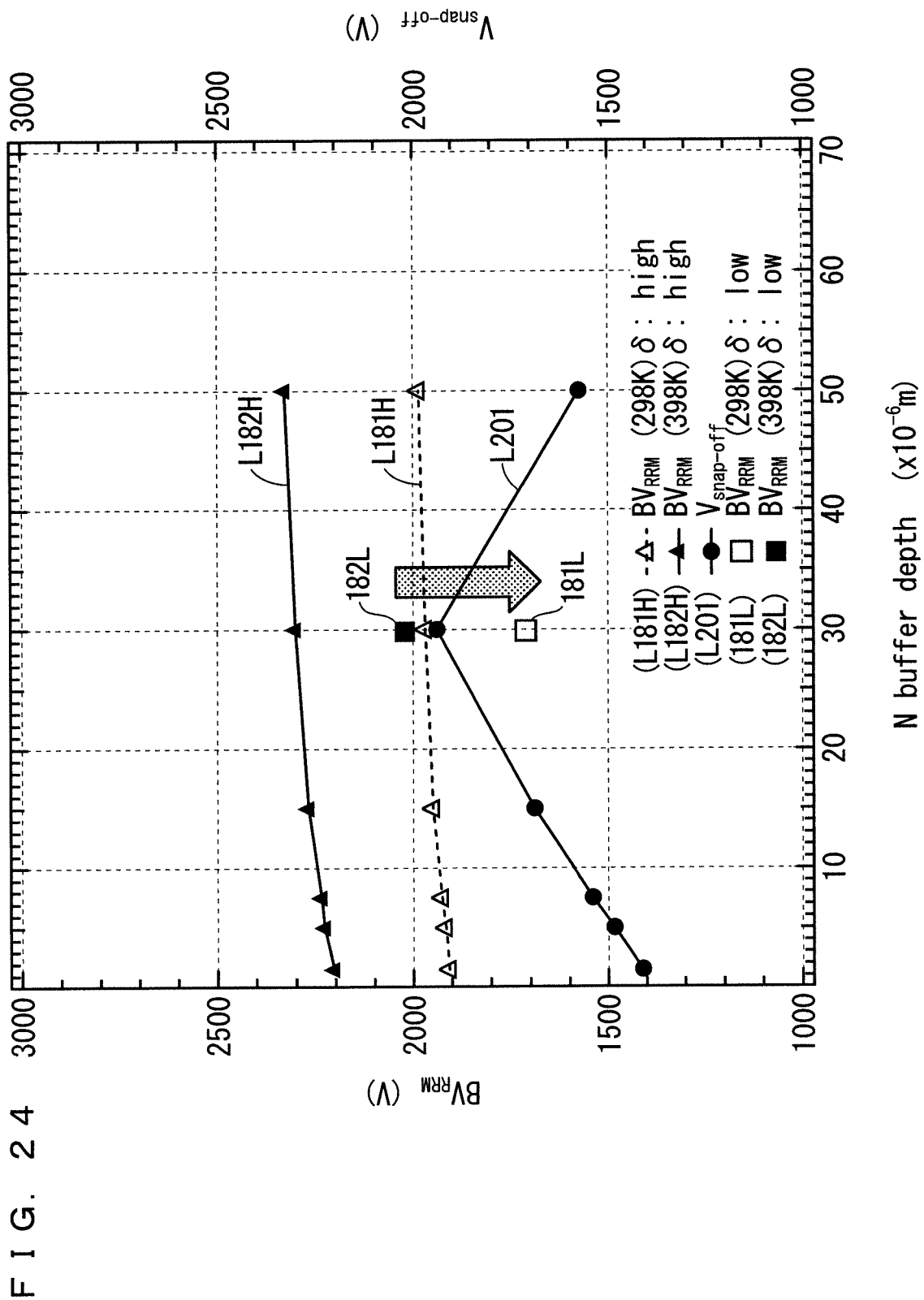
FIG. 24 is a graph showing a relationship between the concentration slope δ and device characteristics of the diode of the second type on the depth of the N buffer layer.
Figure 26:
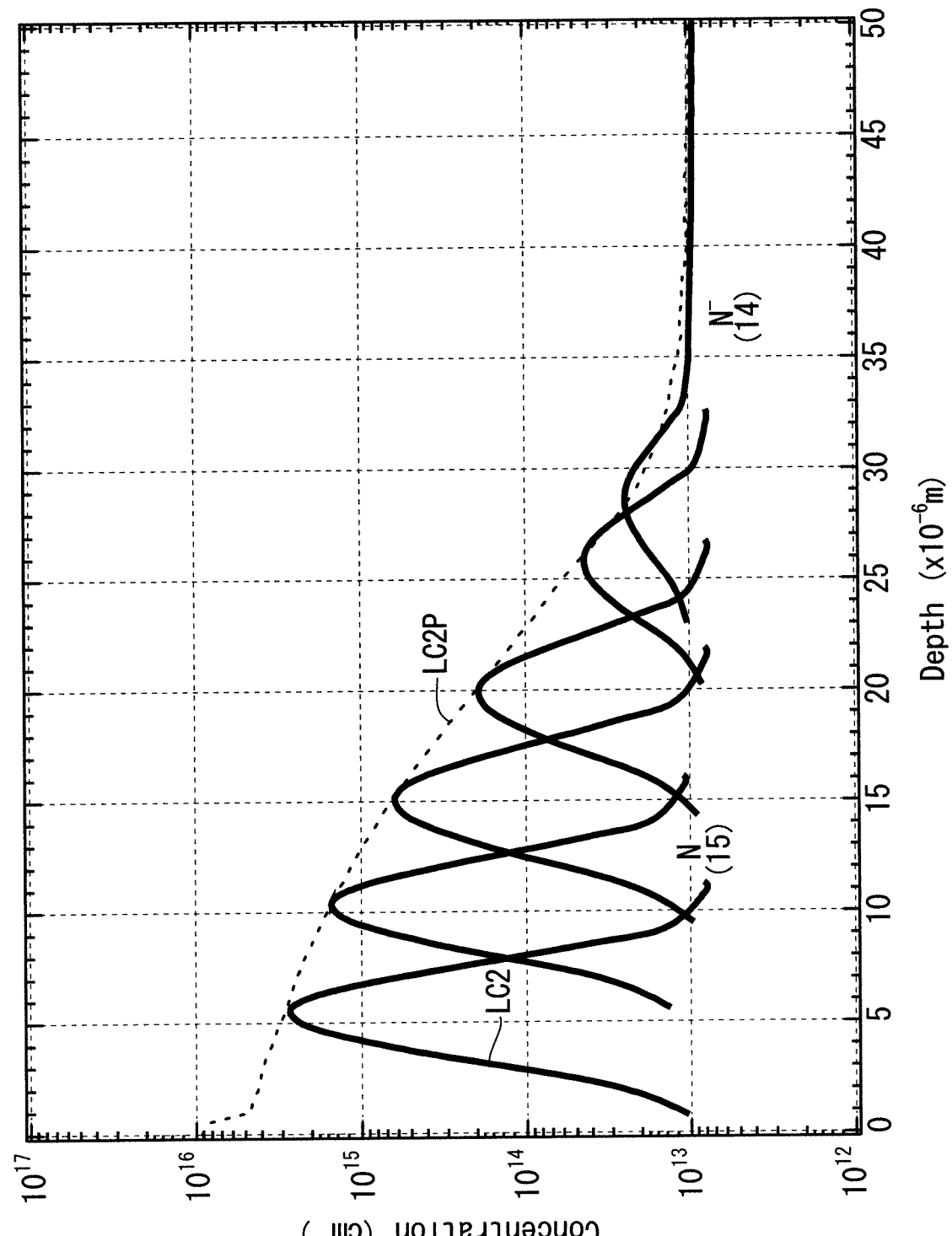
FIG. 26 is a graph showing an impurity profile of the N buffer layer according to a second aspect in Embodiment 2.

FIGS. 22 to 24 are graphs showing relationships between device characteristics of the diode of the second type illustrated in of FIG. 10C and the concentration slope δ in a main portion of the N buffer layer 15 and the depth $t_{NB}$ of the N buffer layer 15 that are two parameters of the characteristics of the N buffer layer 15 according to Embodiment 1.

In FIG. 22, an ON voltage change L171 indicates change in the ON voltage $V_F$ (V) when the current density $J_F$ is 95.6 A/cm² and the operating temperature is 398 K. A breakdown voltage change L172 indicates the blocking voltage ($BV_{RRM}$) when the operating temperature is 298 K. A snap-off voltage change L173 indicates change in the snap-off voltages $V_{snap-off}$ (V) when the power supply voltage $V_{CC}$ is 3600 V, the anode current $I_A$ is 7 A (0.1 times as high as the rated current $I_F$), the value dj/dt is 590 A/cm² μs, the stray inductance $L_S$ is 2.0 H$_R$H, and the operating temperature is 298 K. A maximum current density change L174 indicates a maximum value dj/dt (A/cm² sec) when the anode current $I_A$ is 150 A (2.2 times as high as the rated current $I_F$, the current density 214.3 A/cm²), $L_S$=2.0 H$_R$H, and the operating temperature is 423 K. A maximum power density change L175 indicates a maximum power density change (max. Power Density) (W/cm²) when the anode current $I_A$ is 150 A (2.2 times as high as the rated current $I_F$), $L_S$=2.0 H$_R$H, and the operating temperature is 423 K.

In FIGS. 23 and 24, breakdown voltage changes L181H and L182H indicate change in the blocking voltage $BV_{RRM}$ (V) when the concentration slope δ of the N buffer layer 15 is set relatively high and the operating temperatures are 298 K and 398 K, respectively. In FIG. 23, a snap-off voltage change L191 indicates change in the snap-off voltages $V_{snap-off}$ (V) when the power supply voltage $V_{CC}$ is 1100 V, the current density $I_F$ is 200 A/cm², the value dj/dt is 1540 A/cm² μs, $L_S$=5.0 H$_R$H, and the operating temperature is 398 K.

In FIG. 24, breakdown voltage changes L181L and L182L indicate change in the blocking voltage $BV_{RRM}$(V) when the concentration slope δ of the N buffer layer 15 is set relatively low and the operating temperatures are 298 K and 398 K, respectively. Furthermore, a snap-off voltage change L201 indicates change in the snap-off voltages $V_{snap-off}$ (V) when the power supply voltage $V_{CC}$ is 1100 V, the current density $I_F$ is 20 A/cm² (0.1 $J_A$), the value dj/dt is 4300 A/cm² μs, $L_S$=1.0 H$_R$H, and the operating temperature is 298 K.

FIG. 22 indicates a result of the prototype belonging to a 4500 V breakdown-voltage class, whereas FIGS. 23 and 24 indicate the results in simulation. The diode structure is based on the structure of the diode of the second type illustrated in FIG. 10C. The target breakdown voltage of 5200 V (standard breakdown voltage TBV) with the blocking voltage $BV_{RRM}$ (V) (operating temperature 298 K) in FIG. 22 is a value calculated on the basis of the dependency of the blocking voltage $BV_{RRM}$ on the temperature to withstand the breakdown voltage of 4500 V guaranteed at the operating temperature 213 K for the 4500 V breakdown-voltage class.

According to FIG. 22, the concentration slope δ of the N buffer layer 15 needs to be 0.03 to 0.7 (decade cm$^{-3}$/μm) when the depth is constant. When the concentration slope δ of the N buffer layer 15 is too small, the depletion layer extends across the N buffer layer 15 and punches through the P cathode layer 18 and causes reduction in the breakdown voltage when the breakdown voltage is withstood in a static state. Here, the decade means $\log_{10}$.

Furthermore, the minimum value (0.03) of the concentration slope δ is set to satisfy the target breakdown voltage ($BV_{RRM} \geq TBV$). Furthermore, when the concentration slope δ of the N buffer layer 15 is too large, electrons and holes forming the remaining carrier plasma layer at the cathode in a turn-off operation in a dynamic state disappear earlier, and the depletion layer does not smoothly extend inside the N buffer layer 15, which causes increase in voltage at the snap-off phenomenon and reduction in controllability of the turn-off operation.

In FIG. 22, the maximum value of the snap-off voltage $V_{snap-off}$ is set to 4500 V that is a rated breakdown voltage (standard breakdown voltage TVS) for the 4500 V breakdown-voltage class. The maximum value (0.7) of the concentration slope δ needs to be set so that the maximum value of the snap-off voltage $V_{snap-off}$ is lower than 4500 V.

Thus, the concentration slope δ defined by Equation (1) has the appropriate tolerance according to the device performance. In other words, according to the technical problems to be solved by the present invention and the device performance to be achieved, an area where all the diode performance does not depend on the concentration slope δ of the N buffer layer 15 is defined as a setting range of the concentration slope δ with reference to FIG. 22.

As described above, the tolerance of the concentration slope δ needs to satisfy a concentration slope condition defined by {0.03≤δ≤0.7 (decade cm$^{-3}$/μm)}, and preferably satisfies the optimal concentration slope condition defined by {0.03≤δ≤0.2 (decade cm$^{-3}$/μm)} in consideration of no degradation in the other electrical characteristics (L171, L172, L175).

Since in the main portion of the N buffer layer 15, the concentration slope δ defined by Equation (1) in a direction from the top surface to the undersurface of the semiconductor body (the N$^-$ drift layer 14 and the N buffer layer 15) whose main constituent element is the N$^-$ drift layer 14 satisfies the concentration slope condition, the semiconductor device according to Embodiment 1 produces the advantages of providing stable breakdown voltage characteristics, reducing turn-off loss with reduction in the leakage current at turn-off, and improving the controllability of a turn-off operation and the blocking capability at turn-off.

Hereinafter, the IGBT and the diodes of the first and second types will be specifically described in association with each other.

As illustrated in FIG. 1 and FIG. 10A, an insulated-gate transistor forming area of n-type (the N$^+$ emitter layer 7, the P base layer 9, the N layer 11, the gate insulating film 12, and the embedded gate electrodes 13) is formed in the upper layer portion of the N$^-$ drift layer 14 within the active cell area R1 that is an element forming area. Then, the transistor forming area, the N buffer layer 15, the P collector layer 16, the emitter electrode 5E, and the collector electrode 23C form an IGBT. As such, the semiconductor device including the IGBT can produce the advantages.

Furthermore, as illustrated in FIG. 2 and FIG. 10B, the P anode layer 10 that is one electrode area is formed in the upper layer portion of the N$^-$ drift layer 14 within the active cell area R1. Then, the P anode layer 10, the N buffer layer 15, the N$^+$ cathode layer 17, the anode electrode 5A, and the cathode electrode 23K form a diode of the first type. As such, the semiconductor device including the diode of the first type can produce the advantages.

Furthermore, as illustrated in FIG. 2 and FIG. 10C, the P anode layer 10 that is one electrode area is formed in the upper layer portion of the N$^-$ drift layer 14 within the active cell area R1. Then, the P anode layer 10, the N buffer layer 15, the P cathode layer 18, the N$^+$ cathode layer 19 (another electrode area), the anode electrode 5A, and the cathode electrode 23K form a diode of the second type. As such, the semiconductor device including the diode of the second type can produce the advantages.

The semiconductor device according to Embodiment 1 can further obtain more favorable electrical characteristics by satisfying the optimal concentration slope condition.

The reduction in turn-off loss that is the advantage herein can further reduce the weight and save energy of the semiconductor device including a cooling system according to Embodiment 1 by simplifying the cooling system. Furthermore, the improvement in blocking capability at turn-off that is also the advantage herein can downsize the semiconductor device to such an extent that the current density allowing a current to pass through the power semiconductor element can increase. As a result, the packaging of the device can also be reduced and downsized.

Furthermore, the stable breakdown voltage characteristics and the improvement in blocking capability at turn-off that are the advantages of the semiconductor device according to Embodiment 1 can prolong the life of the semiconductor device.

In addition, the stable breakdown voltage characteristics and the improvement in controllability of a turn-off operation and in blocking capability at turn-off that are the advantages of the semiconductor device according to Embodiment 1 can improve yields of the semiconductor device.

FIG. 23 clarifies that it is preferred that the depth $t_{NB}$ of the N buffer layer 15 is longer than or equal to 4.0 μm when the concentration slope δ of the N buffer layer 15 is constant to satisfy the target breakdown voltage ($V_{snap-off} \leq BV_{RRM}$).

In other words, the N buffer layer 15 with the concentration slope δ according to Embodiment 1 needs the depth $t_{NB}$ that is longer than or equal to 4.0 μm so that the snap-off voltage $V_{snap-off}$ should be lower than a static breakdown voltage ($BV_{RRM}$) according to FIG. 23.

FIG. 24 clarifies that it is preferred to set the concentration slope δ of the N buffer layer 15 according to Embodiment 1 relatively smaller to reduce the snap-off voltage $V_{snap-off}$ at recovery while guaranteeing almost the same breakdown voltage $BV_{RRM}$ and to improve the controllability of a turn-off operation.

Furthermore, when the depth $t_{NB}$ of the N buffer layer 15 according to Embodiment 1 is too long, the concentration of the remaining carrier plasma layer becomes higher, which induces the turn-off loss subject to increase in tail current at the end of the respective turn-off operations of the IGBT and the diodes and causes a reaction of increase in total loss. The tolerance of the depth $t_{NB}$ at which no such reaction occurs or the tolerance in consideration of the manufacturing techniques is 50 μm.

As described above, the semiconductor device according to Embodiment 1 achieves the stable breakdown voltage characteristics, reduction in turn-off loss with reduction in the leakage current at turn-off, the operations at high temperatures, and improvement in the controllability of a turn-off operation and in the blocking capability at turn-off, by satisfying a depth forming condition of the depth $t_{NB}$ of the N buffer layer 15 (a distance from the interface between the N⁻ drift layer 14 and the N buffer layer 15 to a junction surface between the collector electrode 23C (cathode electrode 23K) and the P collector layer 16 (including the N⁺ cathode layer 17, the P cathode layer 18 and the N⁺ cathode layer 19)) that is defined by {4.0≤JD≤50.0 (μm)}.

FIGS. 22 to 24 are the results of the diode of the second type illustrated in FIG. 10C. The similar results exist in the relationship between the performance of the IGBT and the diode of the first type illustrated in FIG. 10A and FIG. 10B, respectively, and the concentration slope δ of the N buffer layer 15.

As described above, the N buffer layer 15 according to Embodiment 1 having the characteristics of the impurity profile DP1 as illustrated in FIGS. 4 and 5 represents a technique that can provide the stable breakdown voltage characteristics, reduce the turn-off loss with reduction in the leakage current at turn-off, guarantee the operations at high temperatures by controlling the thermal runaway, improve the controllability of a turn-off operation, and significantly improve the blocking capability at turn-off, which are the technical objects to be solved by the present invention.

Embodiment 2

The structural technique of the N buffer layer 15 according to Embodiment 2 that will yield the same advantages as those according to Embodiment 1 will be described.

FIGS. 25 to 31 are graphs each showing an impurity (concentration) profile of the N buffer layer 15 according to first to seventh aspects in Embodiment 2, respectively. These first to seventh aspects produce the advantages to the device characteristics similar to or more than those according to Embodiment 1 when the impurity profiles of the N buffer layer 15 according to Embodiment 1 illustrated in FIGS. 4 and 5 are set.

The point of 0 μm in the horizontal axis of FIGS. 25 to 31 indicates the undersurfaces of the P collector layer 16, the N⁺ cathode layer 17 (19), and the P cathode layer 18 in FIGS. 10A-10C. Furthermore, the vertical axis in FIGS. 25 to 31 represents an impurity concentration indicated by a common logarithm.

The first aspect illustrated in FIG. 25 is characterized by further including, in addition to the N buffer layer 15 according to Embodiment 1, the N auxiliary layer 29 (buffer auxiliary layer) higher in peak concentration than the N buffer layer 15 that is provided between the N buffer layer 15 and the P collector layer 16 in FIG. 10A, between the N buffer layer 15 and the N⁺ cathode layer 17 in FIG. 10B, or between the N buffer layer 15 and the P cathode layer 18 and the N⁺ cathode layer 19 in FIG. 10C. In other words, the N auxiliary layer 29 is formed under and adjacent to the N buffer layer 15, and the collector electrode 23C (cathode electrode 23K) is formed below the N auxiliary layer 29 through the P collector layer 16 (the N⁺ cathode layer 17, or the P cathode layer 18 and the N⁺ cathode layer 19). In this Description, the semiconductor body includes the N auxiliary layer 29 besides the N⁻ drift layer 14 and the N buffer layer 15.

The N auxiliary layer 29 according to the first aspect functions as preventing the depletion layer from extending toward the N buffer layer 15 when the breakdown voltage is held in a static state or during a dynamic state, and from reaching the P collector layer 16 or the P cathode layer 18 to avoid the punch-through.

Here, a junction between the N⁺ cathode layer 17 (19) and the N auxiliary layer 29 and a junction between the N auxiliary layer 29 and the N buffer layer 15 of the diodes of the first and second types are defined by the relationship between the impurity concentration and the depth indicated by the common logarithm in FIG. 25 as follows.

The junction between the N⁺ cathode layer 17 (19) and the N auxiliary layer 29 is at a point at which the impurity concentration profile slope from the N⁺ cathode layer 17 changes from a negative to a positive (for example, a point J0 at which the tangent changes from diagonally right to diagonally left as illustrated in FIG. 25).

The junction between the N auxiliary layer 29 and the N buffer layer 15 is at a point at which the impurity concentration profile slope from the N auxiliary layer 29 changes from a negative to a positive (for example, a point J1 at which the tangent changes from diagonally right to diagonally left as illustrated in FIG. 25).

Figure 32:
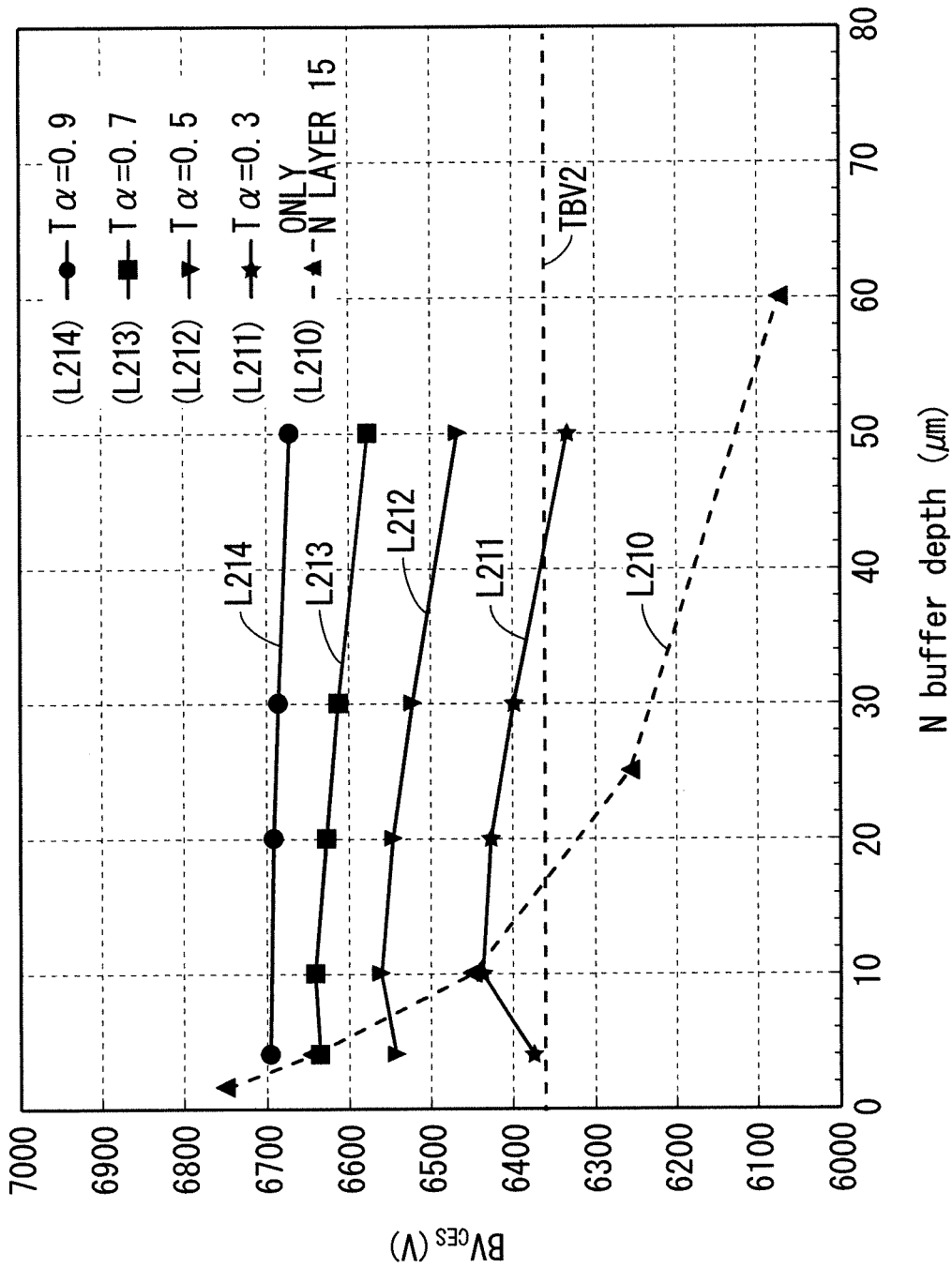
FIG. 32 is a graph showing the influence of a dose rate Tα in an IGBT structure.

FIG. 32 is a graph showing a result of considering, in simulation, the influence of a parameter of a rate (α) of an amount of impurities to be implanted to the N auxiliary layer 29 to the total amount of impurities to be implanted to the N buffer layer 15 and the N auxiliary layer 29 in the IGBT structure illustrated in FIG. 10A, on a relationship between the breakdown voltage (BV$_{CES}$)(V) and the depth $t_{NB}$ (μm) of the N buffer layer 15 at 398 K when the device belongs to the 4500 V breakdown-voltage class.

Here, the dose rate Tα of the N auxiliary layer 29 is defined by the following Equation (2), where Dose•NB1 denotes a dose (/cm²) that is an amount of n-type impurities to be implanted to the N buffer layer 15 and Dose•NB2 denotes a dose (/cm²) that is an amount of n-type impurities to be implanted to the N auxiliary layer 29.

[Math 3]

$$T\alpha = \frac{\text{Dose} \cdot NB2}{\text{Dose} \cdot NB1 + \text{Dose} \cdot NB2} \quad (2)$$

In FIG. 32, a breakdown voltage change L210 indicates the breakdown voltage BV$_{CES}$ without the N auxiliary layer 29, and breakdown voltage changes L211, L212, L213, and L214 indicate the change of the breakdown voltages BV$_{CES}$ when the dose rates Tα are 0.3, 0.5, 0.7, and 0.9, respectively. In the breakdown voltage change L210, the dose is set to the total implant dose of the N buffer layer 15 and the N auxiliary layer 29.

The relationship with the depth $t_{NB}$ (N buffer depth) of the N buffer layer 15 in FIG. 32 shows that the N auxiliary layer 29 produces an effect of improving the breakdown voltage holding capability more than that solely with the N buffer layer 15.

Furthermore, the dose rate Tα that is a rate of the amount of impurities to be implanted to the N auxiliary layer 29 to the total amount of impurities to be implanted to the N buffer layer 15 and the N auxiliary layer 29 is preferably set larger than or equal to 0.3 and smaller than 1 so as to exceed a standard breakdown voltage TBV2 at any of the depth $t_{NB}$ of the N buffer layer 15 in consideration of guaranteeing the breakdown voltage holding capability.

As such, satisfying an impurity implantation rate condition defined by the dose rate Tα {0.3≤Tα<1} of Equation (2)

expressing the impurity implantation rate can yield favorable breakdown voltage characteristics according to the first aspect in Embodiment 2.

Furthermore, the depth $t_{NB}$ of the N buffer layer 15 needs to be larger than or equal to 2.0 μm. The breakdown voltage $BV_{CES}$ is set higher than or equal to 6350 V (operating temperature 398 K) as the standard breakdown voltage TBV2 to be guaranteed herein, on the basis of the dependency of the breakdown voltage $BV_{CES}$ on the temperature to withstand the breakdown voltage of 4500 V guaranteed at the operating temperature 213 K for the 4500 V breakdown-voltage class.

Furthermore, since the reaction occurs when the depth $t_{NB}$ of the N buffer layer 15 according to Embodiment 2 is too long, the maximum depth $t_{NB}$ is preferably 50 μm.

FIG. 33 is a result of simulation on the IGBT illustrated in FIG. 10A indicating influence of the presence or absence of the N auxiliary layer 29 on a relationship between the breakdown voltage ($BV_{CES}$) and the peak concentration of the N buffer layer 15 under the environment at 298 K when the device belongs to a 6500 V breakdown-voltage class. In FIG. 33, a breakdown voltage change L221 indicates change in $BV_{CES}$ (V) of a combined structure of the N buffer layer 15 and the N auxiliary layer 29 according to the first aspect, and a voltage change L222 indicates change in $BV_{CES}$ of the N buffer layer 15 with the single structure excluding the N auxiliary layer 29. The horizontal axis represents the maximum impurity concentration ($cm^{-3}$).

As illustrated in FIG. 33, a minimum peak concentration XPC2 of the single N buffer layer 15 is $5.0 \times 10^{14}$ $cm^{-3}$ which satisfies a standard breakdown voltage TBV3 (7500 V) or higher in consideration of guaranteeing the breakdown voltage. In contrast, a minimum peak concentration XPC1 when the N auxiliary layer 29 is added is $2.0 \times 10^{14}$ $cm^{-3}$ which satisfies the standard breakdown voltage TBV3 or higher, thus enlarging the margin to the peak concentration. Accordingly, the maximum peak concentration PC of the N buffer layer 15 becomes $1.0 \times 10^{16}$ $cm^{-3}$ according to the object (i) described in Embodiment 1.

In other words, when the peak concentration PC of the n-type impurities to be implanted into the N buffer layer 15 satisfies a peak impurity concentration condition defined by $\{2 \times 10^{14}$ $(cm^{-3}) \leq PC \leq 1.0 \times 10^{16}$ $(cm^{-3})\}$, the structure according to Embodiment 1 without having the N auxiliary layer 29 can produce the advantages including satisfying the stable breakdown voltages.

As such, the first aspect in Embodiment 2 that is illustrated in FIG. 25 involves the N buffer layer 15 characterized by having a lower concentration as that according to Embodiment 1, having the concentration slope δ as illustrated in FIGS. 4 and 5 that is lower in angle in a depth direction toward the junction between the N⁻ drift layer 14 and the N buffer layer 15, and having the longer depth $t_{NB}$. The first aspect in Embodiment 2 further involves a total N buffer layer with an impurity profile in which the N auxiliary layer 29 higher in concentration than the N buffer layer 15 is added to the junctions between the N buffer layer 15 and the P collector layer 16, the N⁺ cathode layer 17 (19), and the P cathode layer 18.

Figure 29:
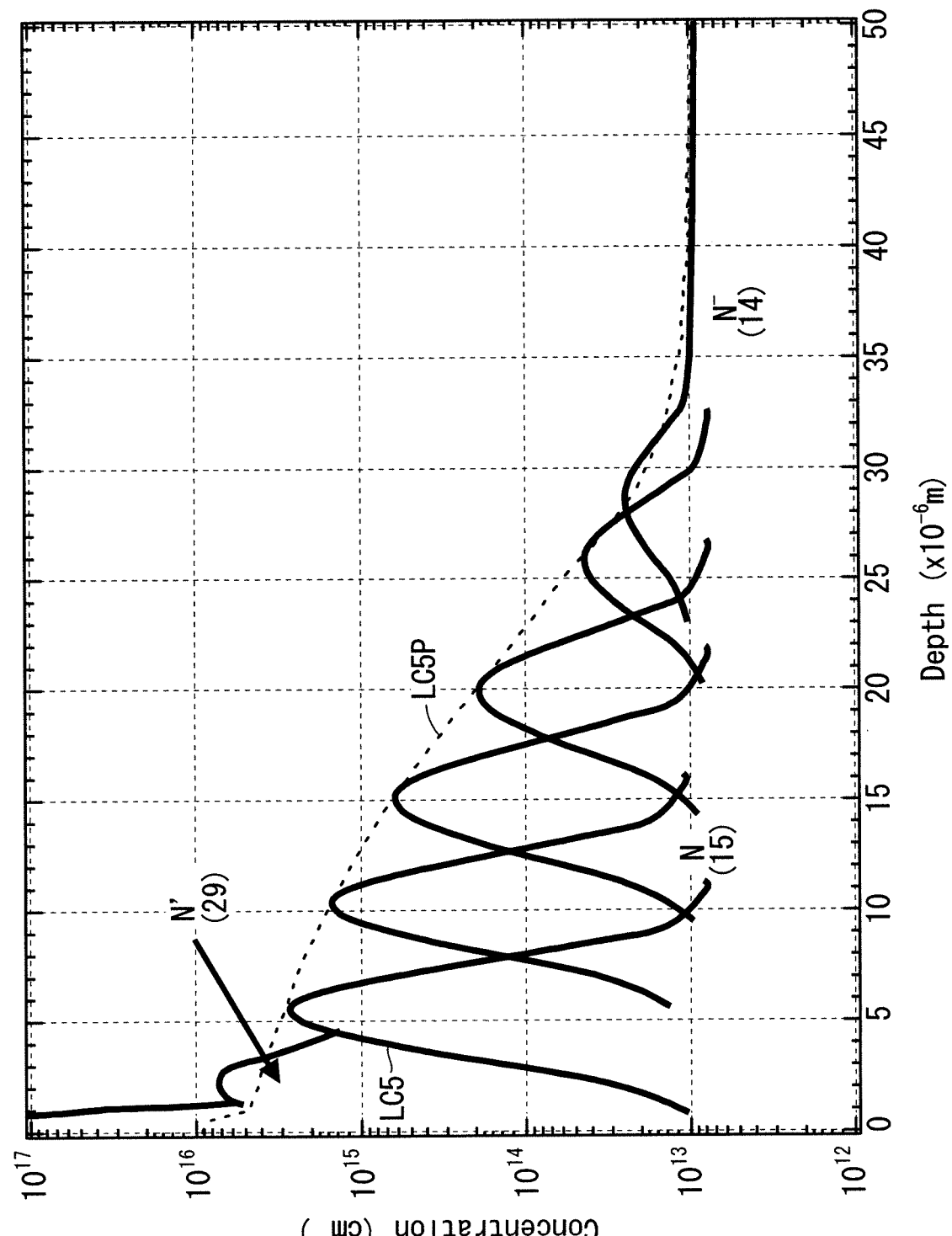
FIG. 29 is a graph showing an impurity profile of the N buffer layer according to a fifth aspect in Embodiment 2.

As a result, the first aspect in Embodiment 2 can improve the controllability of a turn-off operation and significantly improve the blocking capability at turn-off with the N buffer layer 15 that satisfies the concentration slope condition on the concentration slope δ, and can provide more stable breakdown voltage characteristics and reduce the turn-off loss with low leakage characteristics at turn-off with the N auxiliary layer 29 higher in concentration than the N buffer layer 15 as according to the embodiment 1. The fifth to seventh aspects involving the N auxiliary layer 29 that are illustrated in FIGS. 29 to 31, respectively, produce the similar advantages.

FIGS. 26 to 31 indicate examples of forming the N buffer layer 15 by setting conditions on acceleration energy of ionic species in implanting ions. The ionic species are assumed to be selenium, sulfur, phosphorus, and protons (hydrogen). Furthermore, when protons (hydrogen) are used, a diffusion-layer forming process technology is used to form an N layer by annealing (at a temperature ranging from 350 to 450° C.) using the protons as donors. The protons (hydrogen) are introduced into Si with an irradiation technique using a cyclotron, besides through ion implantation.

When the ionic species are introduced into Si, each of crests of impurity profiles as illustrated by concentration changes LC2 to LC7 in FIGS. 26 to 31, respectively has peak impurity profiles present in the N buffer layer 15 by setting the conditions on acceleration energy and on dose for the N buffer layer 15. In addition, the peak concentrations of the crests of each if the impurity profiles illustrated in FIGS. 26 to 31 are being reduced toward the junction between the N⁻ drift layer 14 and the N buffer layer 15.

Figure 28:
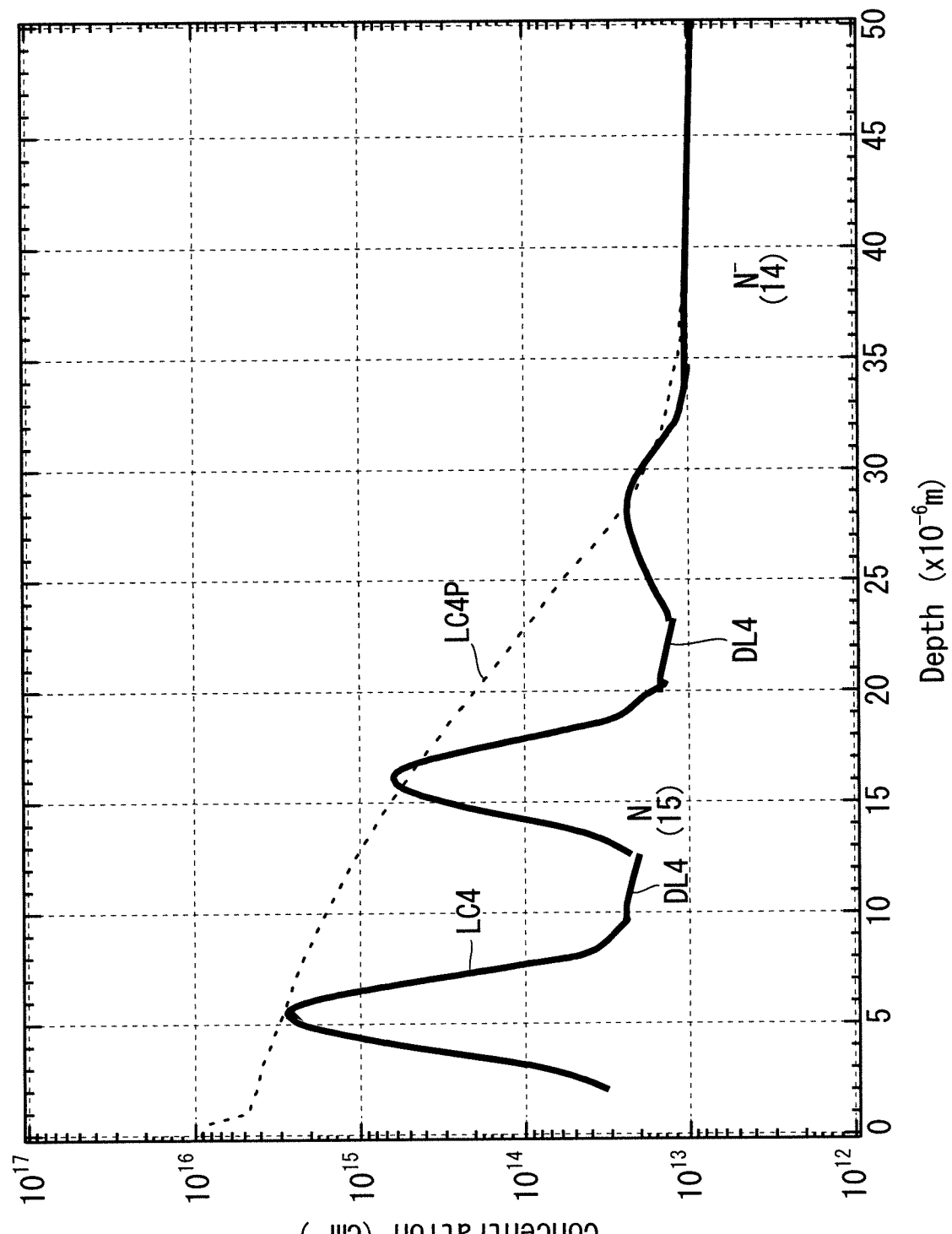
FIG. 28 is a graph showing an impurity profile of the N buffer layer according to a fourth aspect in Embodiment 2.
Figure 31:
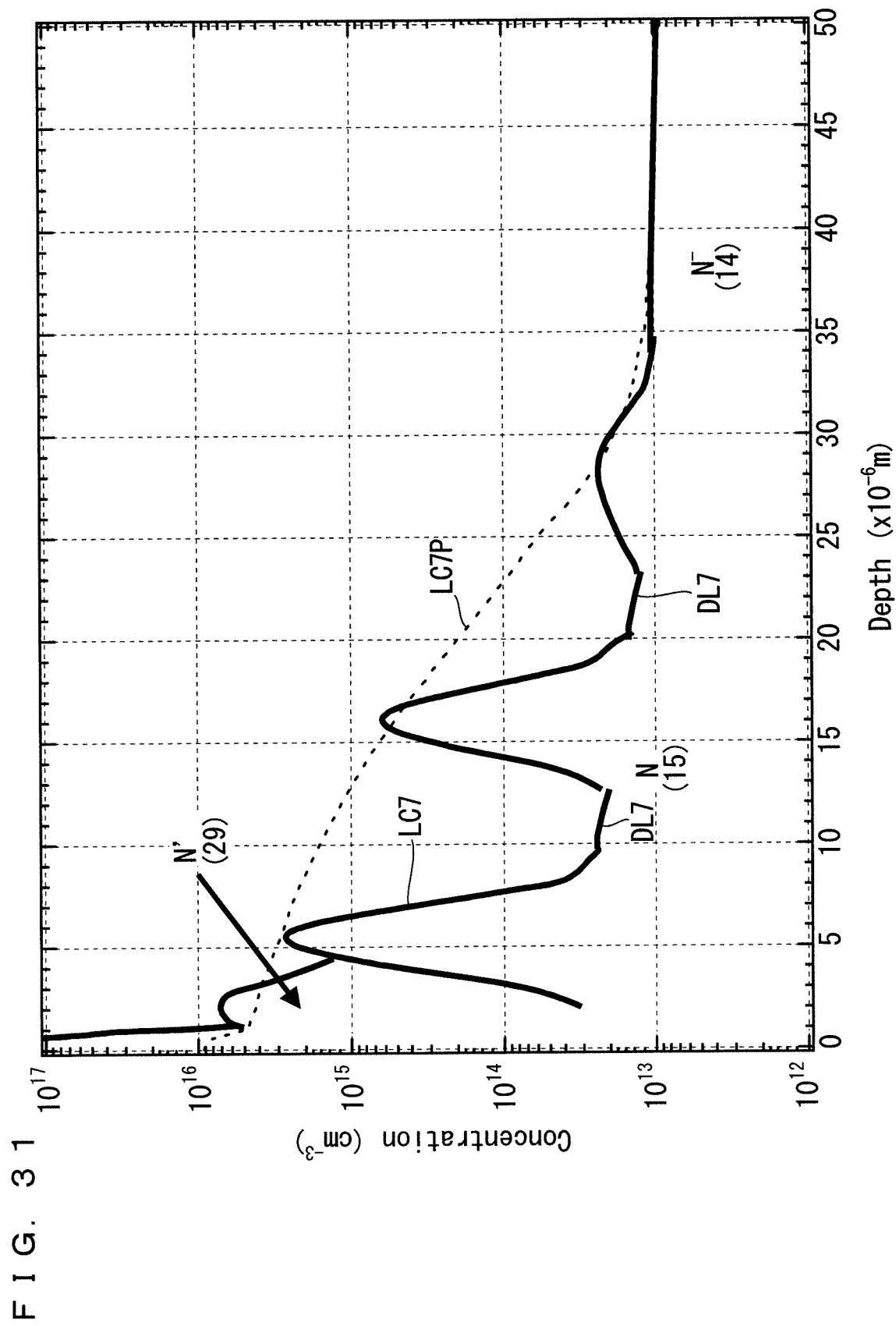
FIG. 31 is a graph showing an impurity profile of the N buffer layer according to a seventh aspect in Embodiment 2.

Since the peak impurity profiles (concentration changes LC4 and LC7) according to the fourth and seventh aspects that are illustrated in FIGS. 28 and 31 have concentration slopes DL4 and DL7, respectively, that are being reduced toward the junction between the N⁻ drift layer 14 and the N buffer layer 15 in part of impurity profiles of troughs between the crests of the impurity profiles, the depletion layer can smoothly extend inside the N buffer layer 15 in a dynamic operation.

When the concentration slopes DL4 and DL7 are provided, the impurity profile concentrations of the impurity profiles of the troughs in the peak impurity profiles LC4 and LC7 that are illustrated in FIGS. 28 and 31, respectively, are set higher than the impurity concentration of the N⁻ drift layer 14 and lower than the peak concentration of the impurity profiles of the crests of the N buffer layer 15.

Furthermore, regarding peak concentration changes LC2P to LC7P that are assumed on the basis of the peak concentration values of the concentration changes LC2 to LC7 that represent the peak impurity profiles as illustrated in FIGS. 26 to 31, respectively, an imaginary concentration slope Pδ in the main portion of the N buffer layer 15 is defined by the following Equation (3).

[Math 4]

$$P\delta = \frac{\Delta \log_{10} PCB}{\Delta PTB} \quad (3)$$

In Equation (3), the denominator means a film thickness displacement ΔPTB (μm) and the numerator means a concentration displacement $\Delta \log_{10} PCB$ ($cm^{-3}$). In the concentration displacement "$\Delta \log_{10} PCB$", "PCB" represents an impurity concentration with a peak concentration change LCiP (i=2 to 7) of the N buffer layer 15, and the "log" represents change in the concentration by a common logarithm whose base is 10. Furthermore, the film thickness displacement "ΔPTB" represents a variation of the N buffer layer 15 in the depth direction.

The tolerance of the imaginary concentration slope Pδ needs to satisfy an imaginary concentration slope condition defined by $\{0.03 \leq P\delta \leq 0.7$ (decade $cm^{-3}/\mu m)\}$ as the concentration slope δ according to Embodiment 1, and preferably satisfies an imaginary optimal concentration slope condition defined by {0.03≤Pδ≤0.2 (decade cm$^{-3}$/μm)} in consideration of no degradation in the other electrical characteristics.

According to the second to seventh aspects in Embodiment 2, the imaginary concentration slope Pδ defined by Equation (3) satisfies the imaginary concentration slope condition in the main portion of the N buffer layer 15. Thus, it is possible to provide the stable breakdown voltage characteristics, reduce the turn-off loss with reduction in the leakage current at turn-off, and improve the controllability of a turn-off operation and the blocking capability at turn-off similarly as according to Embodiment 1 and the first aspect in Embodiment 2.

Furthermore, the fifth to seventh aspects illustrated in FIGS. 29 to 31, respectively, involve the N auxiliary layer 29 as the first aspect. Here, the dose rate PTα of the N auxiliary layer 29 is defined by the following Equation (4), where Dose•NB3 denotes a total dose (/cm$^2$) of n-type impurities to be implanted to the N buffer layer 15 and Dose•NB4 denotes a dose (/cm$^2$) of n-type impurities to be implanted to the N auxiliary layer 29 according to the fifth to seventh aspects.

[Math 5]

$$PT\alpha = \frac{\text{Dose} \cdot NB4}{\text{Dose} \cdot NB3 + \text{Dose} \cdot NB4} \quad (4)$$

Here, the dose rate PTα according to the fifth to seventh aspects is set to satisfy an impurity implantation rate condition defined by {0.3≤PTα<1}, similarly as the dose rate Tα according to the first aspect.

As a result, the fifth to seventh aspects can provide more stable breakdown voltage characteristics and reduce the turn-off loss with low leakage characteristics at turn-off with the N auxiliary layer 29 higher in concentration than the N buffer layer 15 as according to the first aspect.

The semiconductor device according to Embodiment 2 also achieves the stable breakdown voltage characteristics, reduction in turn-off loss with reduction in the leakage current at turn-off, and improvement in the controllability of a turn-off operation and in the blocking capability at turn-off, by satisfying a depth forming condition of the depth $t_{NB}$ of the N buffer layer 15 that is defined by {4.0≤JD≤50.0 (μm)} as according to Embodiment 1.

Manufacturing Method (Embodiments 1 and 2)
(Part 1)

FIGS. 34 to 46 are cross-sectional views each illustrating a method for manufacturing an IGBT (FIG. 10A) (Part 1) according to Embodiment 1 or Embodiment 2. These drawings illustrate the manufacturing method in the active cell area R1.

Figure 34:
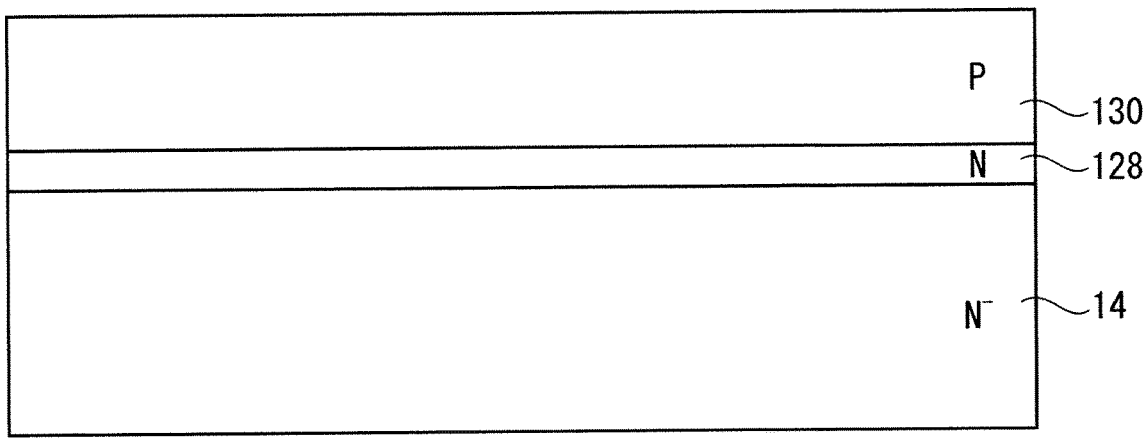
FIG. 34 is a cross-sectional view illustrating a method for manufacturing an IGBT according to Embodiment 1 (Embodiment 2).

First, a silicon wafer (a silicon wafer or a processed silicon wafer will be hereinafter referred to as a "semiconductor body") formed by the FZ method is prepared. As illustrated in FIG. 34, an N layer 128 and a P base layer 30 are formed in the upper layer portion of the semiconductor body with the N$^-$ drift layer 14. Specifically, the N layer 128 and the P base layer 30 are formed by implanting ions and annealing in the N$^-$ drift layer 14.

Figure 35:
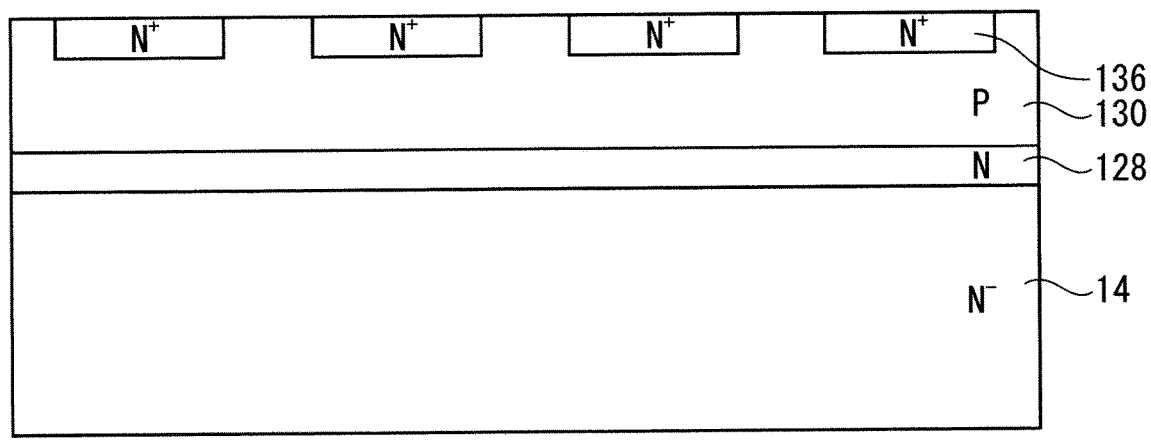
FIG. 35 is a cross-sectional view illustrating the method for manufacturing the IGBT according to Embodiment 1.

Next, N$^+$ emitter layers 136 are selectively formed in the surface of the P base layer 130 by implanting ions and annealing in the semiconductor body as illustrated in FIG. 35.

Figure 36:
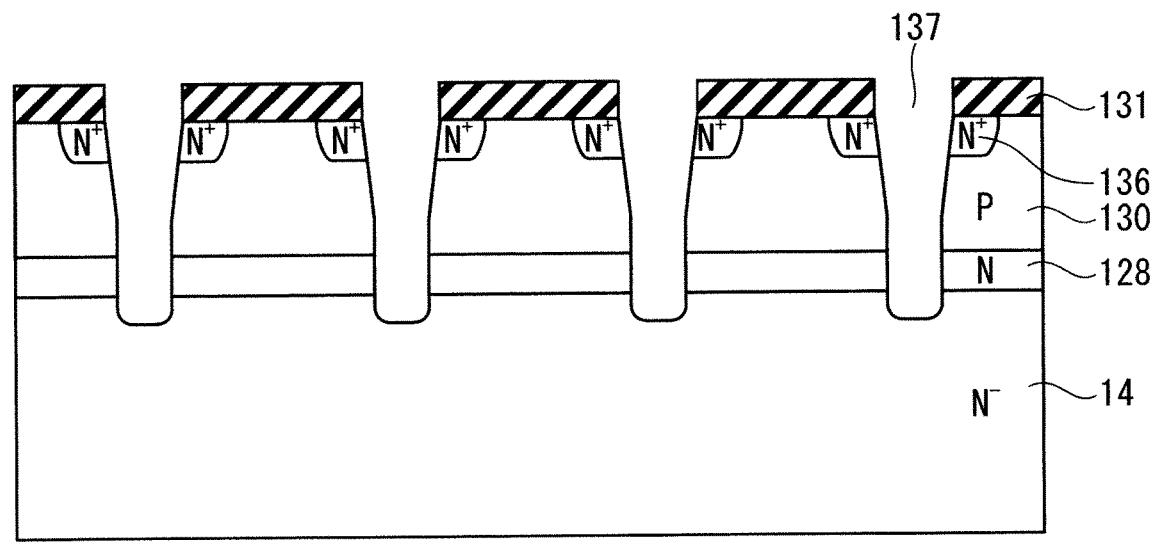
FIG. 36 is a cross-sectional view illustrating the method for manufacturing the IGBT according to Embodiment 1.

Next, an oxide film 131 is formed on the upper surface of the semiconductor body and is patterned using a photoengraving technique, as illustrated in FIG. 36. Then, reactive ion etching using plasma is performed on portions exposed through openings in the oxide film 131 to form trenches 137. Thereafter, chemical dry etching and sacrificial oxidation treatment are performed to remove crystal defects and plasma damaged layers in portions around the trenches 137, to round the bottom portions of the trenches 137, and to flatten the inner walls of the trenches 137. For example, Japanese Patent Application Laid-Open No. 7-263692 discloses the chemical dry etching and the sacrificial oxidation treatment. Furthermore, for example, WO2009-122486 discloses an appropriate depth of the trenches 137.

Figure 37:
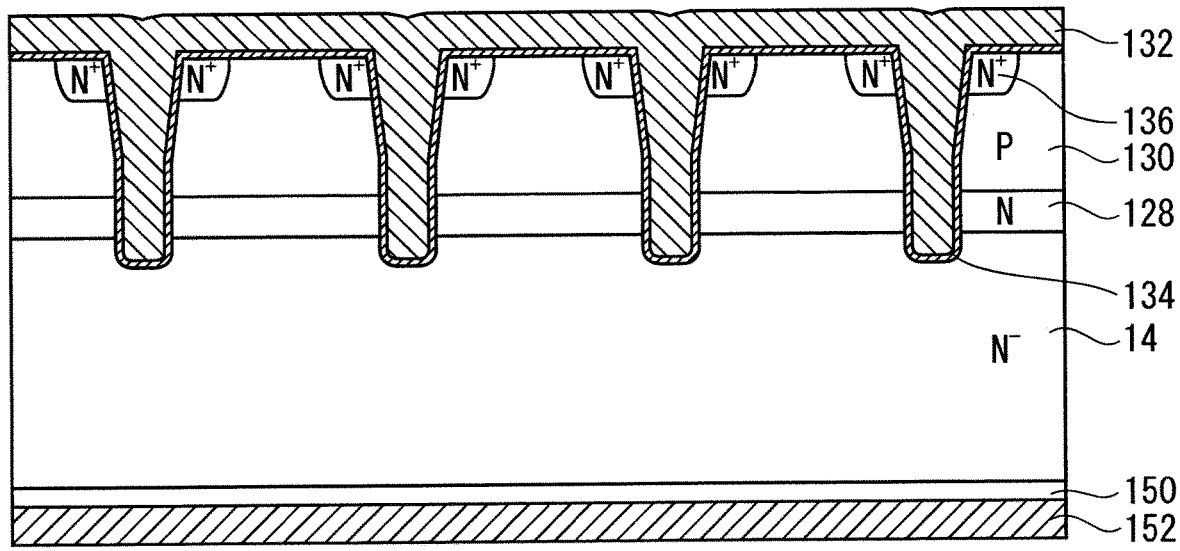
FIG. 37 is a cross-sectional view illustrating the method for manufacturing the IGBT according to Embodiment 1.

Next, a gate oxide film 134 is formed on the trench inner walls by thermal oxidation or chemical vapor deposition (CVD) (see, for example, Japanese Patent Application Laid-Open No. 2001-085686) as illustrated in FIG. 37. Then, a polysilicon layer 132 doped with phosphorus is formed in the trenches 137 including the gate oxide film 134 to fill the trenches 137. An oxide film 150 is formed in the undersurface of the semiconductor body simultaneously with forming of the gate oxide film 134, and a polysilicon layer 152 doped with phosphorus is formed on the oxide film 150 simultaneously with forming of the polysilicon layer 132.

Figure 38:
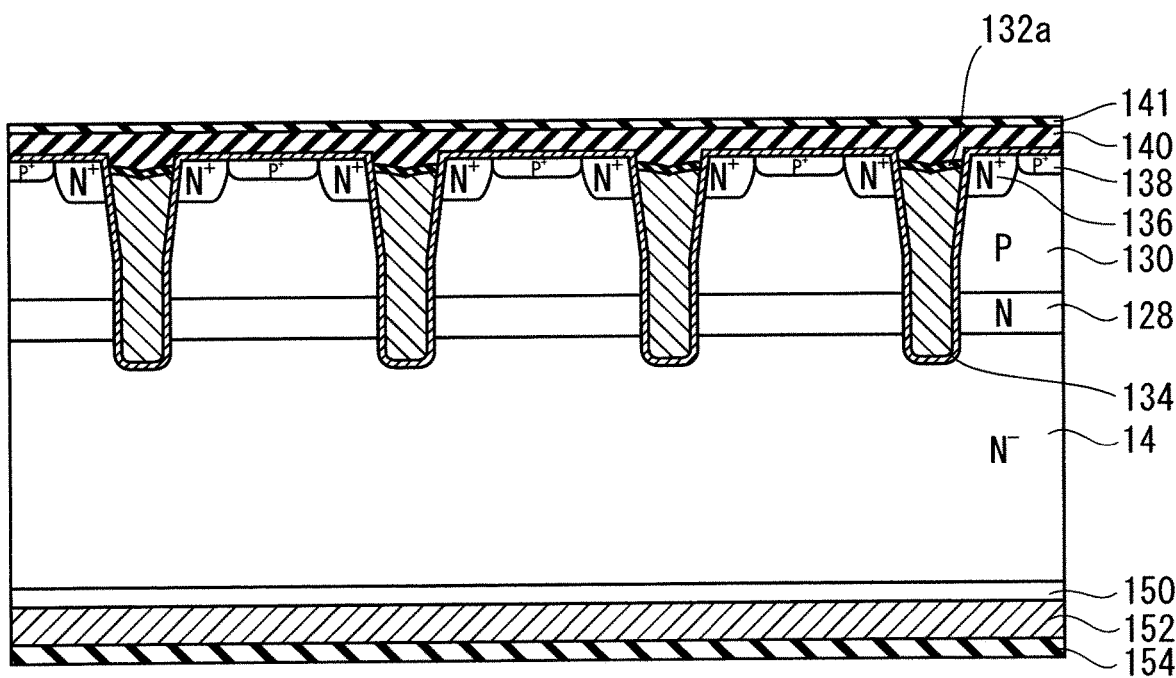
FIG. 38 is a cross-sectional view illustrating the method for manufacturing the IGBT according to Embodiment 1.

Next, a portion of the polysilicon layer 132 protruding outside the trenches 137 is etched as illustrated in FIG. 38. After the etching, the polysilicon layer 132 exposed on the upper surface of the semiconductor body and the surface on which the trenches 137 are embedded is oxidized or deposited by thermal oxidation or CVD to form an oxide film 132a. Then, P$^+$ layers 138 are formed in the upper surface of the semiconductor body. Then, an oxide film 140 doped with boron or phosphorus and a TEOS film 141 are formed on the upper surface of the semiconductor body by CVD. A TEOS film or a silicate glass may be formed as the oxide film 140. A TEOS film 154 is formed on the lower surface of the semiconductor body simultaneously with forming of the oxide film 140 and the TEOS film 141.

Figure 39:
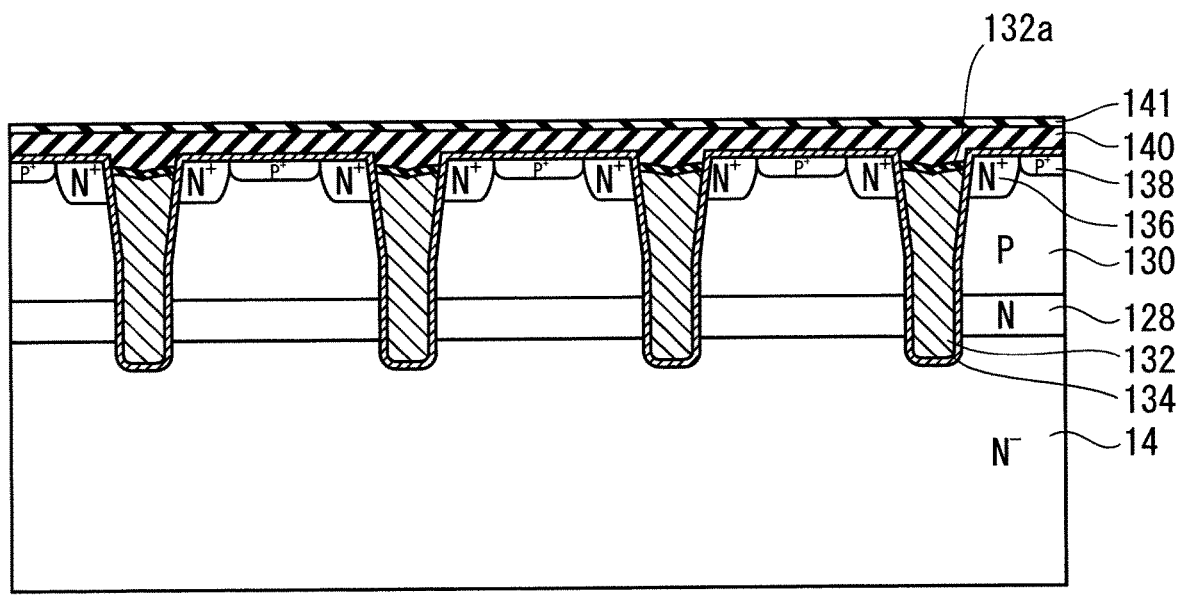
FIG. 39 is a cross-sectional view illustrating the method for manufacturing the IGBT according to Embodiment 1.

Next, the TEOS film 154, the polysilicon layer 152, and the oxide film 150 on the lower surface of the semiconductor body are etched by using a solution containing fluoric acid or a mixture acid (e.g., a mixture solution of fluoric acid, nitric acid and acetic acid), thereby exposing the N$^-$ drift layer 14 as illustrated in FIG. 39.

Figure 40:
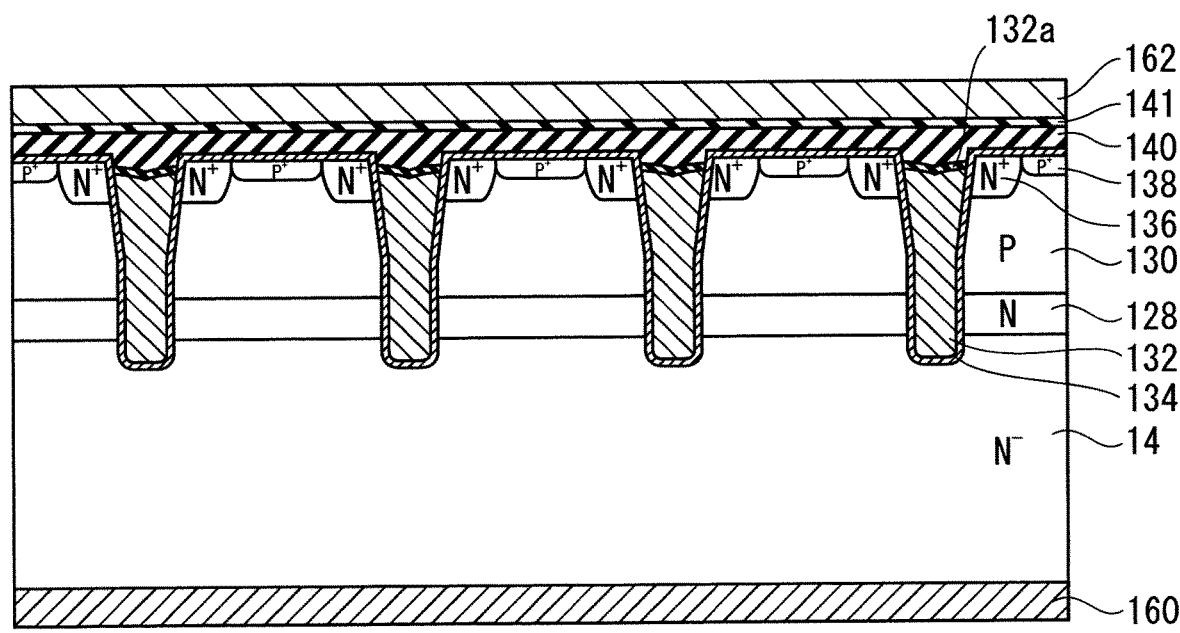
FIG. 40 is a cross-sectional view illustrating the method for manufacturing the IGBT according to Embodiment 1.

Next, a polysilicon layer 160 doped with impurities (polysilicon doped with impurities will be hereinafter referred to as "doped polysilicon") is formed in contact with the N$^-$ drift layer 14 exposed at the lower surface of the semiconductor body as illustrated in FIG. 40. Simultaneously, a doped polysilicon layer 162 that is unwanted is also formed on the upper surface of the semiconductor body. The doped polysilicon layers 160 and 162 are formed by low-pressure CVD (LPCVD). Examples of the impurities to be doped into the doped polysilicon layers 160 and 162 include phosphorus, arsenic, and antimony in order that the doped polysilicon layers 160 and 162 be N$^+$ layers. The impurity concentrations of the doped polysilicon layers 160 and 162 are set higher than or equal to 1×10$^{19}$ (cm$^{-3}$). Furthermore, the film thicknesses of the doped polysilicon layers 160 and 162 are set larger than or equal to 500 (nm).

Figure 41:
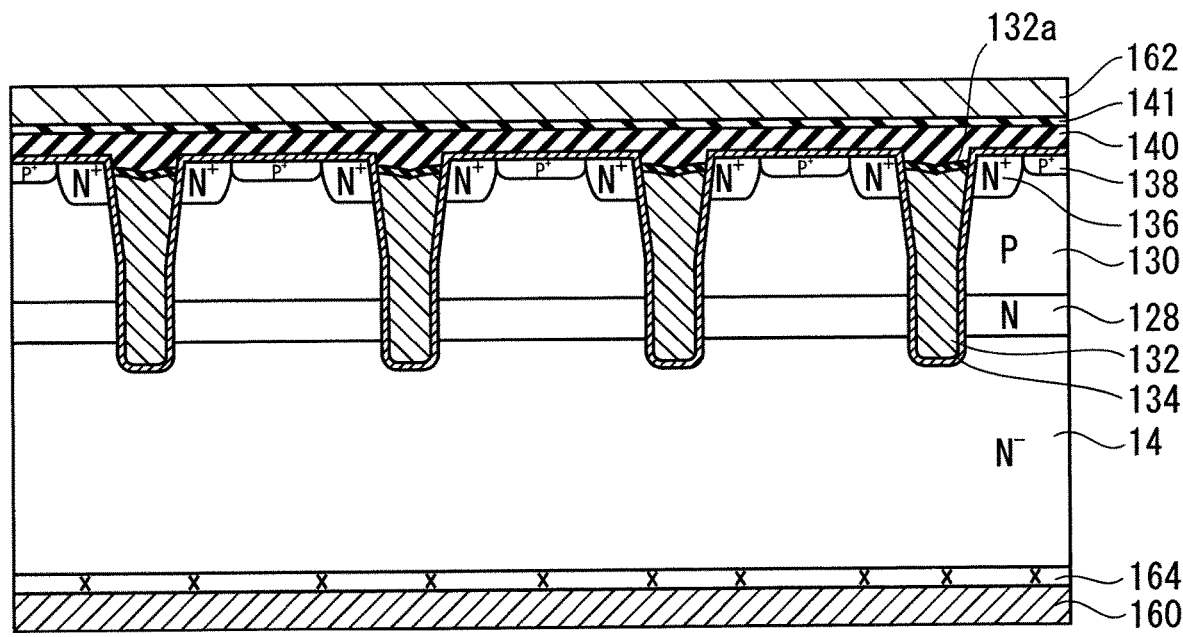
FIG. 41 is a cross-sectional view illustrating the method for manufacturing the IGBT according to Embodiment 1.

Next, the semiconductor body is heated in a nitrogen atmosphere at a temperature ranging from approximately 900 to 1000° C., thereby diffusing the impurities in the doped polysilicon layer 160 to the lower surface of the N$^-$ drift layer 14 as illustrated in FIG. 41. With this diffusion, a gettering layer 164 having crystal defects and high-concentration impurities is formed on the lower surface of the N⁻ drift layer 14. This gettering layer forming step is a step of forming the gettering layer 164 on the lower surface of the N⁻ drift layer 14 exposed at the lower surface of the semiconductor body. The impurity concentration on the surface of the gettering layer 164 ranges, for example, from $1.0 \times 10^{19}$ to $1.0 \times 10^{22}$ (cm⁻³).

After the gettering layer forming step, the temperature of the semiconductor body is reduced at an arbitrary temperature reducing rate to a temperature approximately ranging from 600 to 700° C., and then the temperature is maintained for four hours or longer. This step is referred to as an annealing step. In the annealing step, the semiconductor body is heated to diffuse and capture by the gettering layer 164 metal impurities, contaminant atoms, and damage that are introduced into the N⁻ drift layer 14 in the manufacturing steps.

Figure 42:
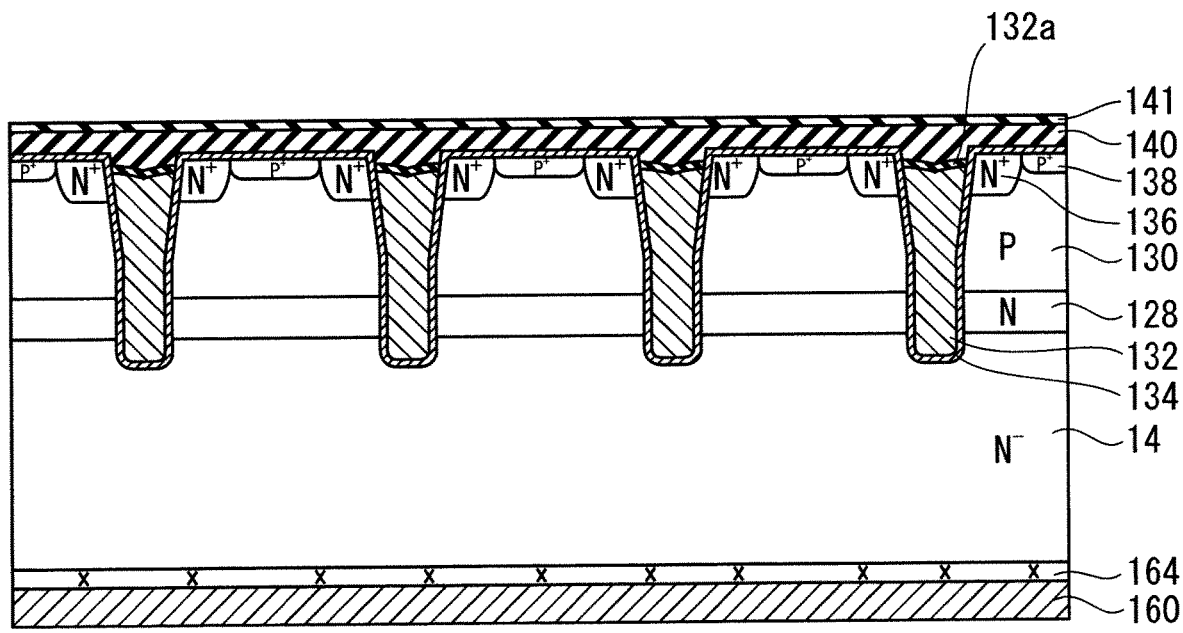
FIG. 42 is a cross-sectional view illustrating the method for manufacturing the IGBT according to Embodiment 1.

Next, the doped polysilicon layer 162 on the upper surface of the semiconductor body is selected and removed by using a solution of fluoric acid or a mixture acid (e.g., a mixture solution of fluoric acid, nitric acid, and acetic acid) as illustrated in FIG. 42. For example, WO2014/054121 discloses the gettering processes illustrated in FIGS. 40 to 42.

Figure 43:
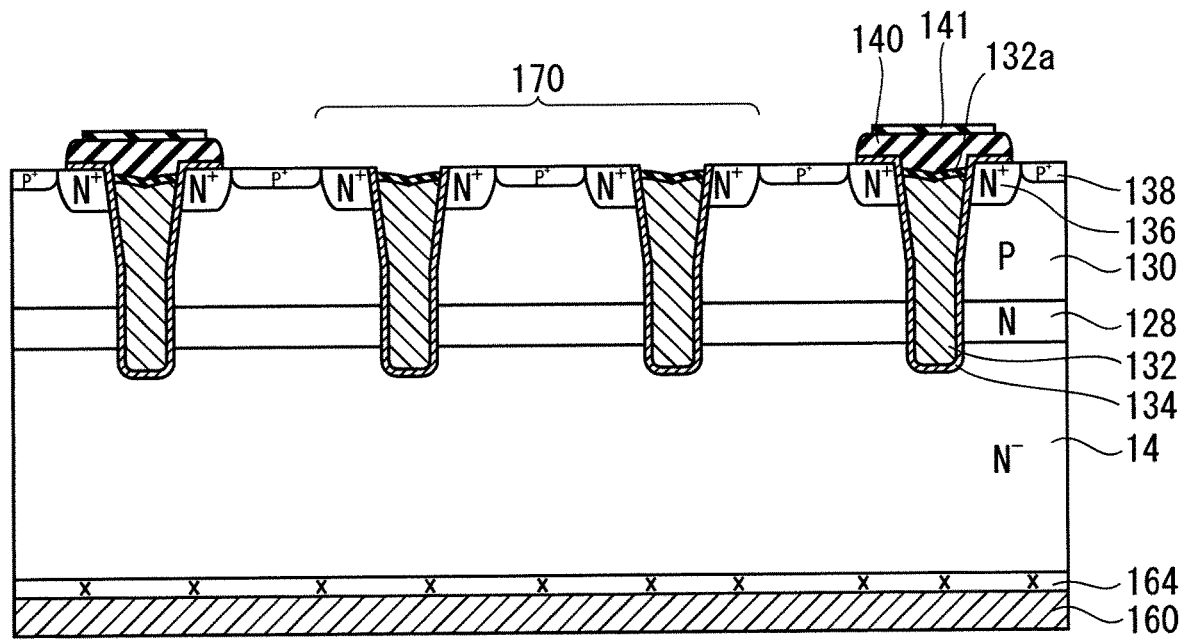
FIG. 43 is a cross-sectional view illustrating the method for manufacturing the IGBT according to Embodiment 1.

Then, the oxide film 140 and the TEOS film 141 on the upper surface of the semiconductor body are partially etched to expose a portion thereof, thereby forming a trench exposed portion 170 having contact holes as illustrated in FIG. 43. The portion other than the trench exposed portion 170 functions as a MOS transistor portion in the IGBT.

The objective to be attained by partially forming the trench exposed portion 170 in a region where the trenches 137 filled with the polysilicon layer 132, as shown in FIG. 43, is to reduce the effective gate width and adjust the capacitance by setting part of the polysilicon layer 132 to an emitter potential. This enables reduction in saturated current density, suppressing oscillation at the time of short circuit by capacitance control, improvement in the short-circuit ruggedness (see WO2002-058160 and WO2002-061845 for detailed information), and reduction in ON voltage by improving the carrier concentration at an emitter under an ON state.

Figure 44:
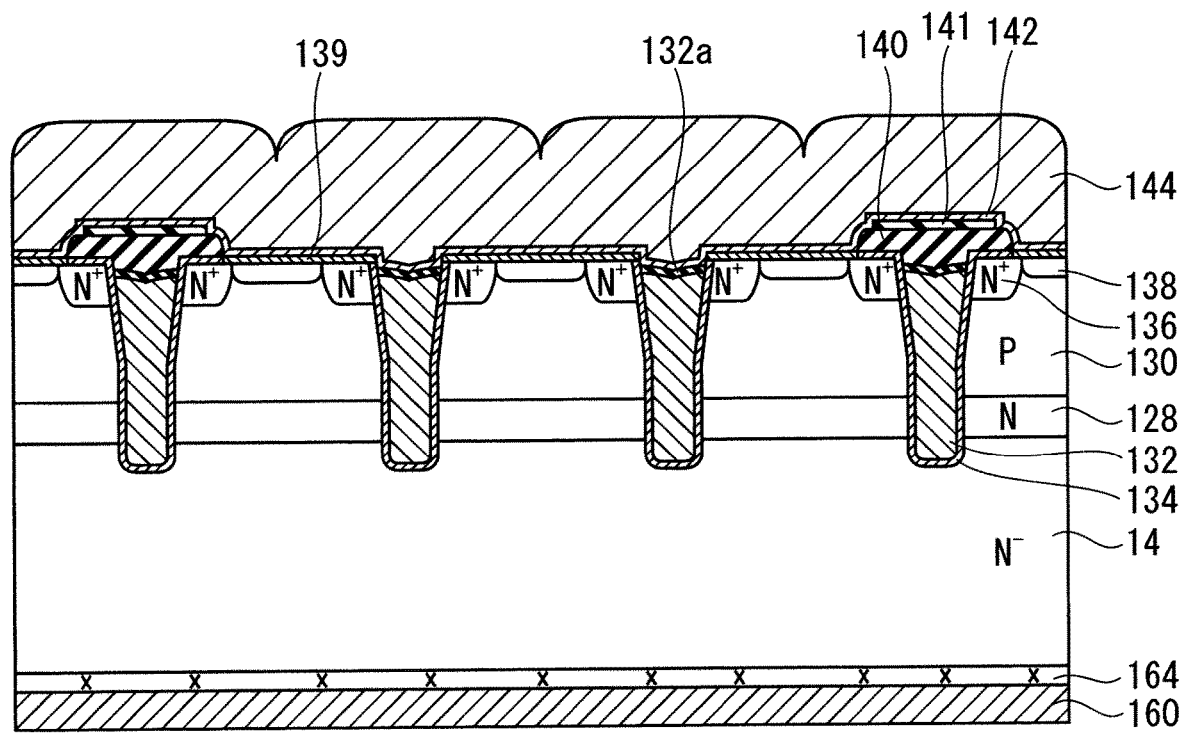
FIG. 44 is a cross-sectional view illustrating the method for manufacturing the IGBT according to Embodiment 1.

Next, a silicide layer 139 and a barrier metal layer 142 are formed on the upper surface of the semiconductor body by sputtering and annealing as illustrated in FIG. 44. A high-melting-point metal material such as Ti, Pt, Co, or W is used as a metal at the time of sputtering. Next, a metal wiring layer 144 having approximately 1 to 3% of Si added thereto is subsequently formed by sputtering on the upper surface of the semiconductor body. Examples of the material of the metal wiring layer 144 include AlSi, AlSiCu, and AlCu. The metal wiring layer 144 is electrically connected to the trench exposed portion 170.

Figure 45:
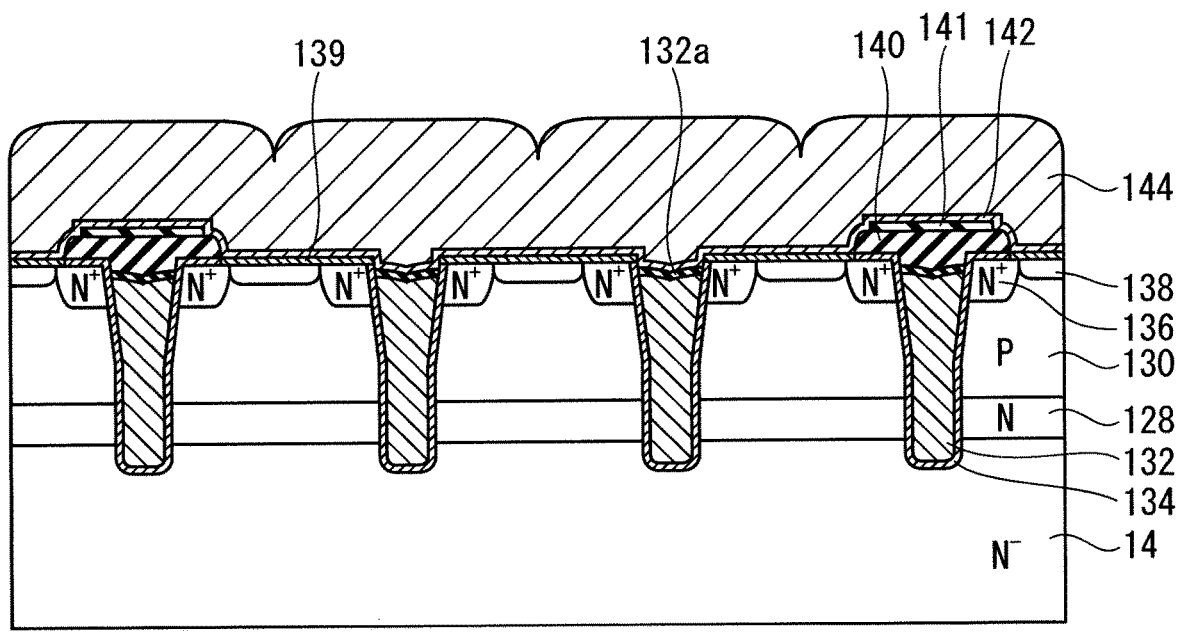
FIG. 45 is a cross-sectional view illustrating the method for manufacturing the IGBT according to Embodiment 1.

Next, the gettering layer 164 and the doped polysilicon layer 160 formed on the lower surface of the semiconductor body are removed by polishing or etching as illustrated in FIG. 45. The step of removing, for example, the gettering layer 164 is referred to as a removal step. In the removal step, a portion of the N⁻ drift layer 14 that is in contact with the gettering layer 164 may be removed in a desired thickness. Thereby, the thickness t14 of the semiconductor body (N⁻ drift layer 14) is compatible with the breakdown-voltage class of the semiconductor device.

Figure 46:
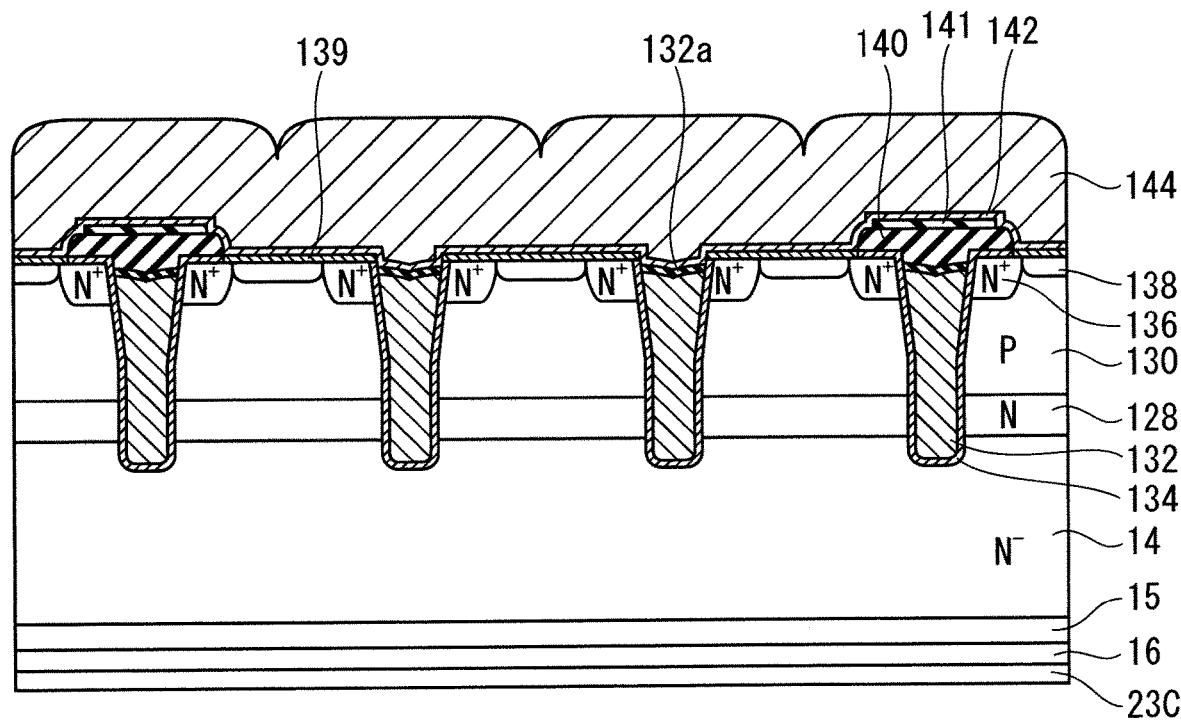
FIG. 46 is a cross-sectional view illustrating the method for manufacturing the IGBT according to Embodiment 1.

Next, the N buffer layer 15 is formed in the lower surface of the semiconductor body as illustrated in FIG. 46. Then, the p-type P collector layer 16 is formed on the lower surface of the N buffer layer 15. Then, the collector electrode 23C is formed on the lower surface of the P collector layer 16.

The N buffer layer 15 is formed by implanting impurities and thermal processing such as introducing protons (hydrogen) using phosphorus, selenium, and sulfur into Si from the lower surface of the semiconductor body to satisfy the depth and the concentration slope δ (imaginary concentration slope Pδ) as described in Embodiment 1 or 2.

Voids occurring in introduction of the protons are combined with hydrogen atoms and oxygen atoms to yield a complex defect. Since this complex defect contains hydrogen, it becomes an electron source (donor), the density of the complex defect increases by annealing, and the donor concentration increases. As a result, a layer serving as a donor that is higher in impurity concentration than the N⁻ drift layer 14 is formed as the N buffer layer 15, thus contributing to the device operation.

Furthermore, the N auxiliary layer 29 is formed to satisfy the conditions on the impurity concentration and the dose rate Tα (PTα) thereof as according to the first and fifth to seventh aspects in Embodiment 2.

Finally, the collector electrode 23C is formed on the lower surface of the P collector layer 16. The collector electrode 23C is a portion to be soldered to the semiconductor body in a module when the semiconductor device is mounted on the module. Thus, it is preferred to form the collector electrode 23C by stacking a plurality of metals to obtain a low contact resistance.

In the relationship between FIG. 46, and FIG. 10A and FIG. 1, the polysilicon layers 132 correspond to the embedded gate electrodes 13, the gate oxide film 134 corresponds to the gate insulating film 12, the N layer 128 corresponds to the N layer 11, the P base layer 130 corresponds to the P base layer 9, the N⁺ emitter layers 136 correspond to the N⁺ emitter layers 7, the P⁺ layers 138 corresponds to the P⁺ layers 8, and the metal wiring layer 144 corresponds to the emitter electrode 5E.

Although the case where the N buffer layer 15 is formed in the step illustrated in FIG. 46 is described as the method for manufacturing the semiconductor device (Part 1), the N buffer layer 15 may be formed in the step illustrated in FIG. 34 or 42 instead. Here, the N buffer layer 15 needs to be formed as the upper layer of the gettering layer 164.

Manufacturing Method (Embodiments 1 and 2)
(Part 2)

FIGS. 47 to 54 are cross-sectional views each illustrating a method for manufacturing the diode of the second type (FIG. 10C) (Part 2) according to Embodiment 1 or Embodiment 2.

Figure 47:
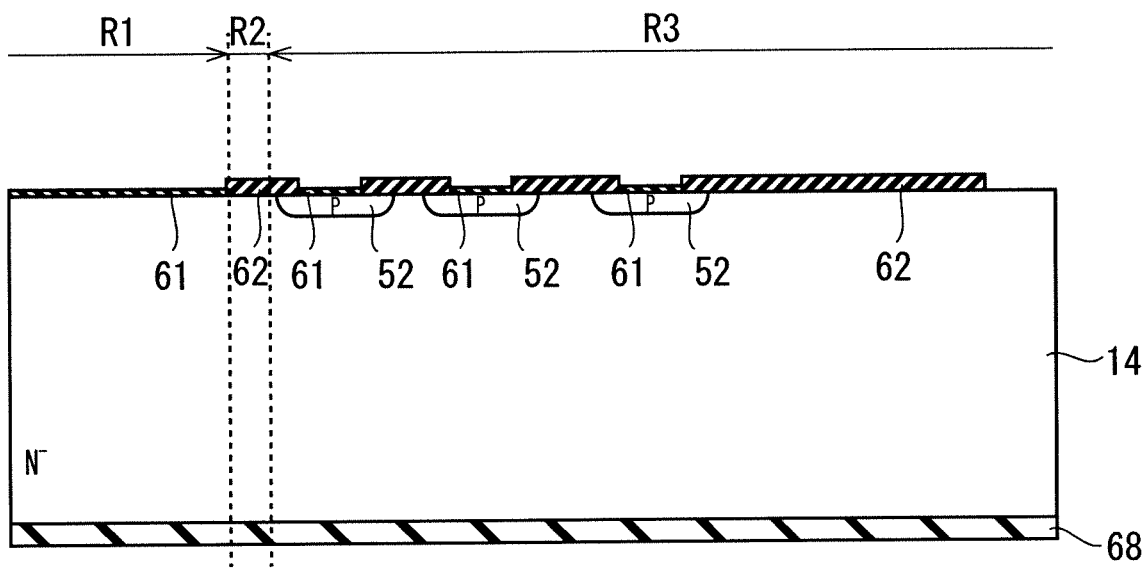
FIG. 47 is a cross-sectional view illustrating a method for manufacturing the diode of the second type according to Embodiment 1 (Embodiment 2).

FIG. 47 illustrates the active cell area R1, and the interface area R2 and the edge termination area R3 formed to surround the active cell area R1. First, a semiconductor body only including the N⁻ drift layer 14 is prepared.

Then, P layers 52 are selectively formed in the surface of the N⁻ drift layer 14 within the interface area R2 and the edge termination area R3. The P layers 52 are formed by implanting ions using, as a mask, oxide films 62 preliminarily formed and then annealing the semiconductor body. An oxide film 68 is formed in the undersurface of the semiconductor body when the oxide films 62 are formed.

Figure 48:
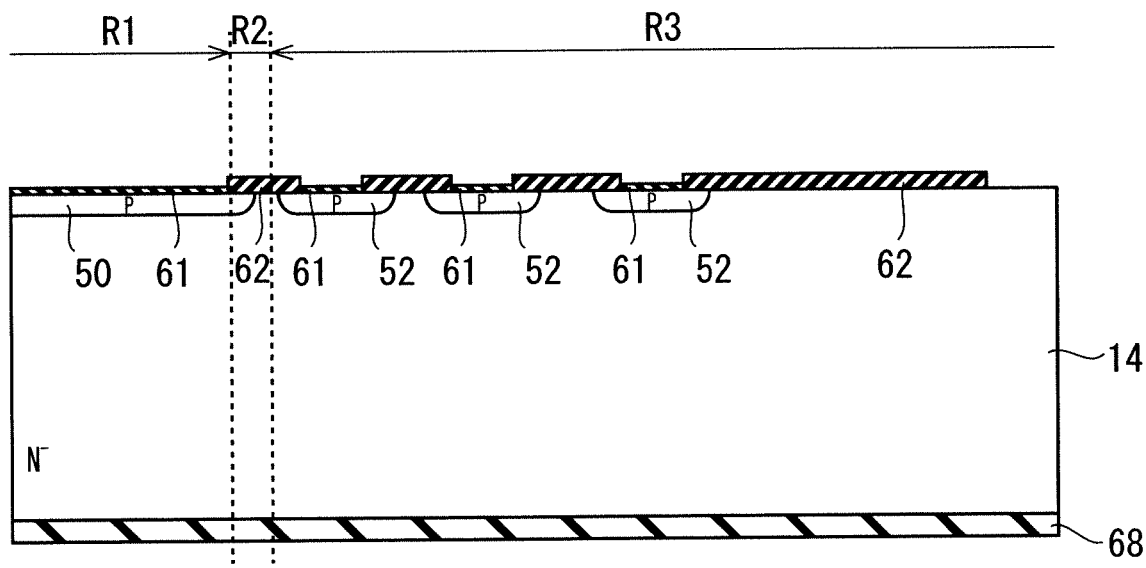
FIG. 48 is a cross-sectional view illustrating the method for manufacturing the diode of the second type according to Embodiment 1.

Next, a P layer 50 is formed in the surface of the N⁻ drift layer 14 within the active cell area R1 by implanting ions and annealing as illustrated in FIG. 48.

Figure 49:
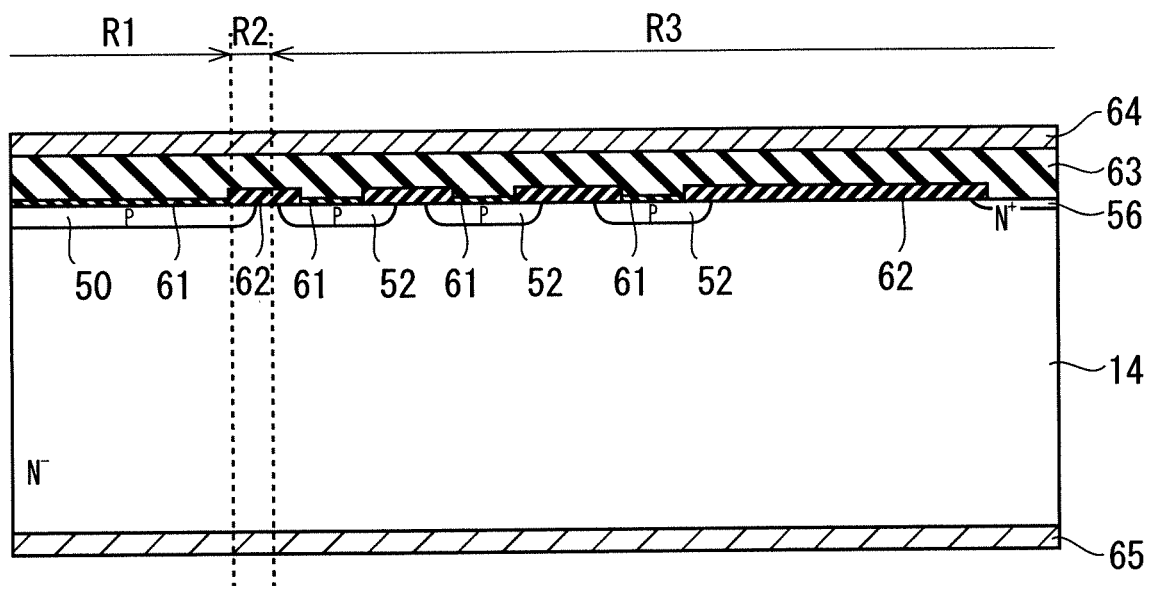
FIG. 49 is a cross-sectional view illustrating the method for manufacturing the diode of the second type according to Embodiment 1.

Then, an N⁺ layer 56 is formed at the end of the edge termination area R3 in the upper surface of the semiconductor body as illustrated in FIG. 49. Next, a TEOS layer 63 is formed on the upper surface of the semiconductor body.

Then, the lower surface of the semiconductor body is exposed. Subsequently, a doped polysilicon layer 65 doped with impurities is formed in contact with the N⁻ drift layer 14 that is exposed at the lower surface of the semiconductor body. Simultaneously, a doped polysilicon layer 64 is also formed on the upper surface of the semiconductor body.

Figure 50:
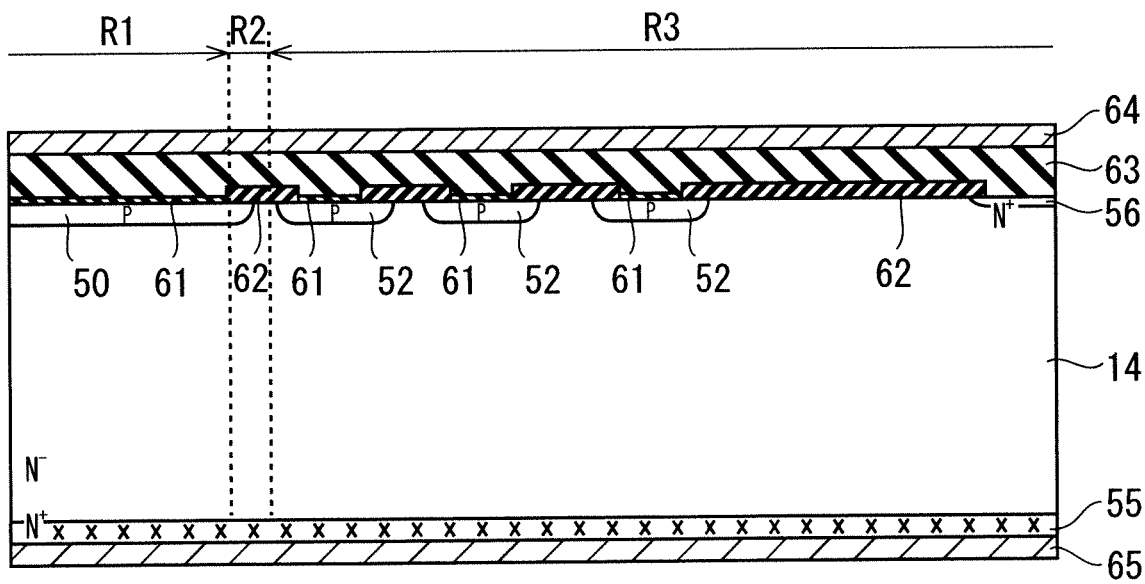
FIG. 50 is a cross-sectional view illustrating the method for manufacturing the diode of the second type according to Embodiment 1.

Next, the semiconductor body is heated to diffuse the impurities in the doped polysilicon layer 65 to the lower surface of the N⁻ drift layer 14, thereby forming a gettering layer 55 having crystal defects and impurities as illustrated in FIG. 50. This step is the same as the preprocessing annealing step in the manufacturing method (Part 1). Then, the annealing step is performed to capture by the gettering layer 55 metal impurities, contaminant atoms, and damage in the N⁻ drift layer 14.

Figure 51:
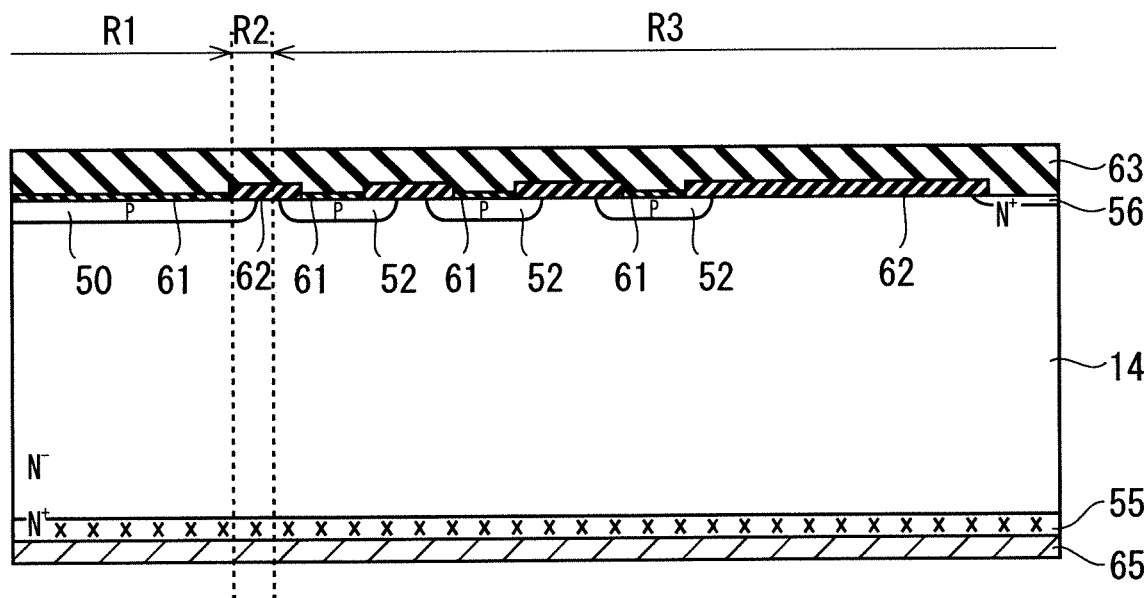
FIG. 51 is a cross-sectional view illustrating the method for manufacturing the diode of the second type according to Embodiment 1.

Next, the doped polysilicon layer 64 formed on the upper surface of the semiconductor body is selected and removed by using a solution of fluoric acid or a mixture acid (e.g., a mixture solution of fluoric acid, nitric acid, and acetic acid) as illustrated in FIG. 51.

Figure 52:
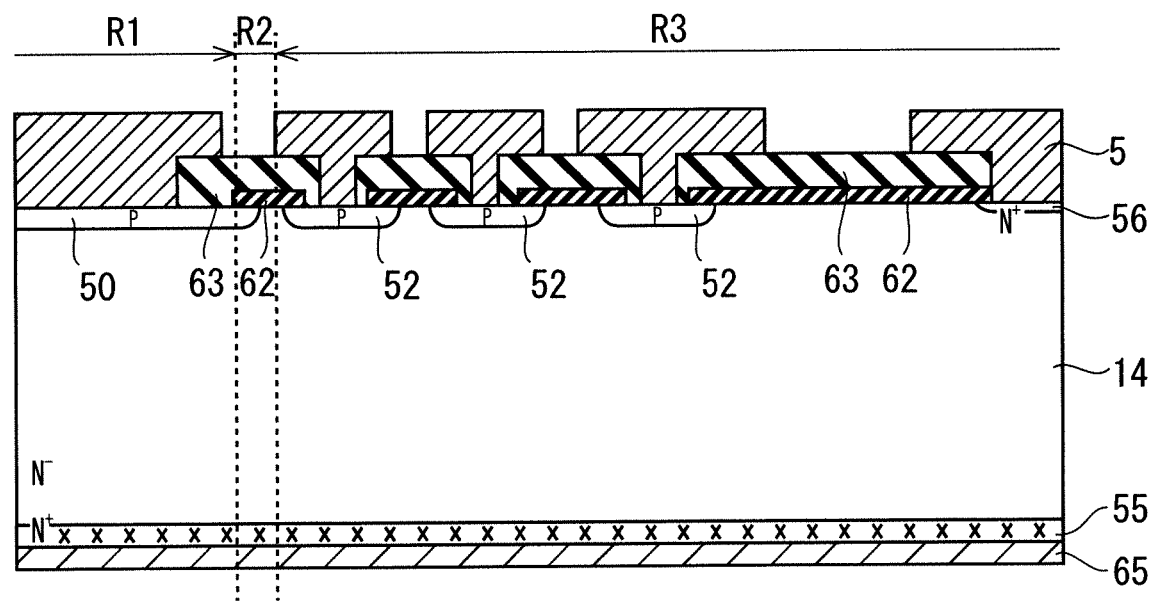
FIG. 52 is a cross-sectional view illustrating the method for manufacturing the diode of the second type according to Embodiment 1.

Next, contact holes are formed to expose the P layers 52, the P layer 50, and the N⁺ layer 56 on the upper surface of the semiconductor body as illustrated in FIG. 52. In other words, the TEOS layer 63 is processed as illustrated in FIG. 52. Then, metal wiring layer 5 having approximately 1 to 3% of Si added thereto is formed by sputtering.

Figure 53:
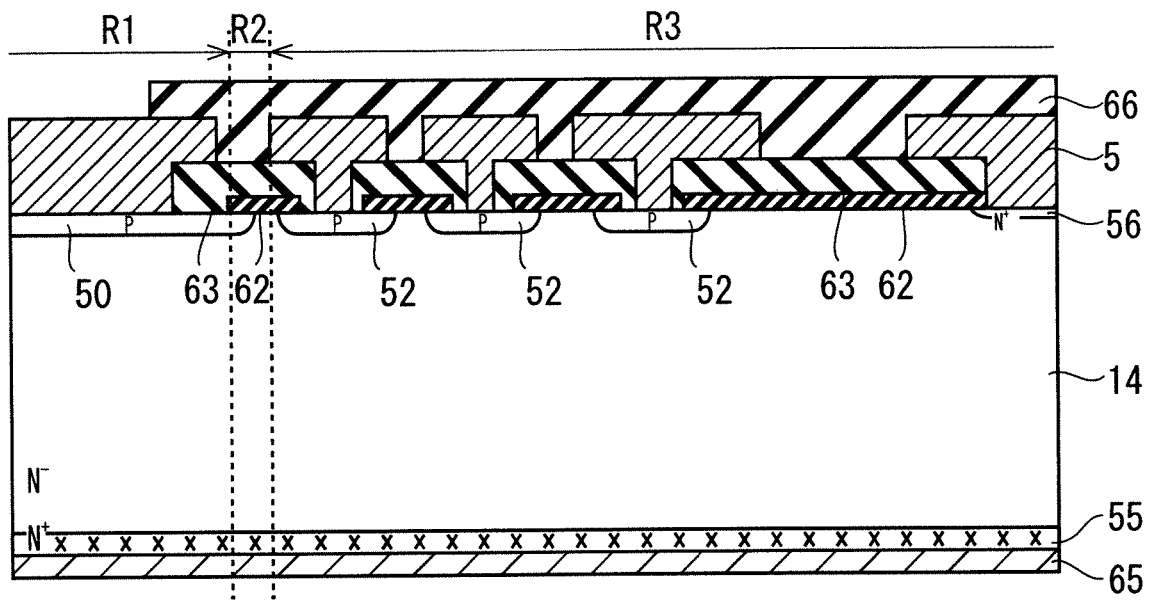
FIG. 53 is a cross-sectional view illustrating the method for manufacturing the diode of the second type according to Embodiment 1.

Next, a passivation film 66 is formed on the upper surface of the semiconductor body as illustrated in FIG. 53. Then, the gettering layer 55 and the doped polysilicon layer 65 formed on the lower surface of the semiconductor body are removed by polishing or etching. This removing step allows the thickness of the semiconductor body (N⁻ drift layer 14) to be compatible with the breakdown-voltage class of the semiconductor device.

Figure 54:
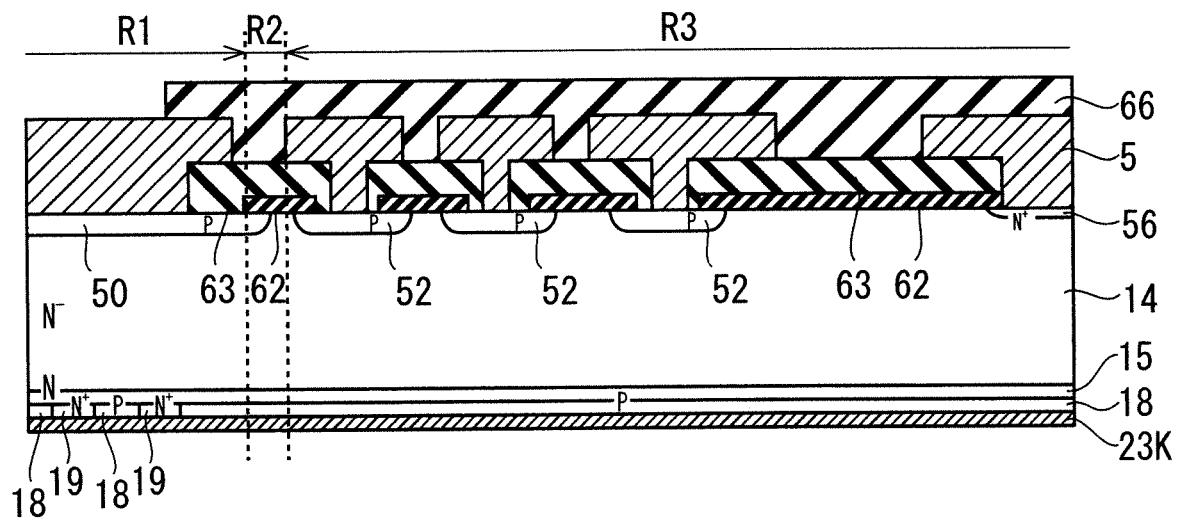
FIG. 54 is a cross-sectional view illustrating the method for manufacturing the diode of the second type according to Embodiment 1.

Next, the N buffer layer 15 is formed in the undersurface of the N⁻ drift layer 14 as illustrated in FIG. 54. Then, the P cathode layer 18 is formed on the lower surface of the N buffer layer 15.

The N buffer layer 15 is formed similarly as the manufacturing method (Part 1) by implanting impurities and thermal processing such as introducing phosphorus, selenium, sulfur, and protons (hydrogen) into Si from the lower surface of the semiconductor body and then annealing to satisfy the depth $t_{NB}$ and the concentration slope δ (imaginary concentration slope Pδ) as described in Embodiment 1 or 2.

Furthermore, the N auxiliary layer 29 is formed to satisfy the conditions on the impurity concentration and the dose rate Tα (PTα) thereof as according to the first and fifth to seventh aspects in Embodiment 2.

Then, the N⁺ cathode layers 19 are partially formed in the P cathode layer 18 within the active cell area R1. The N buffer layer 15, the P cathode layer 18, and the N⁺ cathode layers 19 are diffusion layers formed by implanting ions and annealing. Finally, the cathode electrode 23K is formed on the lower surface of the semiconductor body.

In the relationship between FIG. 54, and FIG. 10C and FIG. 2, the P layer 50 corresponds to the P anode layer 10, the P layers 52 correspond to the P areas 22, the N⁺ layer 56 corresponds to the N⁺ layer 26, and the metal wiring layer 5 corresponds to the anode electrode 5A.

Although the case where the N buffer layer 15 is formed in the step illustrated in FIG. 54 is described as the method for manufacturing the semiconductor device (Part 2), the N buffer layer 15 may be formed in the step illustrated in FIG. 47 or 51 instead. Here, the N buffer layer 15 needs to be formed as the upper layer of the gettering layer 55.

Embodiment 3

A semiconductor device according to Embodiment 3 involves a technique for further improving the blocking capability when an IGBT and a diode are turned OFF on the basis of the relationship between the constituent elements of the power semiconductor illustrated in FIG. 3 and the distinctive N buffer layer 15 described in Embodiments 1 and 2.

FIGS. 55 to 59 are cross-sectional views illustrating the semiconductor devices according to first to fifth aspects in Embodiment 3, respectively. These cross-sections correspond to the cross-section of A1-A1 in FIG. 3. The first aspect is an improvement of the IGBT (FIG. 1 and FIG. 10A), the second aspect is an improvement of the diode of the first type (FIG. 2 and FIG. 10B), and the third to fifth aspects are improvements of the diode of the second type (FIG. 2 and FIG. 10C).

Hereinafter, the same reference numerals as those in FIGS. 10, 1, and 2 will be assigned to the same structural parts and the description thereof will be omitted as appropriate, and the characteristic portions will be mainly described.

Figure 55:
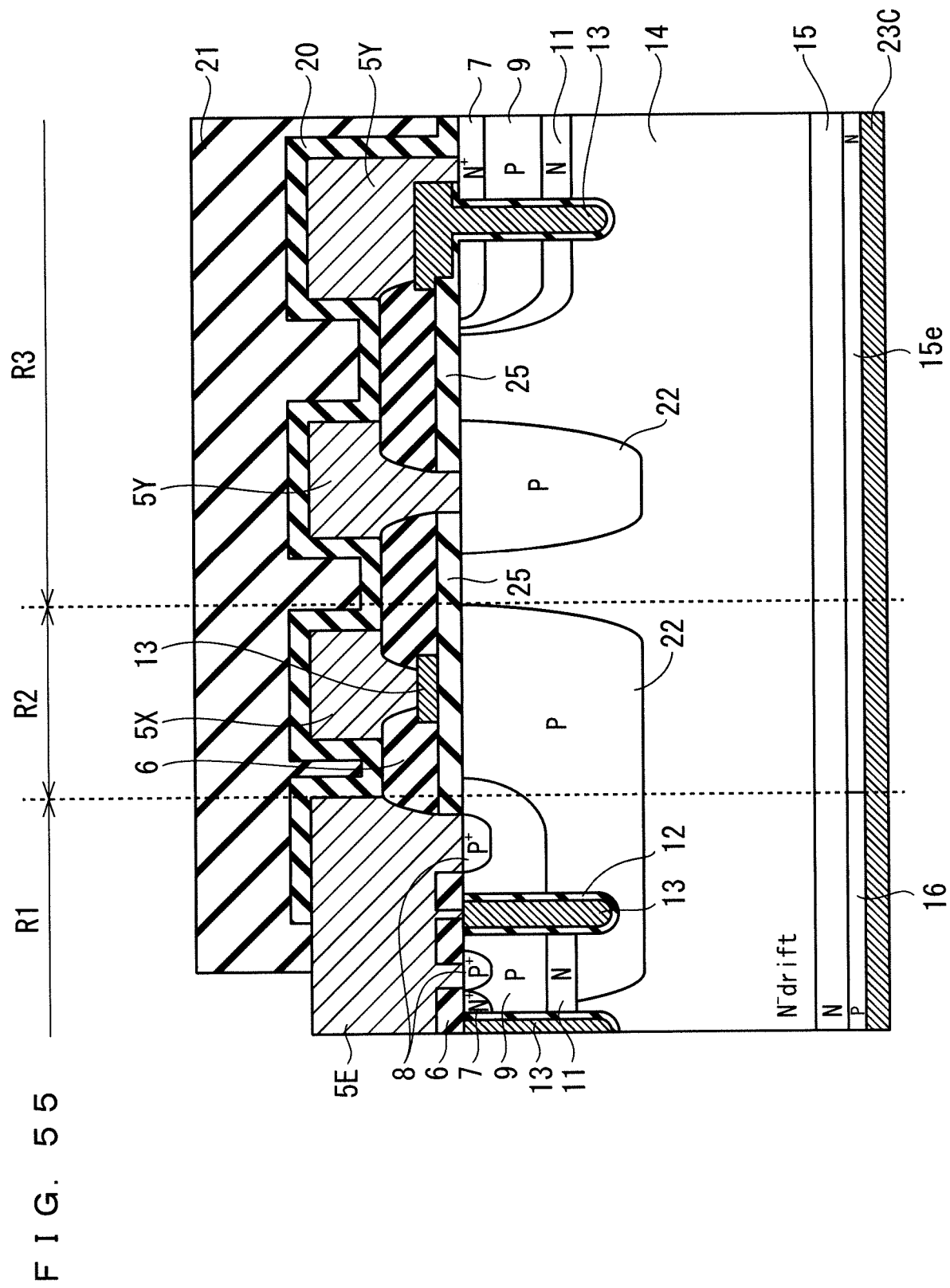
FIG. 55 is a cross-sectional view illustrating a semiconductor device according to a first aspect in Embodiment 3.

The first aspect illustrated in FIG. 55 is characterized by forming an N buffer extension layer 15e without forming the P collector layer 16 in the interface area R2 and the edge termination area R3 that are peripheral areas of the active cell area R1, as compared to the IGBT illustrated in FIG. 10A and FIG. 1. The N buffer extension layer 15e is set to have an impurity concentration as same as that of the N buffer layer 15 (the junction and the vicinity).

The second aspect illustrated in FIG. 56 is characterized by forming the N buffer extension layer 15e without forming the N⁺ cathode layer 17 in the interface area R2 and the edge termination area R3 that are the peripheral areas, as compared to the diode of the first type illustrated in FIG. 10B and FIG. 2. The N buffer extension layer 15e is lower in impurity concentration than the N⁺ cathode layer 17, and is set to have an impurity concentration as same as that of the N buffer layer 15.

Figure 57:
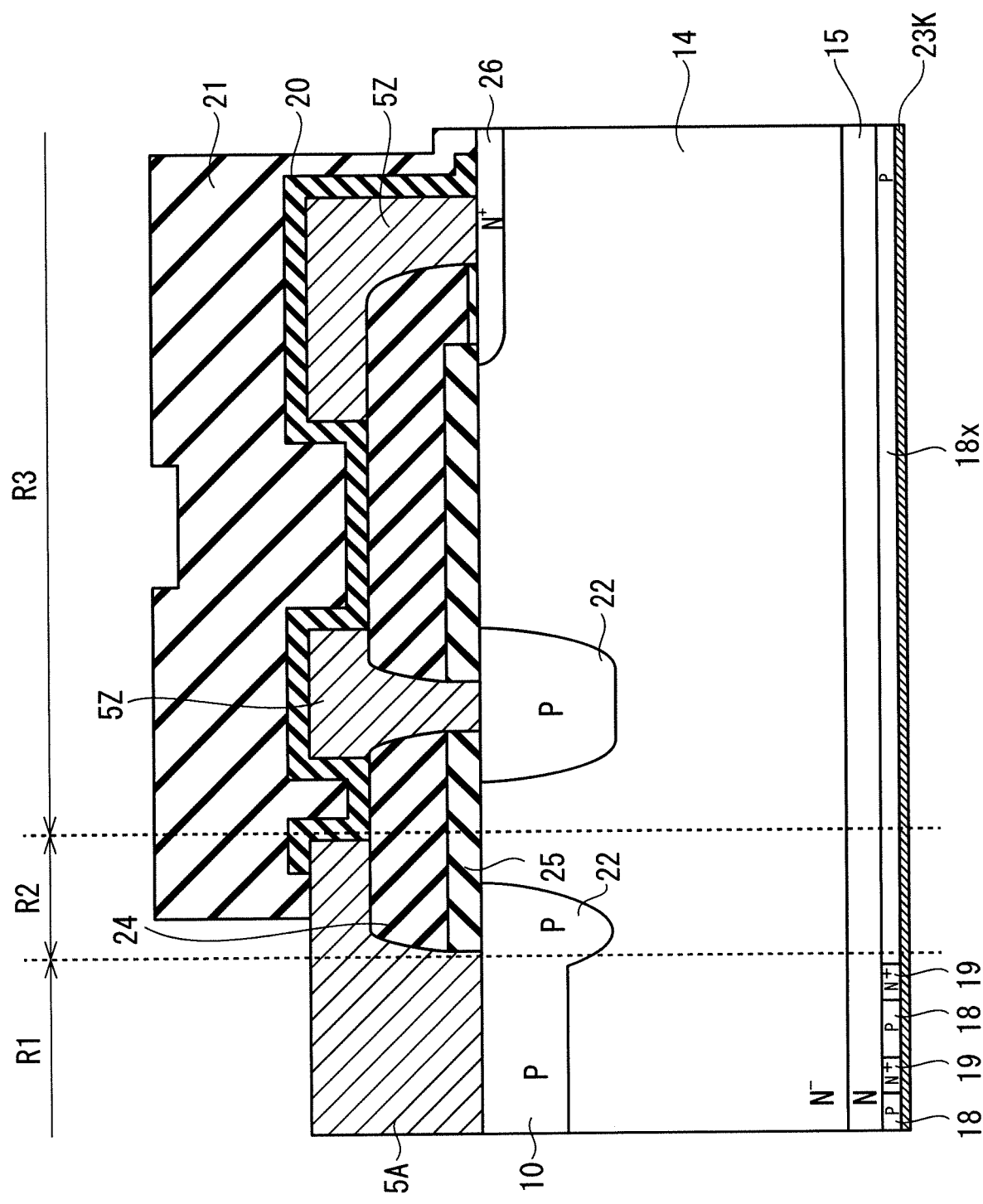
FIG. 57 is a cross-sectional view illustrating a semiconductor device according to a third aspect in Embodiment 3.

The third aspect illustrated in FIG. 57 is characterized by only forming a P cathode layer 18x without forming the N⁺ cathode layer 19 (first partial active layer) in the interface area R2 and the edge termination area R3 that are the peripheral areas, as compared to the diode of the second type illustrated in FIG. 10C. The P cathode layer 18x is set to have an impurity concentration as same as that of the P cathode layer 18 (second partial active layer).

Figure 58:
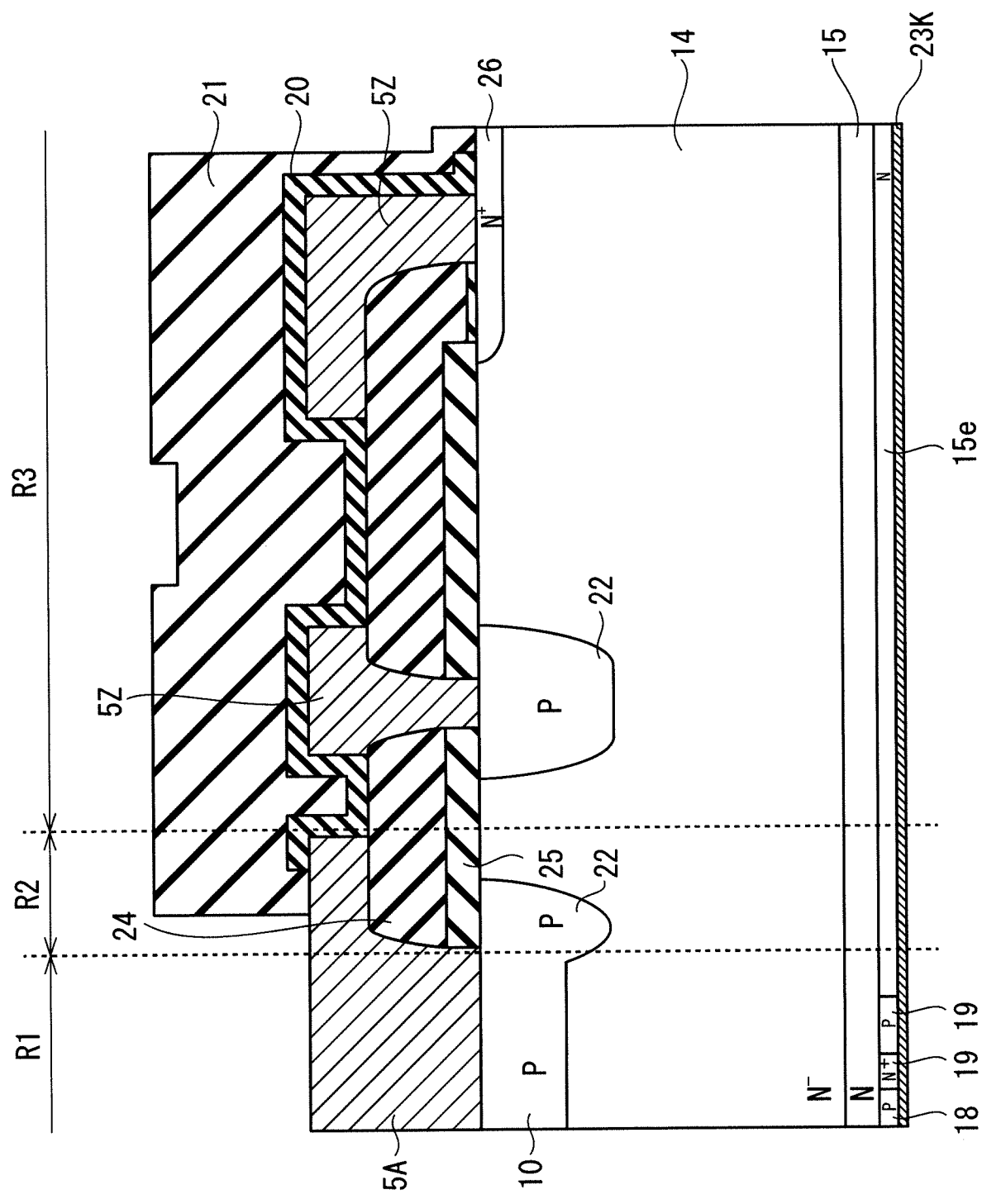
FIG. 58 is a cross-sectional view illustrating a semiconductor device according to a fourth aspect in Embodiment 3.

The fourth aspect illustrated in FIG. 58 is characterized by forming the N buffer extension layer 15e without forming the P cathode layer 18 and the N⁺ cathode layer 19 in the interface area R2 and the edge termination area R3 that are the peripheral areas, as compared to the diode of the second type illustrated in FIG. 10C and FIG. 2. The N buffer extension layer 15e is set to have an impurity concentration as same as that of the N buffer layer 15.

Figure 59:
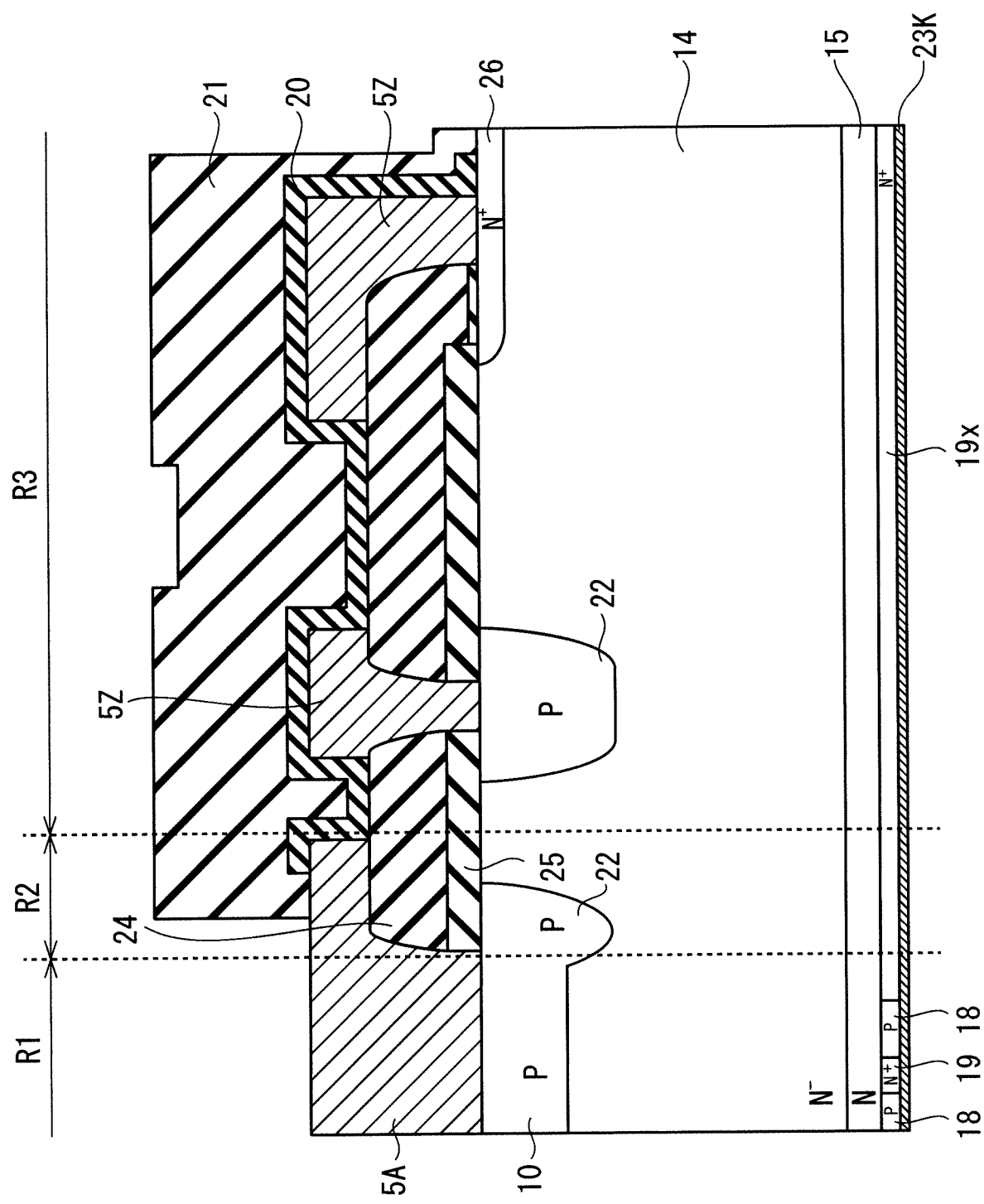
FIG. 59 is a cross-sectional view illustrating a semiconductor device according to a fifth aspect in Embodiment 3.

The fifth aspect illustrated in FIG. 59 is characterized by only forming an N⁺ cathode layer 19x without forming the P cathode layer 18 in the interface area R2 and the edge termination area R3 that are the peripheral areas, as compared to the diode of the second type illustrated in FIG. 10C and FIG. 2. The N⁺ cathode layer 19x is set to have an impurity concentration as same as that of the N⁺ cathode layer 19.

As such, the first to fifth aspects in Embodiment 3 are characterized by changing, in the IGBT and the diodes of the first and second types, a structure of an area corresponding to the active layer that is in contact with the collector electrode 23C (cathode electrode 23K) in the active cell area R1, the interface area R2, and the edge termination area R3.

Thus, all the IGBT and the diodes of the first and second types according to the first to fifth aspects have a structure for suppressing the carrier implantation from the collector (cathode) in the edge termination area R3 under an ON state.

As a result, the first to fifth aspects in Embodiment 3 produce effects of grading the field intensity of a p-n junction that is a main junction in the interface area R2 in a turn-off operation, suppressing increase in the local field intensity, and suppressing thermal breakdown (thermal breakdown suppressing effect) caused by a local increase in temperature subject to the current concentration induced by the impact ionization.

Figure 60:
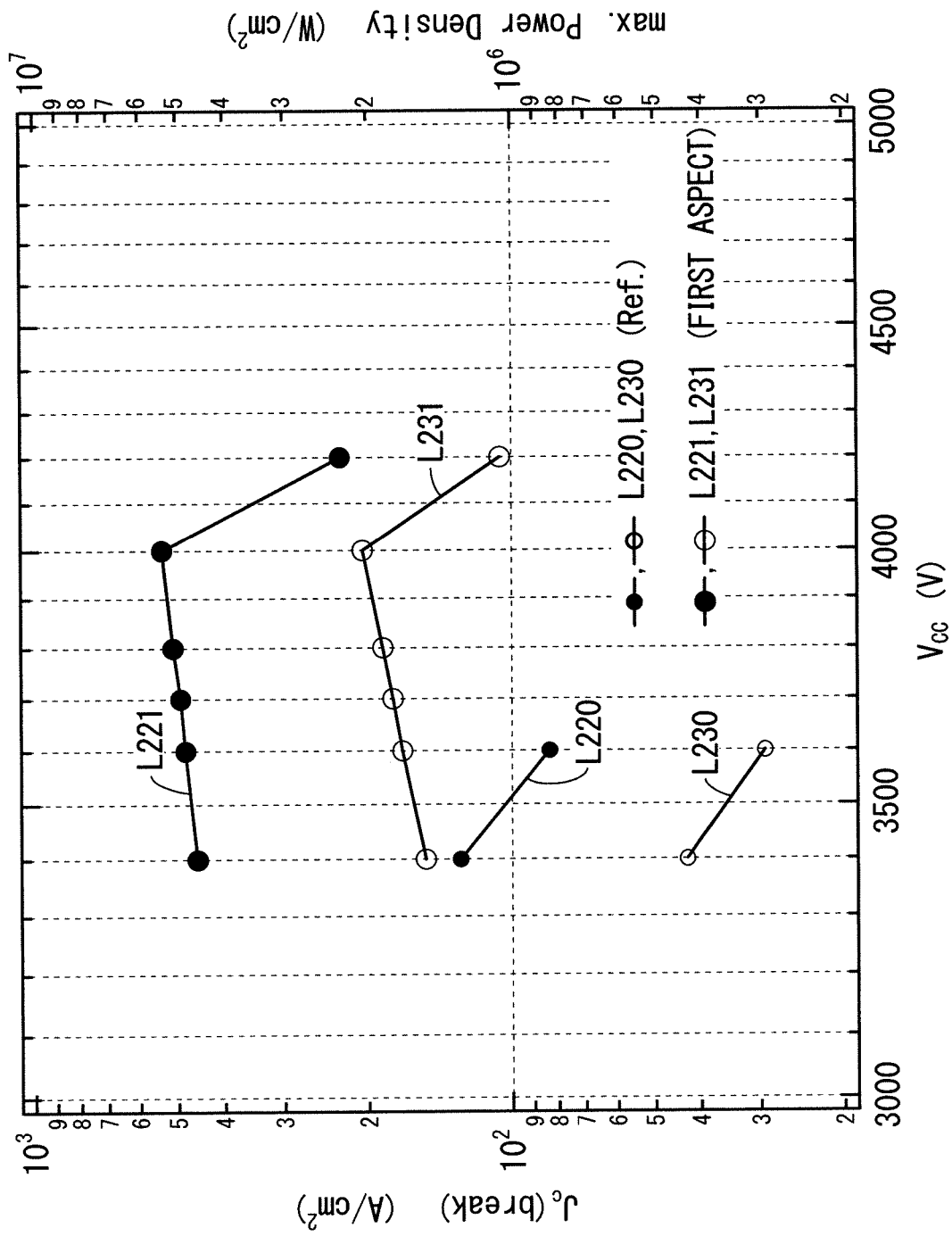
FIG. 60 is a graph showing a safe operation area of the blocking capability at turn-off when the IGBT having the structure according to the first aspect in Embodiment 3 is adopted.

FIG. 60 is a graph showing an SOA for the blocking capability at turn-off in the structure including the N buffer layer 15 according to Embodiment 1, when the IGBT having the structure according to the first aspect illustrated in FIG. 55 is adopted as the prototyped IGBT (the entire structure is the same as that in FIG. 1) including the conventional N buffer layer 15 with the IGBT structure illustrated in FIG. 10A and belonging to the 4500 V class. In FIG. 60, the current density $J_C$ (break) and "max. Power Density" in the vertical axis represent the maximum blocking current density (A/cm$^2$) and the maximum power density (W/cm$^2$), respectively, and the horizontal axis represents the power supply voltage $V_{cc}$.

In FIG. 60, a current density change L220 indicates change in the current density $J_C$ relative to $V_{cc}$ (V) of the IGBT with the conventional N buffer structure (structure having the N buffer layer 15 with the impurity profile PR in FIG. 4 (Nref (15)), and a power density change L230 indicates change in the maximum blocking current density relative to $V_{cc}$ of the IGBT with the conventional structure. A current density change L221 indicates change in the current density $J_C$ of the IGBT according to Embodiment 1 to which the first aspect according to Embodiment 3 has been adopted, and a power density change L231 indicates change in the maximum blocking current density of the IGBT according to Embodiment 1 to which the first aspect illustrated in FIG. 55 according to Embodiment 3 has been adopted. Furthermore, $L_S$=2.47 µH and the operating temperature of 423 K are set as the switching conditions.

Figure 61:
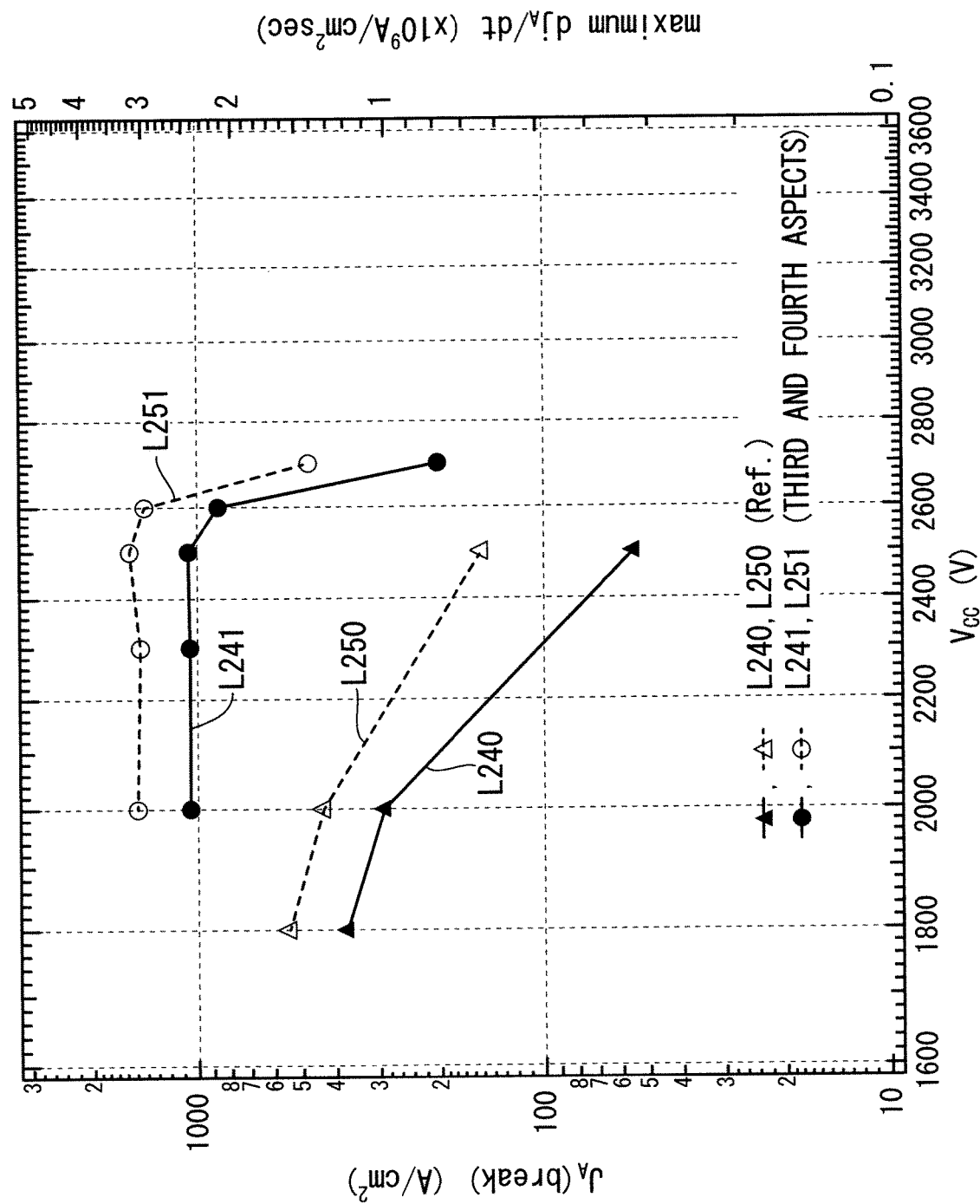
FIG. 61 is a graph showing a safe operation area of the blocking capability at turn-off when the diodes of the second type having the structures according to the third and fourth aspects in Embodiment 3 are adopted.

FIG. 61 is a graph showing an SOA of the blocking capability at recovery in the structure including the N buffer layer 15 according to Embodiment 1, when the prototyped diode of the second type with the conventional N buffer structure whose breakdown voltage belongs to a 3300 V class (structure having the N buffer layer 15 with the impurity profile PR in FIG. 4; the entire structure is the same as that in FIG. 2), and the third aspect and the fourth aspect illustrated in FIG. 57 and FIG. 58, respectively, are adopted. The current density $J_A$ (break) and the maximum $dj_A/dt$ in the vertical axis represent at recovery the maximum blocking current density (A/cm$^2$) and the maximum blocking $dj_A/dt$ (×10$^9$ A/cm$^2$ sec), respectively. The horizontal axis represents the power supply voltage $V_{cc}$.

In FIG. 61, a current density change L240 indicates change in the current density $J_A$ relative to $V_{CC}$ (V) of the IGBT with the conventional structure, and a power density change L250 indicates change in the maximum blocking current density relative to $V_{cc}$ of the diode of the second type with the conventional structure. A current density change L241 indicates change in the current density $J_A$ of the diode of the second type according to Embodiment 1 to which the third or fourth aspect according to Embodiment 3 has been adopted, and a power density change L251 indicates change in the maximum blocking current density of the diode of the second type according to Embodiment 1 to which the third or fourth aspect according to Embodiment 3 has been adopted. Furthermore, $L_S$=4.47 µH, the operating temperature of 423 K, and dV/dt=6000 V/µs are set as the switching conditions.

As illustrated in FIGS. 60 and 61, the IGBT (diode) which includes the N buffer layer 15 according to Embodiment 1 and in which the carrier implantation from the collector (cathode) in the edge termination area R3 is suppressed achieves more significant improvement in SOA at turn-off than the IGBTs and the diodes with the conventional N buffer layer 15, and further improvement in the blocking capability at turn-off that is one of the objects of the present invention.

The second aspect (diode of the first type) and the fifth aspect (diode of the second type) illustrated in FIG. 56 and FIG. 59, respectively, that produce the same effects can also obtain the similar advantages.

Furthermore, the fourth and fifth aspects are expected to have the advantages of shifting to the high-current density area the secondary breakdown points as indicated in FIGS. 11 and 12 that are prominent in the structure of the diode of the second type illustrated in FIG. 10C on the $J_R$ vs $Y_R$ characteristics and reducing the secondary breakdown, more than by the third aspect illustrated in FIG. 57.

The advantages are produced not only by reducing the current amplification factor αpnp of the internal PNP bipolar transistor including the N buffer layer 15 according to the present invention but also by reducing the current amplification factor αpnp excluding the PNP bipolar transistor. In addition, the thermal breakdown suppressing effect is also expected to produce the advantages.

Although FIGS. 60 and 61 show the comparison with the IGBT or the diode with the conventional structure, even a comparison with the IGBT or the diode according to Embodiment 1 or 2 will easily clarify that the structures according to the first to fifth aspects in Embodiment 3 have the advantage of enlarging the SOA.

As described above, an active layer (P collector layer 16, N$^+$ cathode layer 17 or 19) functioning as an electrode area (another electrode area) of an IGBT or a diode is not formed in the interface area R2 and the edge termination area R3 according to the first to fourth aspects (FIG. 55 to FIG. 58, respectively) in Embodiment 3. Specifically, since the N buffer extension layer 15e is substantially the same as the N buffer layer 15, the collector electrode 23C or the cathode electrode 23K is substantially formed directly on the N$^-$ drift layer 15 in the interface area R2 and the edge termination area R3 as the structures according to the first, second, and fourth aspects.

Thus, the structure substantially excluding an IGBT or a diode in the interface area R2 and the edge termination area R3 according to the first to fourth aspects in Embodiment 3 can improve the blocking capability at turn-off with the thermal breakdown suppressing effect, through suppressing the carrier implantation from the interface area R2 and the edge termination area R3.

Although Embodiment 3 is described on the basis of the structure according to Embodiment 1, the first to fifth aspects can be achieved on the basis of the structure according to Embodiment 2. Furthermore, the structure according to the first to fifth aspects in Embodiment 3 can be obtained using the manufacturing method with reference to FIGS. 34 to 54 except for the structure corresponding to the active layer in the interface area R2 and the edge termination area R3.

Although this invention has been described in detail, the description is in all aspects illustrative and does not restrict the invention. Therefore, the numerous modifications that have yet been exemplified will be devised without departing from the scope of this invention.

In other words, within the scope of the invention, Embodiments can be freely combined, and each of Embodiments can be appropriately modified or omitted.

The invention claimed is:

1. A semiconductor device, comprising:
   a semiconductor body having a first main surface and a second main surface, and including a drift layer of a first conductivity type as a main constituent element;
   a buffer layer of said first conductivity type that is formed adjacent to said drift layer, said buffer layer being closer to the second main surface with respect to said drift layer in said semiconductor body;
   an active layer formed on the second main surface of said semiconductor body, and having at least one of said first conductivity type and a second conductivity type;
   a first electrode formed on the first main surface of said semiconductor body; and
   a second electrode formed on said active layer, wherein
   said buffer layer has a first concentration slope of impurities from the first main surface to the second main surface in a main portion of said buffer layer, when a horizontal axis represents a depth TB(μm) and a vertical axis represents a common logarithm of CB (cm$^{-3}$), said first concentration slope is expressed in straight line, and
   said first concentration slope δ satisfies a concentration slope condition defined by $\{0.03 \leq \delta \leq 0.7\}$.

2. A semiconductor device, comprising:
   a semiconductor body having a first main surface and a second main surface, and including a drift layer of a first conductivity type as a main constituent element;
   a buffer layer of said first conductivity type that is formed adjacent to said drift layer, said buffer layer being closer to the second main surface with respect to said drift layer in said semiconductor body;
   an active layer formed on the second main surface of said semiconductor body, and having at least one of said first conductivity type and a second conductivity type;
   a first electrode formed on the first main surface of said semiconductor body; and
   a second electrode formed on said active layer, wherein
   said buffer layer has a first concentration slope of impurities from the first main surface to the second main surface in a main portion of said buffer layer, when a horizontal axis represents a depth TB(μm) and a vertical axis represents a common logarithm of CB (cm$^{-3}$), said first concentration slope is expressed in straight line, and
   a second concentration slope in the vicinity of the junction between said drift layer and said buffer layer is lower in angle than said first concentration slope.

3. The semiconductor device according to claim 2, wherein the vicinity of the junction between said drift layer and said buffer layer has at least 5(μm) depth.

4. A semiconductor device, comprising:
   a semiconductor body having a first main surface and a second main surface, and including a drift layer of a first conductivity type as a main constituent element;
   a buffer layer of said first conductivity type that is formed adjacent to said drift layer, said buffer layer being closer to the second main surface with respect to said drift layer in said semiconductor body;
   an active layer formed on the second main surface of said semiconductor body, and having at least one of said first conductivity type and a second conductivity type;
   a first electrode formed on the first main surface of said semiconductor body; and
   a second electrode formed on said active layer, wherein
   said buffer layer has a first concentration slope of impurities from the first main surface to the second main surface in a main portion of said buffer layer, when a horizontal axis represents a depth TB(μm) and a vertical axis represents a common logarithm of CB (cm$^{-3}$), said first concentration slope is expressed in straight line, and
   a peak concentration PC of impurities contained in said buffer layer of said first conductivity type satisfies a peak impurity concentration condition defined by $\{2 \times 10^{14} \text{ (cm}^{-3}) \leq PC \leq 1.0 \times 10^{16} \text{ (cm}^{-3})\}$.

5. A semiconductor device, comprising:
   a semiconductor body having a first main surface and a second main surface, and including a drift layer of a first conductivity type as a main constituent element;
   a buffer layer of said first conductivity type that is formed adjacent to said drift layer, said buffer layer being closer to the second main surface with respect to said drift layer in said semiconductor body;
   an active layer formed on the second main surface of said semiconductor body, and having at least one of said first conductivity type and a second conductivity type;
   a first electrode formed on the first main surface of said semiconductor body; and
   a second electrode formed on said active layer, wherein
   said buffer layer has a first concentration slope of impurities from the first main surface to the second main surface in a main portion of said buffer layer, when a horizontal axis represents a depth TB(μm) and a vertical axis represents a common logarithm of CB (cm$^{-3}$), said first concentration slope is expressed in straight line, and
   a depth $t_{NB}$ (μm) satisfies a depth forming condition defined by $\{4.0 \leq t_{NB} \leq 50.0 \text{ (μm)}\}$, said depth $t_{NB}$ being a distance from a junction between said drift layer and said buffer layer to a junction surface between said second electrode and said active layer.

6. A semiconductor device, comprising:
   a semiconductor body having a first main surface and a second main surface, and including a drift layer of a first conductivity type as a main constituent element;
   a buffer layer of said first conductivity type that is formed adjacent to said drift layer, said buffer layer being closer to the second main surface with respect to said drift layer in said semiconductor body;
   an active layer formed on the second main surface of said semiconductor body, and having at least one of said first conductivity type and a second conductivity type;
   a first electrode formed on the first main surface of said semiconductor body; and
   a second electrode formed on said active layer, wherein
   said buffer layer has a first concentration slope of impurities from the first main surface to the second main surface in a main portion of said buffer layer, when a horizontal axis represents a depth TB(μm) and a vertical axis represents a common logarithm of CB (cm$^{-3}$), said first concentration slope is expressed in straight line, an insulated-gate transistor forming area of said first conductivity type is formed closer to the first main surface in said drift layer, said active layer has said second conductivity type, and said semiconductor device includes:

an element forming area in which an IGBT is formed of said insulated-gate transistor forming area, said buffer layer, said active layer, and said first and second electrodes; and a peripheral area provided adjacent to said element forming area to withstand a breakdown voltage.

7. The semiconductor device according to claim 6, wherein said active layer is formed only in said element forming area, and said second electrode is provided below said buffer layer in said peripheral area.

* * * * *